US012764960B2

(12) United States Patent
Cao et al.

(10) Patent No.: US 12,764,960 B2
(45) Date of Patent: Oct. 13, 2026

(54) THREE-DIMENSIONAL SEMICONDUCTOR DEVICE CONTAINING CORE-BIAS ELECTRODE SURROUNDED BY VERTICAL SEMICONDUCTOR CHANNEL AND METHOD OF FORMING THE SAME

(71) Applicant: SANDISK TECHNOLOGIES LLC, Addison, TX (US)

(72) Inventors: Wei Cao, Fremont, CA (US); Zhixin Cui, Nagoya (JP); Koichi Matsuno, Fremont, CA (US); Xiang Yang, Santa Clara, CA (US); Masaaki Higashitani, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 341 days.

(21) Appl. No.: 18/660,791

(22) Filed: May 10, 2024

(65) Prior Publication Data

US 2025/0351348 A1 Nov. 13, 2025

(51) Int. Cl.

| | |
|---|---|
| ***H10B 43/27*** | (2023.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |

(Continued)

(52) U.S. Cl.

CPC ......... *H10B 43/27* (2023.02); *G11C 16/0483* (2013.01); *H10B 41/10* (2023.02); *H10B 41/27* (2023.02); *H10B 41/35* (2023.02); *H10B 43/10* (2023.02); *H10B 43/35* (2023.02); *H10W 20/435* (2026.01)

(58) Field of Classification Search

CPC ........ H10B 43/27; H10B 41/10; H10B 43/35; H10B 41/35; H10B 41/27; H10W 20/435; G11C 16/0483

USPC .......................................................... 257/314

See application file for complete search history.

(56) References Cited

U.S. PATENT DOCUMENTS

| | | | |
|---|---|---|---|
| 9,177,966 | B1 | 11/2015 | Rabkin et al. |
| 9,355,727 | B1 | 5/2016 | Zhang et al. |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Phuc T Dang

(74) *Attorney, Agent, or Firm* — THE MARBURY LAW GROUP PLLC

(57) ABSTRACT

A semiconductor device includes an alternating stack of insulating layers and electrically conductive layers, a memory opening vertically extending through the alternating stack, a memory opening fill structure located in the memory opening and including a memory film, a vertical semiconductor channel that is laterally surrounded by the memory film, a drain region contacting a first end portion of the vertical semiconductor channel, a dielectric core surrounded by the vertical semiconductor channel, and a core-bias electrode surrounded by the dielectric core. A source layer contacts a second end portion of the vertical semiconductor channel and an end portion of the core-bias electrode.

20 Claims, 55 Drawing Sheets

(51) Int. Cl.

| | |
|---|---|
| ***H10B 43/35*** | (2023.01) |
| ***H10W 20/41*** | (2026.01) |

(56) References Cited

U.S. PATENT DOCUMENTS

| | | | | |
|---|---|---|---|---|
| 9,576,971 | B2 | 2/2017 | Zhang et al. | |
| 10,355,007 | B2 | 7/2019 | Costa et al. | |
| 10,700,093 | B1 | 6/2020 | Kalitsov et al. | |
| 10,797,060 | B2 | 10/2020 | Sharangpani et al. | |
| 10,797,061 | B2 | 10/2020 | Nishida et al. | |
| 10,804,197 | B1 * | 10/2020 | Kawasaki | H10B 41/10 |
| 10,811,431 | B1 | 10/2020 | Makala et al. | |
| 10,868,042 | B1 | 12/2020 | Zhang et al. | |
| 10,892,279 | B1 * | 1/2021 | Sakotsubo | H10D 30/683 |
| 10,923,502 | B2 | 2/2021 | Sato | |
| 10,978,482 | B2 | 4/2021 | Alsmeier et al. | |
| 10,985,172 | B2 | 4/2021 | Ge et al. | |
| 11,121,153 | B1 | 9/2021 | Obu et al. | |
| 11,127,759 | B2 | 9/2021 | Obu et al. | |
| 11,973,123 | B2 | 4/2024 | Rajashekhar et al. | |
| 2016/0163389 | A1 | 6/2016 | Zhang et al. | |
| 2016/0163729 | A1 | 6/2016 | Zhang et al. | |
| 2017/0229472 | A1 | 8/2017 | Lu et al. | |
| 2020/0235050 | A1 * | 7/2020 | Lee | G06N 3/065 |
| 2021/0020651 | A1 | 1/2021 | Sakotsubo | |
| 2021/0265379 | A1 | 8/2021 | Obu et al. | |
| 2021/0265380 | A1 | 8/2021 | Obu et al. | |
| 2023/0232634 | A1 | 7/2023 | Rajashekhar et al. | |

OTHER PUBLICATIONS

Marega, G. M. et al., “A large-scale integrated vector-matrix multiplication processor based on monolayer molybdenum disulfide memories,” *Nat Electron*, vol. 6, pp. 991-998 (2023). https://doi.org/10.1038/s41928-023-01064-1.

U.S. Appl. No. 18/362,743, filed Jul. 31, 2023, SanDisk Technologies LLC.

U.S. Appl. No. 18/362,761, filed Jul. 31, 2023, SanDisk Technologies LLC.

U.S. Appl. No. 18/516,064, filed Nov. 21, 2023, Western Digital Technologies, Inc.

U.S. Appl. No. 18/516,170, filed Nov. 21, 2023, Western Digital Technologies, Inc.

U.S. Appl. No. 18/615,516, filed Mar. 25, 2024, SanDisk Technologies LLC.

U.S. Appl. No. 18/624,522, filed Apr. 2, 2024, SanDisk Technologies LLC.

* cited by examiner

THREE-DIMENSIONAL SEMICONDUCTOR DEVICE CONTAINING CORE-BIAS ELECTRODE SURROUNDED BY VERTICAL SEMICONDUCTOR CHANNEL AND METHOD OF FORMING THE SAME

FIELD

The present disclosure relates generally to the field of semiconductor devices, and particularly to a three-dimensional semiconductor device including core-bias electrode surrounded by a vertical semiconductor channel and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor device comprises: an alternating stack of insulating layers and electrically conductive layers; a memory opening vertically extending through the alternating stack; a memory opening fill structure located in the memory opening and comprising a memory film, a vertical semiconductor channel that is laterally surrounded by the memory film, a drain region contacting a first end portion of the vertical semiconductor channel, a dielectric core surrounded by the vertical semiconductor channel, and a core-bias electrode surrounded by the dielectric core; and a source layer contacting a second end portion of the vertical semiconductor channel and contacting an end portion of the core-bias electrode.

According to another aspect of the present disclosure, a method of forming a device structure comprises: forming an alternating stack of insulating layers and spacer material layers, wherein the spacer material layers are formed as, or are subsequently replaced with, electrically conductive layers; forming a memory opening through the alternating stack; forming a memory opening fill structure in the memory opening, wherein the memory opening fill structure comprises a memory film, a vertical semiconductor channel that is laterally surrounded by the memory film, a drain region contacting a first end portion of the vertical semiconductor channel, a dielectric core surrounded by the vertical semiconductor channel, and a core-bias electrode surrounded by the dielectric code; and forming a source layer on a second end portion of the vertical semiconductor channel and on an end portion of the core-bias electrode.

DETAILED DESCRIPTION

Figure 1:
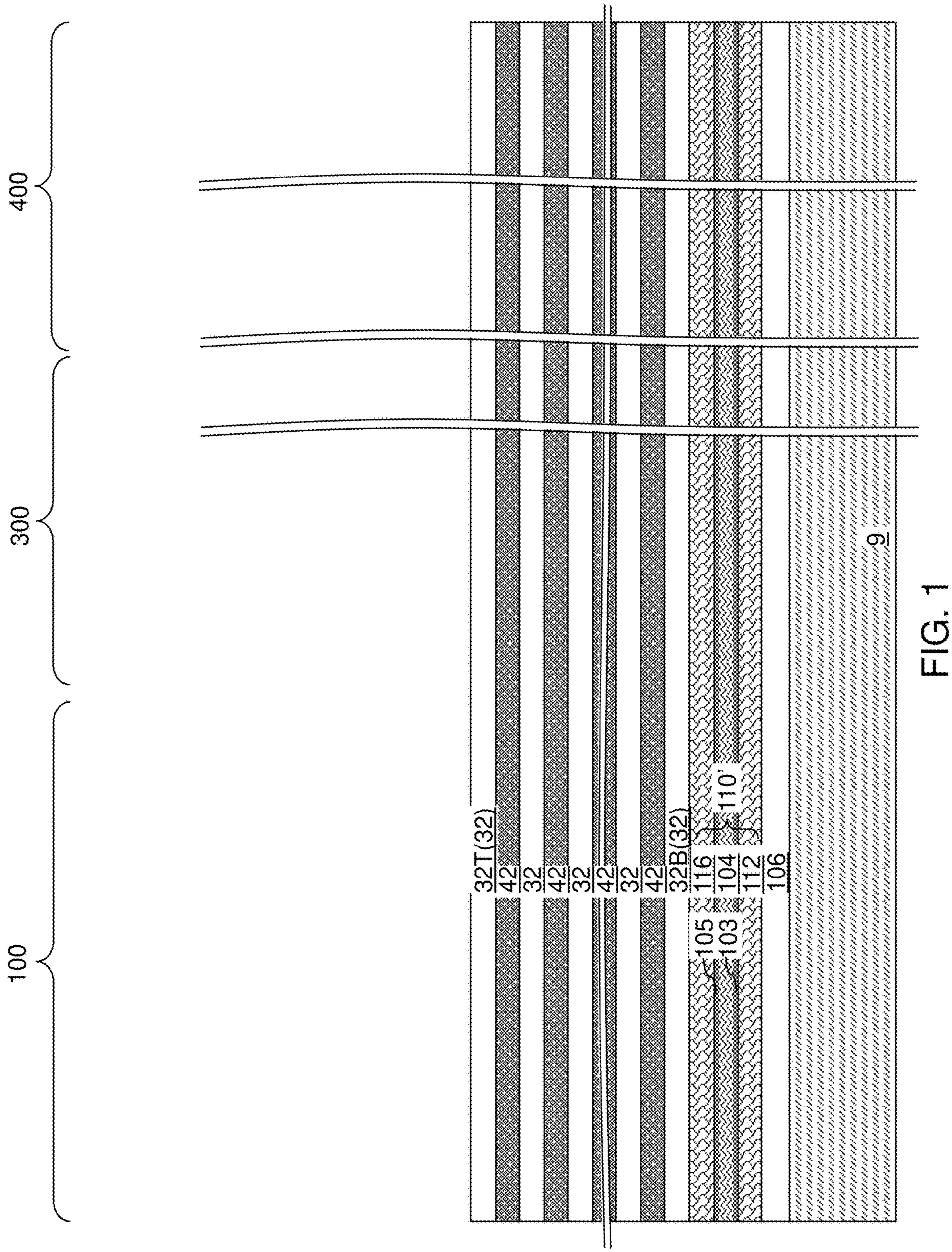
FIG. 1 is a schematic vertical cross-sectional view of a first exemplary structure for forming a first semiconductor die after formation of a stopper insulating layer, in-process source-level material layers, and an alternating stack of insulating layers and sacrificial material layers over a carrier substrate according to an embodiment of the present disclosure.

As discussed above, the embodiments of the present disclosure are directed to a three-dimensional semiconductor device including core-bias electrodes surrounded by vertical semiconductor channels and methods for manufacturing the same the various aspects of which are described below. Embodiments of the disclosure can be employed to form various structures including a multilevel memory structure, non-limiting examples of which include semiconductor devices such as three-dimensional memory devices comprising a plurality of memory strings and/or as three-dimensional semiconductor devices used for vector matrix multiplication ("VMM") applications (i.e., a VMM processor).

Specifically, memory devices may be used in VMM processors as in-memory computing architectures, in which memory, logic and processing operations are collocated. Processing-in-memory devices are suitable for performing VMM, which is a key operation for data processing and the most intensive calculation in machine-learning (e.g., artificial intelligence) algorithms. The memory device may be used to perform the multiply-accumulate (MAC) operation to overcomes the communication bottleneck between logic and memory devices. Processing-in-memory devices may be used for solving linear and differential equations, signal and image processing, and artificial neural network accelerators, as described in M. Marega, et al., *A large-scale integrated vector-matrix multiplication processor based on monolayer molybdenum disulfide memories, Nat Electron* 6, 991-998 (2023), which is incorporated by reference herein in its entirety.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., the smallest unit on which a read operation can be performed.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The subthreshold swing ("SS") of a field effect transistor is a parameter that describes the speed of a transistor in transitioning between the on (high current) and the off (low current) states. A memory device used for VMM applications should have a narrow cell current ("Icell") range (e.g., have a ΔIcell/Icell ratio value as small as possible). A relatively small ΔIcell/Icell (e.g., <20%) is attainable in prior art memory device at high Icell values, which leads to undesirably high power consumption. The ΔIcell/Icell ratio of a memory cell is controlled by threshold voltage ("Vt") width and subthreshold swing of the memory cell. A large SS is desirable for a narrow cell current range for VMM applications.

The embodiments of the present disclosure provide a three-dimensional semiconductor (e.g., memory) device containing a core-bias electrode which is surrounded by the vertical semiconductor channel. The core-bias electrode may be connected to a source line and thus functions as a back gate to increase the SS of the memory cells without necessarily negatively affecting the threshold voltage width of the memory cells. Specifically, the core-bias electrode back gate (e.g., voltage divider ground plane) can be operated to reduce the controllability of the control gate (e.g., word line) to channel potential in the subthreshold regime, thereby increasing SS.

Referring to FIG. 1, a first exemplary structure according to an embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be subsequently removed selective the materials of insulating layers 32 and dielectric material portions to be subsequently formed.

An insulating material layer can be formed on a top surface of the carrier substrate 9. The insulating material layer can be subsequently employed as a stopping material layer for a process that removes the carrier substrate 9, and is herein referred to as a stopper insulating layer 106, or as a backside pad dielectric layer. If a polishing process such as a chemical mechanical polishing process is employed to subsequently remove the carrier substrate 9, the stopper insulating layer 106 may be subsequently employed as a polishing stopper material layer. If an etch process such as a wet etch process is employed to subsequently remove the carrier substrate 9, the stopper insulating layer 106 may be subsequently employed as an etch stop material layer. In one embodiment, the stopper insulating layer 106 comprises a dielectric material such as undoped silicate glass, a doped silicate glass, or silicon nitride. The thickness of the stopper insulating layer 106 may be in a range from 100 nm to 1,000 nm, such as from 200 nm to 600 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional semiconductor device. In one embodiment, the in-process source-level material layers 110' may include, from bottom to top, a lower source-level semiconductor layer 112, an optional lower sacrificial liner 103, a source-level sacrificial layer 104, an optional upper sacrificial liner 105, and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 (or selective to the lower source-level semiconductor layer 112) and the upper sacrificial liner 105 (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner 103 (if present) and the upper sacrificial liner 105 (if present) include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

An alternating stack of first material layers and second material layers can be formed over the in-process source-level material layers 110'. In an alternative embodiment, the in-process source-level material layers 110' and the stopper insulating layer 106 may be omitted, and the alternating stack is formed directly on a surface of the carrier substrate 9. In the alternating stack, the first material layers may be insulating layers 32, and the second material layers may be spacer material layers. In one embodiment, the spacer material layers may comprise sacrificial material layers 42. In this case, an alternating stack (32, 42) of insulating layers 32 and sacrificial material layers 42 can be formed over the in-process source-level material layers 110'. The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32. The first exemplary structure comprises a memory array region 100 in which a three-dimensional array of memory elements is to be subsequently formed, a contact region 300 in which layer contact via structures contacting word lines are to be subsequently formed, and a peripheral region 400 (which is also referred to as a connection region) in which connection via structures for providing vertically-extending electrical signal paths are to be subsequently formed.

While an embodiment is described in which the spacer material layers are formed as sacrificial material layers 42, an alternative embodiment is expressly contemplated herein in which the spacer material layers are formed as electrically conductive layers. In this alternative embodiment, processing steps employed to replace the sacrificial material layers 42 with electrically conductive layers are not necessary, and thus, may be omitted.

Figure 2:
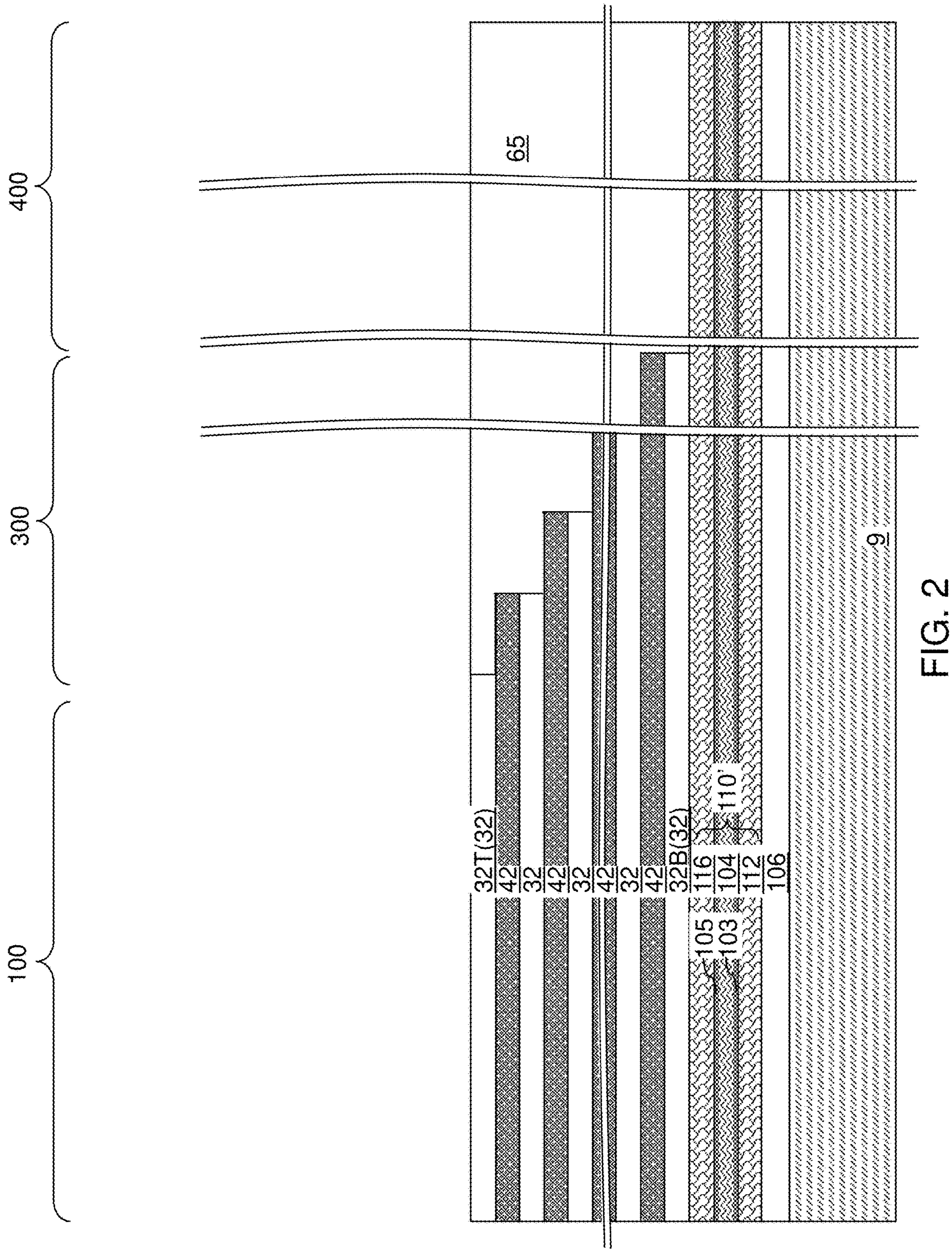
FIG. 2 is a schematic vertical cross-sectional view of the first exemplary structure after formation of stepped surfaces and a stepped dielectric material portion according to an embodiment of the present disclosure.

Referring to FIG. 2, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the in-process source-level material layers 110'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65, which may be a retro-stepped dielectric material portion. As used herein, a "retro-stepped" element refers to an element that has stepped surfaces and a horizontal cross-sectional area that increases monotonically as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F. The stepped dielectric material portion 65 may comprise a first region located in the contact region 300 and overlying and contacting the stepped surfaces of the alternating stack (32, 42) and having a stepwise-changing variable thickness, and a second region located within the peripheral region 400 and having a uniform thickness throughout.

Optionally, drain-select-level isolation structures (not shown) can be formed through the topmost insulating layer 32T and a subset of the sacrificial material layers 42 located at drain-select-levels. The drain-select-level isolation structures can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 3A:
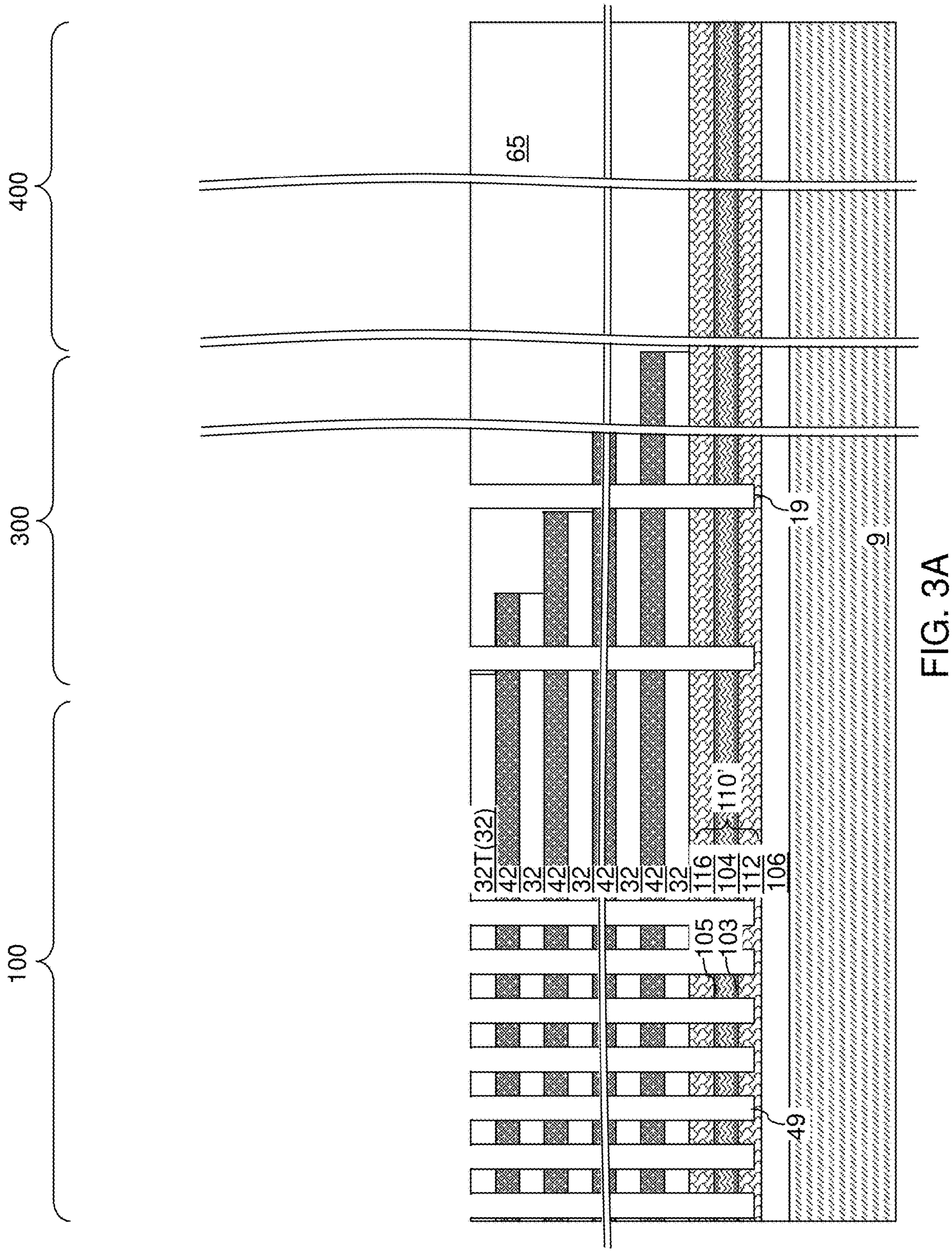
FIG. 3A is a schematic vertical cross-sectional view of the first exemplary structure after forming memory openings and support openings according to an embodiment of the present disclosure.
Figure 3B:
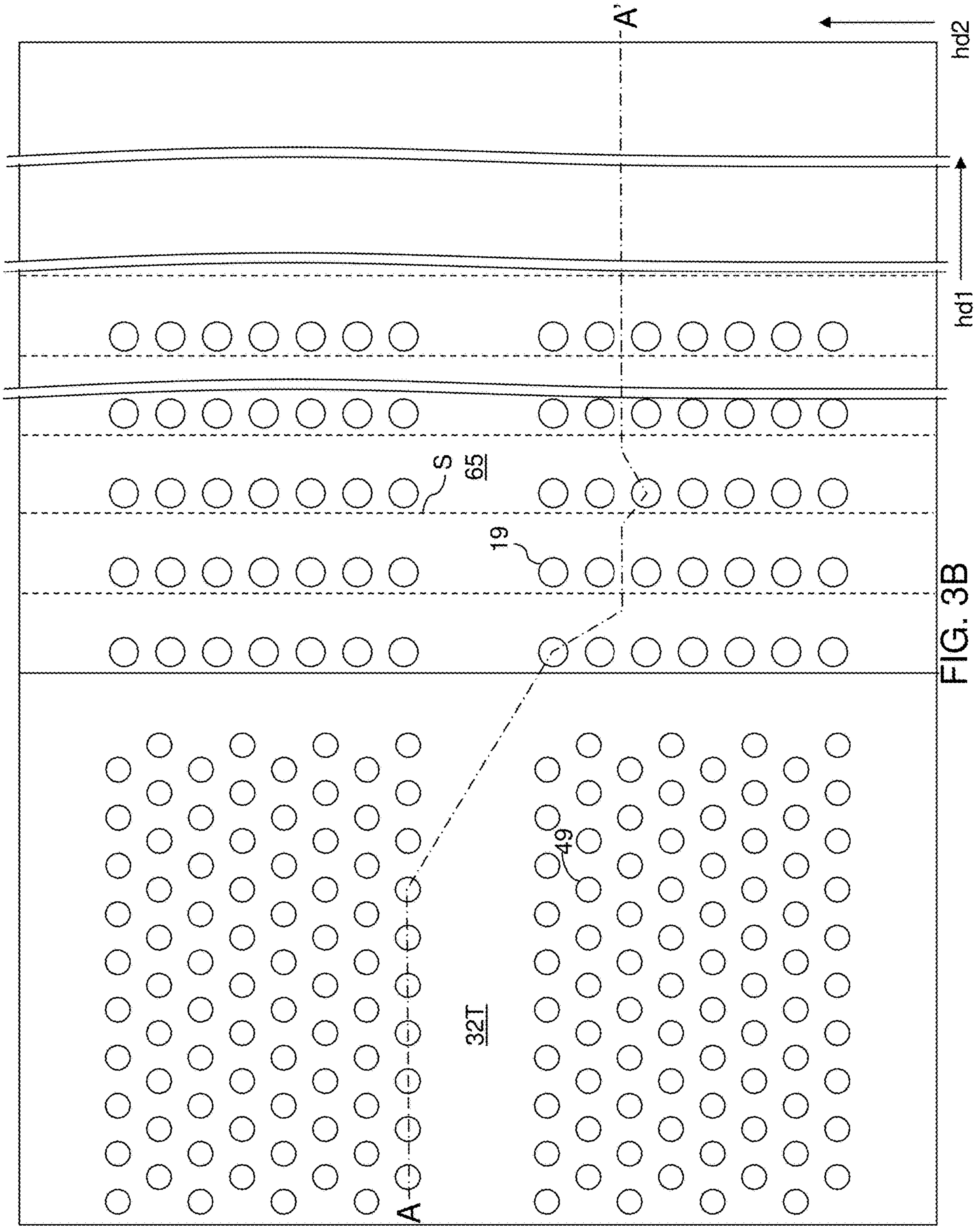
FIG. 3B is a top-down view of the first exemplary structure of FIG. 3A. The vertical plane A-A' is the cut plane of the vertical cross-sectional view of FIG. 3A.

Referring to FIGS. 3A-3C, an etch mask layer (not shown) can be formed over the alternating stack (32, 42), and can be lithographically patterned to form various openings therein. An anisotropic etch process can be performed to transfer the pattern of the openings in the etch mask layer through the alternating stack (32, 42). Various openings can be formed through the alternating stack (32, 42). The various openings may comprise memory openings 49 that are formed in the memory array region 100 and support openings 19 that are formed in the contact region 300. Each of the memory openings 49 and the support openings 19 can vertically extend through the alternating stack (32, 42) and into the in-process source-level material layers 110' In one embodiment, bottom surfaces of the memory openings 49 and the support openings 19 may be formed within the lower source-level semiconductor layer 112 or at an interface between the lower source-level semiconductor layer and the stopper insulating layer 106.

The support openings 19 may have a diameter in a range from 60 nm to 400 nm, such as from 120 nm to 300 nm, although lesser and greater thicknesses may be employed. The memory openings 49 may have a diameter in a range from 60 nm to 400 nm, such as from 120 nm to 300 nm, although lesser and greater thicknesses may be employed.

In one embodiment, the memory array region 100 may be laterally spaced apart from the contact region 300 along a first horizontal direction hd1. The memory openings 49 may comprise rows of memory openings 49 that are arranged along the first horizontal direction hd1 and laterally spaced apart along a second horizontal direction hd2 that is perpendicular to the first horizontal direction hd2. Multiple clusters of memory openings 49, each containing a respective two-dimensional periodic array of memory openings 49, may be formed in the memory array region 100. The clusters of memory openings 49 may be laterally spaced apart along the second horizontal direction hd2.

Figure 4:
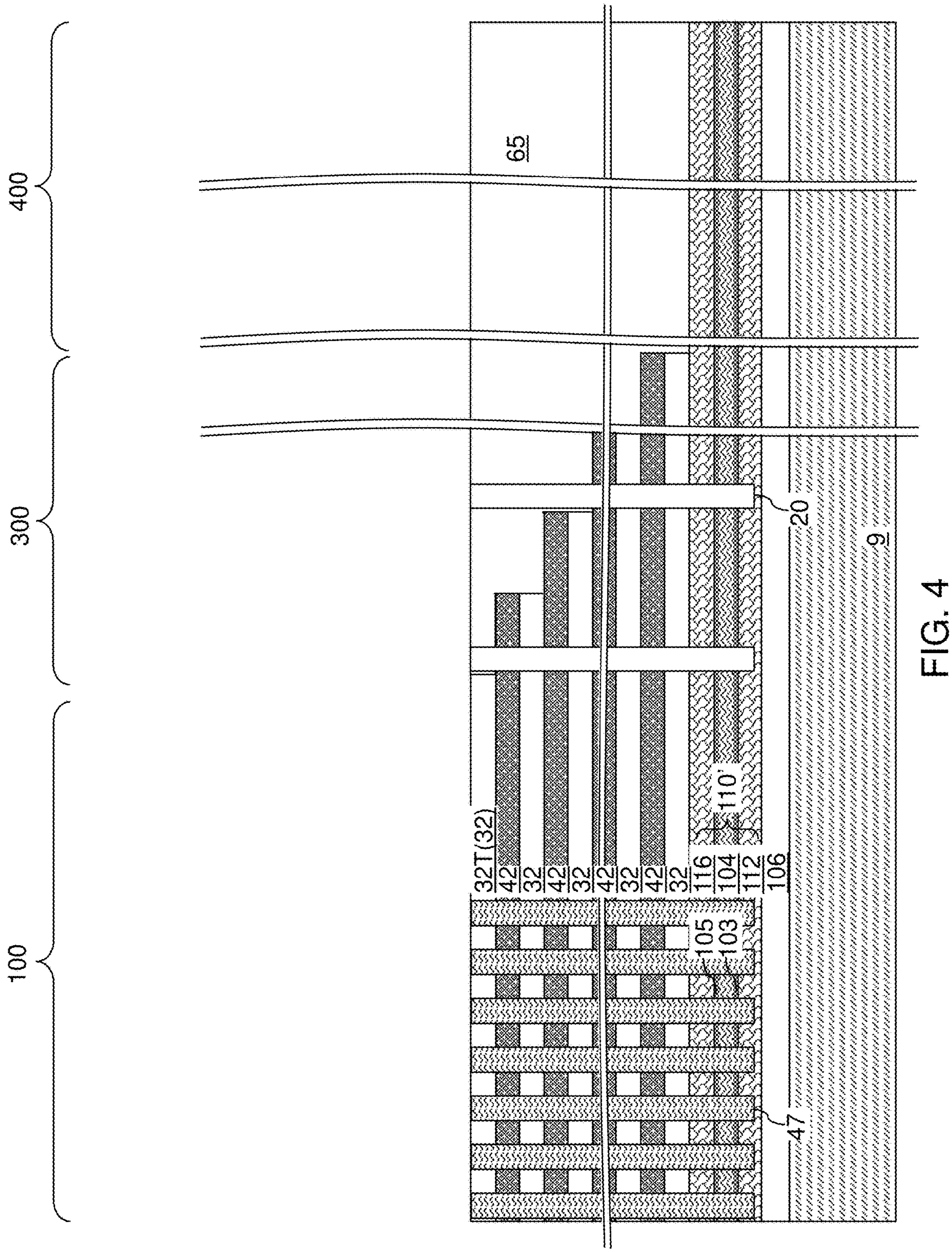
FIG. 4 is a schematic vertical cross-sectional view of the first exemplary structure after formation of support pillar structures according to an embodiment of the present disclosure.

Referring to FIG. 4, an optional etch stop liner (not shown) and a sacrificial fill material can be deposited in the memory openings 49 and the support openings. The optional etch stop liner (if present) comprises a thin dielectric material layer comprising silicon oxide, silicon nitride, or a dielectric metal oxide and having a thickness in a range from 1 nm to 6 nm. The sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material. Excess portions of the sacrificial fill material can be removed from above the horizontal plane including the topmost layer of the alternating stack (32, 42) by a planarization process such as an etch back process. Remaining portions of the sacrificial fill material that fill the memory openings 49 constitute sacrificial memory opening fill structures 47. Remaining portions of the sacrificial fill material that fill the support openings 19 constitute sacrificial support opening fill structures (not shown).

A photoresist layer (not shown) can be applied over the alternating stack (32, 42) and the stepped dielectric material portion 65, and can be lithographically patterned to cover the memory array region 100 without covering the contact region 300. The sacrificial support opening fill structures and portions of the optional etch stop liner in the contact region 300 can be removed selective to the materials of the stepped dielectric material portion 65 and the alternating stack (32, 42). For example, an etch process or an ashing process may be employed to remove the sacrificial support opening fill structures and portions of the optional etch stop liner in the contact region 300. The photoresist layer can be subsequently removed.

A dielectric fill material such as silicon oxide can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers.

FIGS. 5A-5G are sequential vertical cross-sectional views of a memory opening 49 during formation of a memory opening fill structure" 58 (e.g., a NAND string used for VMM or a data storage NAND string) according to an embodiment of the present disclosure.

Figure 5A:
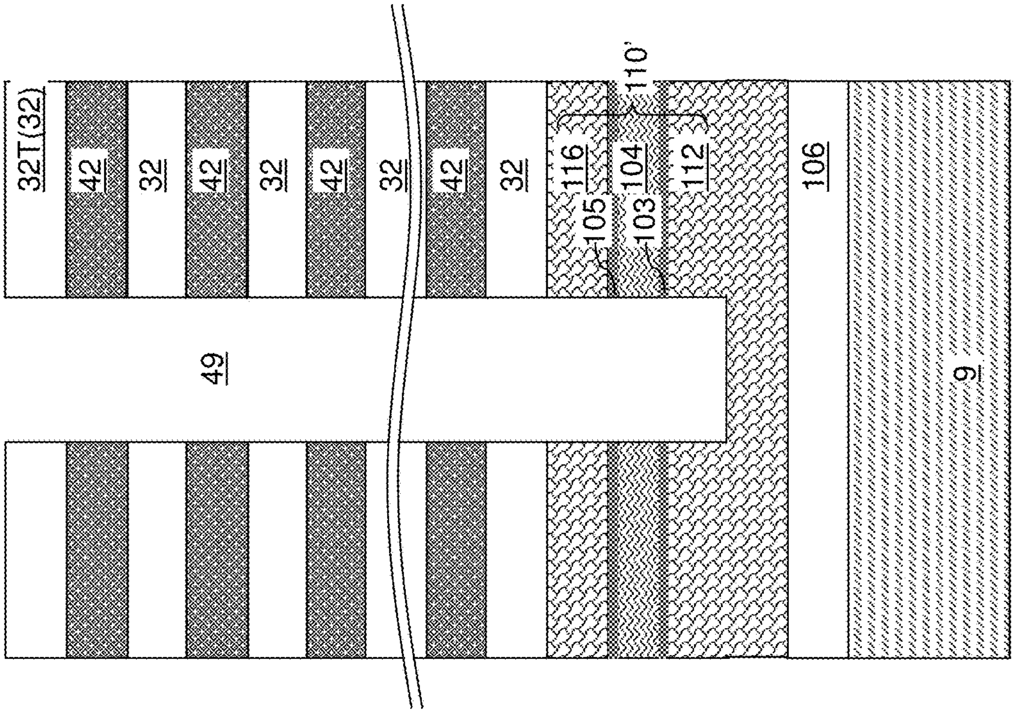
FIGS. 5A-5G are sequential vertical cross-sectional views of a memory opening during formation of a memory opening fill structure according to an embodiment of the present disclosure.

Referring to FIG. 5A, the sacrificial memory opening fill structures 47 and portions of the optional etch stop liner in the memory array region 100 can be removed selective to the materials of the stepped dielectric material portion 65 and the alternating stack (32, 42). For example, an etch process or an ashing process may be employed to remove the sacrificial memory opening fill structures 47 and portions of the optional etch stop liner in the memory array region 100. Voids are formed in the volumes of the memory openings 49.

Figure 5B:
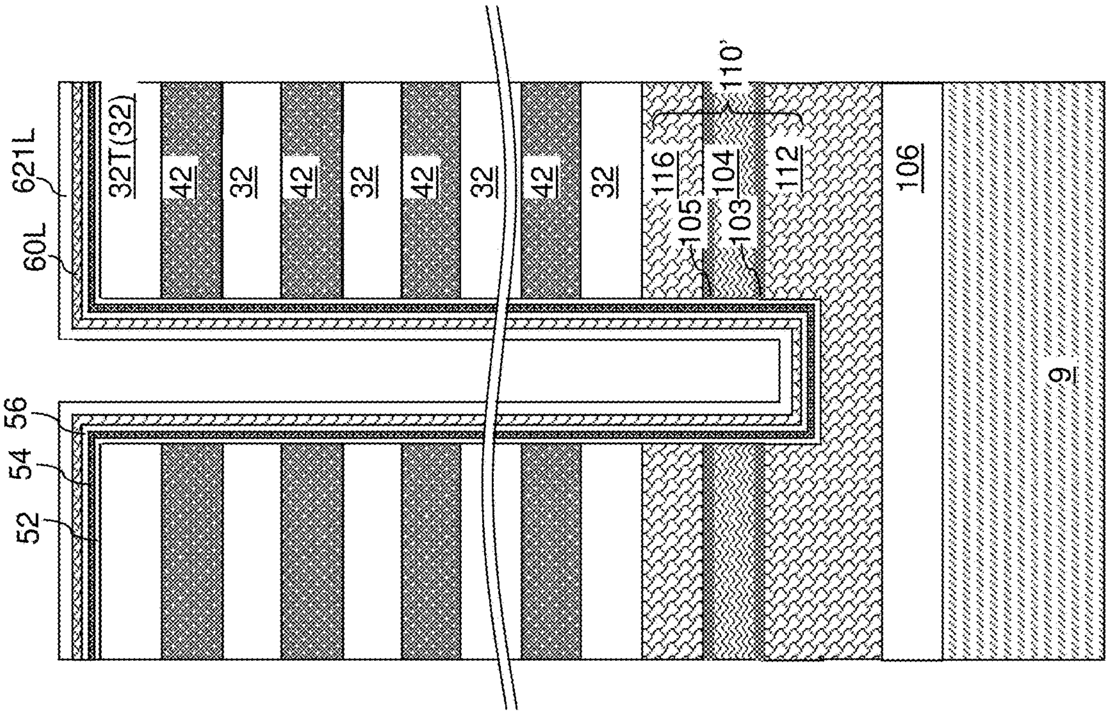

Referring to FIG. 5B, a layer stack including a memory material layer 54 can be conformally deposited. In an illustrative example, the layer stack may comprise an optional blocking dielectric layer 52, the memory material layer 54, and an optional dielectric liner 56. Generally, the memory material layer 54 may include any type of memory material, i.e., a material that can store data bits therein. For example, the memory material layer 54 may comprise a charge storage material (such as a continuous silicon nitride layer, discrete silicon nitride charge storage regions or discrete conductive floating gates), a ferroelectric material, a phase change material, etc. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed.

A core dielectric liner layer 621L can be conformally deposited over the semiconductor channel material layer 60L. The core dielectric liner layer 621L comprises a dielectric material, such as silicon oxide, aluminum oxide, or a dielectric metal oxide (e.g., hafnium oxide), and has a thickness that is sufficient to provide electrical isolation between the semiconductor channel material layer 60L and an electrode (which is referred to as a core-bias electrode) to be subsequently formed within the cavity that is surrounded by the core dielectric liner layer 621L. The core dielectric liner layer 621L may be deposited by a conformal deposition process such as a low pressure chemical vapor deposition (LPCVD) or an atomic layer deposition, and may have a thickness in a range from 2 nm to 15 nm, such as from 3 nm to 10 nm, although lesser and greater thicknesses may also be employed.

Figure 5D:
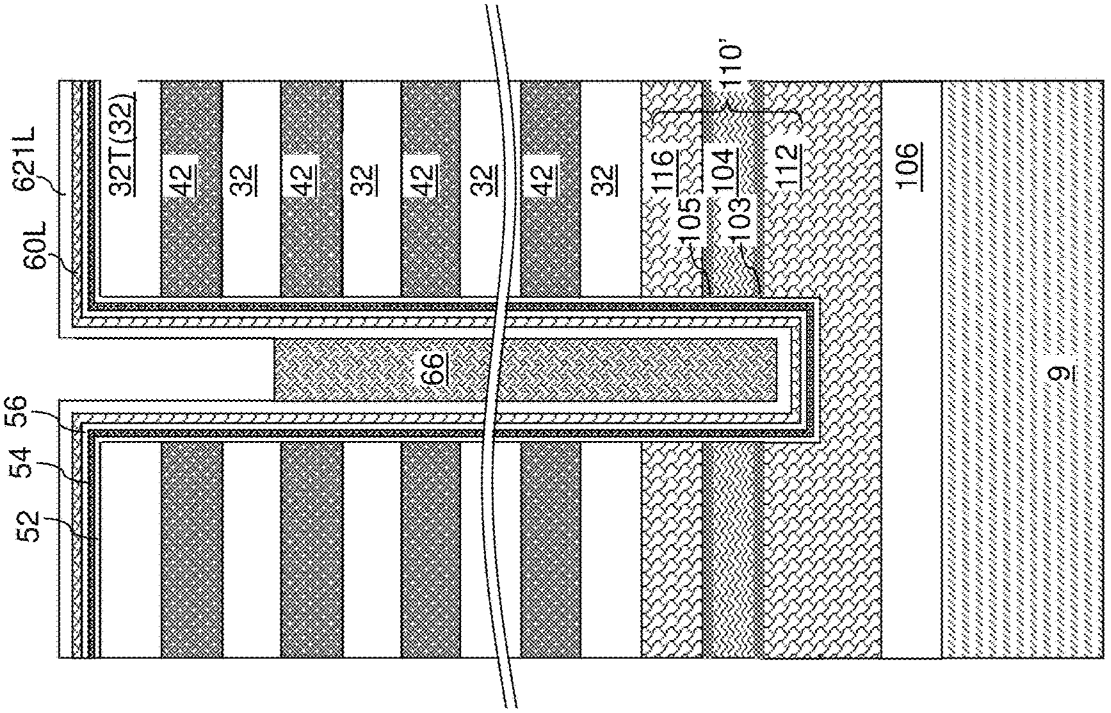
Figure 5C:
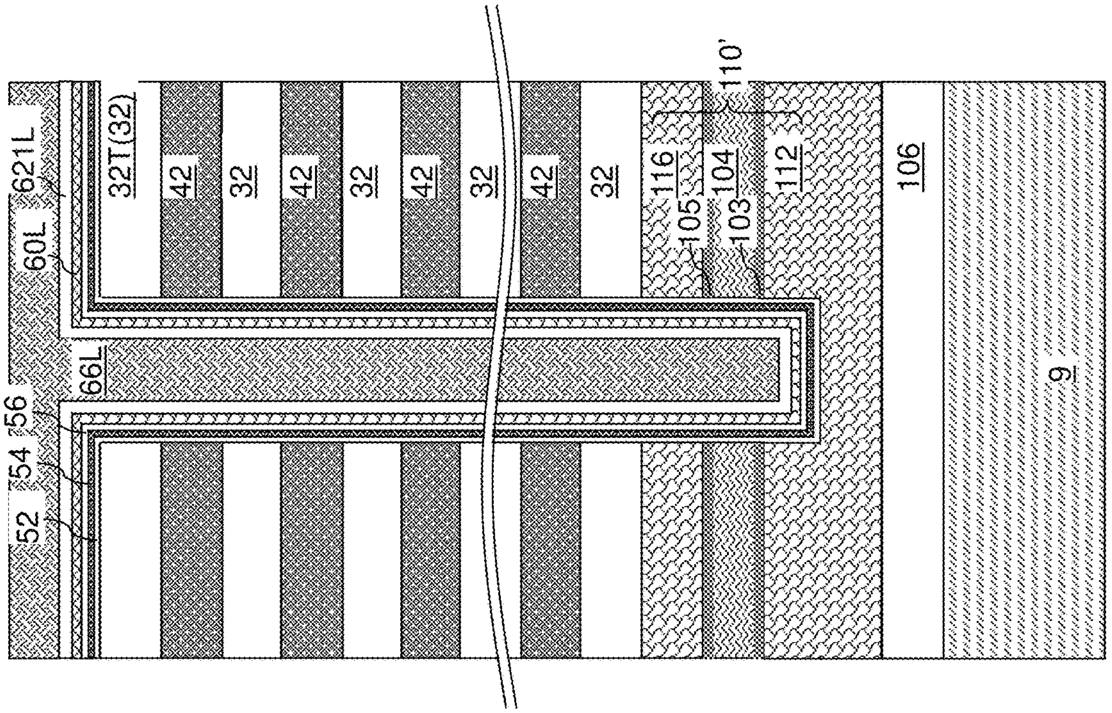

Referring to FIG. 5C, a conductive core material layer 66L can be conformally deposited in the remaining cavity that is laterally bounded by an inner sidewall of the core dielectric liner layer 621L. The conductive core material layer 66L comprises an electrically conductive material, which may comprise a heavily doped semiconductor material or at least one metallic material. For example, the conductive core material layer 66L may comprise a heavily doped semiconductor material (such as heavily doped polysilicon or amorphous silicon) having a doping of the second conductivity type, which is the conductivity type of the lower source-level semiconductor layer 112 and the upper source-level semiconductor layer 116. Alternatively or additionally, the conductive core material layer 66L may comprise at least one metallic material. For example, the conductive core material layer 66L may comprise a conductive metal nitride, such as titanium nitride, tantalum nitride, tungsten nitride, or molybdenum nitride, and/or a metal, such as tungsten, molybdenum, ruthenium, cobalt, etc. In one embodiment, the conductive core material layer 66L may consist essentially of the heavily doped semiconductor material such as heavily doped polysilicon or heavily doped amorphous silicon (which is subsequently converted into heavily doped polysilicon after an anneal process) having an n-type (e.g., phosphorus and/or arsenic) doping concentration of $1\times10^{19}/cm^3$ to $2\times10^{21}/cm^3$, such as from $2\times10^{20}/cm^3$ to $8\times10^{20}/cm^3$. The conductive core material layer 66L fills at least the upper portion of the volume that is defined by the inner cylindrical sidewall of the core dielectric liner layer 621L, and may fill the entirety of the volume.

Referring to FIG. 5D, a recess etch process can be performed to etch portions of the conductive core material layer 66L that overlies the horizontal plane including the topmost surface of the dielectric core liner layer 621L, and to etch additional portions of the conductive core material layer 66L located within an upper portion of the volume laterally bounded by the inner cylindrical sidewall of the core dielectric liner layer 621L. A remaining portion of the dielectric core liner layer 621L that fills a lower portion of the volume laterally bounded by the inner cylindrical sidewall of the core dielectric liner layer 621L constitutes a core-bias electrode 66.

The top surface of the core-bias electrode 66 is formed below at least one sacrificial material layer 42 of the alternating stack, and above the rest of the sacrificial material layers 42 in the alternating stack (32, 42). In one embodiment, the total number of the sacrificial material layers 42 that overlie the horizontal plane including the top surface of the core-bias electrode 66 may be in a range from 1 to 12, such as from 1 to 4, although a greater number may also be employed. In one embodiment, at least 95%, such as at least 98%, and/or at least 99%, of all sacrificial material layers 42 may underlie the horizontal plane including the top surface of the core-bias electrode 66. In one embodiment, a first subset, which is a predominant subset, of all sacrificial material layers 42 within the alternating stack (32, 42) may be subsequently replaced with a first subset of electrically conductive layers that function as word lines (i.e., as control gates), and a second subset of all sacrificial material layer 42 that overlies the first subset may be subsequently replaced with a second subset of the electrically conductive layers that function as drain-select-electrode lines (e.g., as drain side select gates). In this case, the top surface of the core-bias electrode 66 may be formed above the topmost surface of the first subset, and below the bottommost surface of the second subset.

In summary, the core-bias electrode 66 vertically extends through a plurality of spacer material layers (which may be the sacrificial material layers 42) within the alternating stack (32, 42). The core-bias electrode 66 is electrically isolated from the semiconductor channel material layer 60L by the core dielectric liner layer 621L. In one embodiment, the core-bias electrode 66 consists of at least one conductive material having a cylindrical shape, which may be, for example, a doped semiconductor material portion having a cylindrical shape.

Figure 5F:
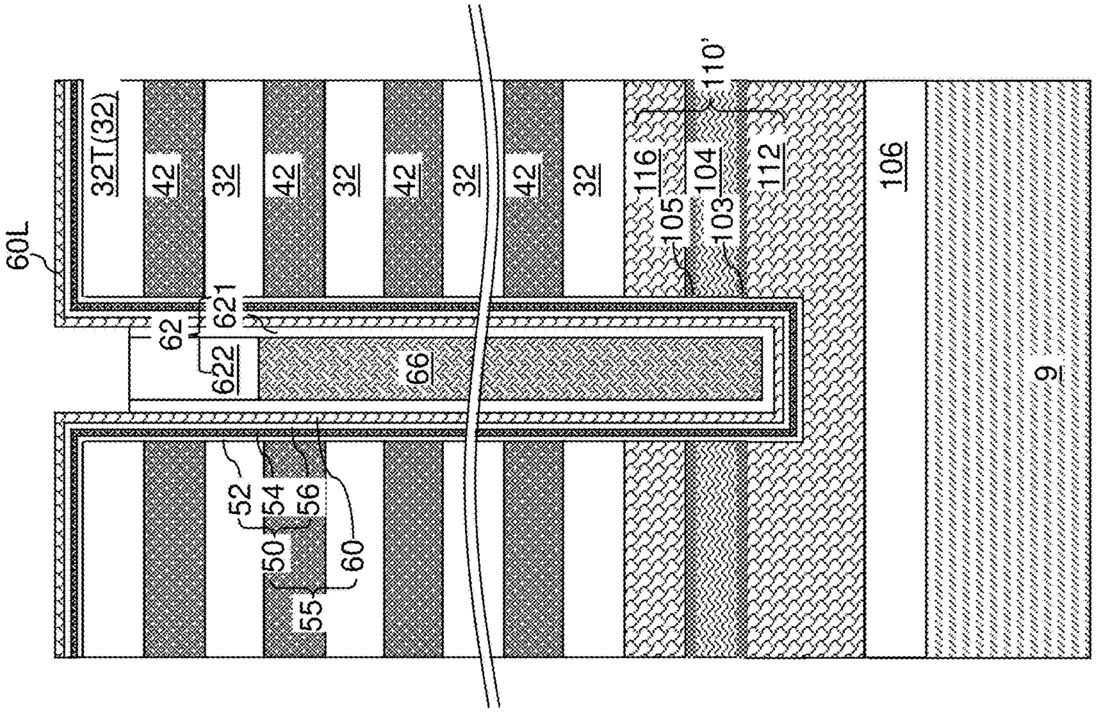
Figure 5E:
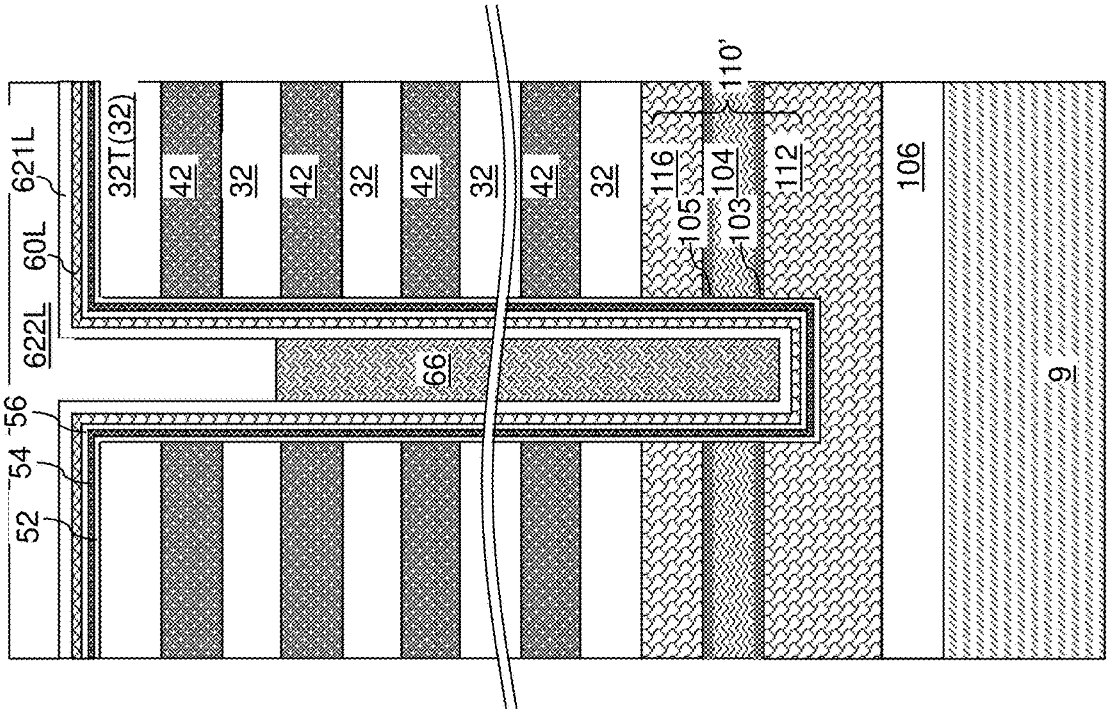

Referring to FIG. 5E, a dielectric core material layer 622L comprising a dielectric fill material can be deposited in unfilled volumes of the memory openings 49 and over the horizontally-extending portion of the core dielectric liner layer 621L. The dielectric core material layer 622L may comprise undoped silicate glass (i.e., silicon oxide) or a doped silicate glass. The dielectric core material layer 622L may comprise the same material as, or may comprise a material that is different from, the material of the core dielectric liner layer 621L.

Referring to FIG. 5F, the dielectric core material layer 622L can be vertically recessed by performing a recess etch process. In one embodiment, the recess etch process may etch that materials of the dielectric core material layer 622L and the core dielectric liner layer 621L selective to the material of the semiconductor channel material layer 60L. The recess etch process may comprise a reactive ion etch process or a timed wet etch process. The duration of the recess etch process can be selected such that each remaining portion of the dielectric core material layer 622L has a top surface above the horizontal plane including the bottom surface of the topmost insulating layer 32T and below the horizontal plane including the top surface of the topmost insulating layer 32T. Each remaining portion of the dielectric core material layer 622L that remains in a respective memory opening 49 constitutes a cylindrical dielectric core portion 622. Each remaining portion of the core dielectric liner layer 621L that remains in a respective memory opening 49 constitutes a core dielectric liner 621. Each contiguous combination of a core dielectric liner 621 and a cylindrical dielectric core portion 622 constitutes a dielectric core 62.

The core-bias electrode 66 is encapsulated by the dielectric core 62. Specifically, the core-bias electrode 66 is encapsulated on the side by the core dielectric liner 621 and on top by the cylindrical dielectric core portion 622. Each surface of the core-bias electrode 66 is in direct contact only with a respective surface of the combination of the core dielectric liner 621 and the cylindrical dielectric core portion 622 portions of the dielectric core 62. In one embodiment, a first end surface of the core-bias electrode 66 contacts a first end surface of the cylindrical dielectric core portion 622, and a periphery of the first end surface of the core-bias electrode 66 coincides with a periphery of the first end surface of the cylindrical dielectric core portion 622. Thus, the dielectric core 62 entirely encapsulates the core-bias electrode 66 such that each surface of the core-bias electrode 66 is in contact with a respective inner surface of the dielectric core 62, and does not contact any other structural element than the dielectric core 62.

Figure 5G:
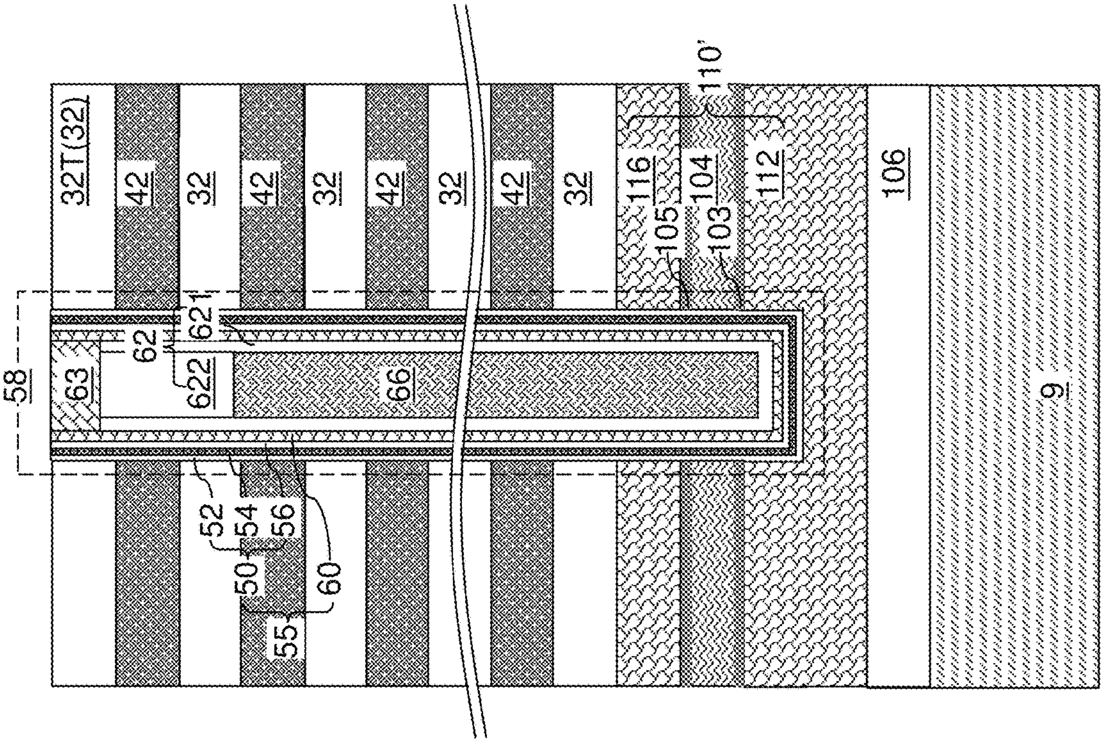

Referring to FIG. 5G, a doped semiconductor material having a doping of the second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5\times10^{18}/cm^3$ to $2\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by a planarization process. The planarization process may comprise a chemical mechanical planarization (CMP) process or a recess etch process. Each remaining portion of the doped semiconductor material having a doping of the second conductivity type constitutes a drain region 63. The drain region 63 is vertically separated from the core-bias electrode 66 by the cylindrical dielectric core portion 622. Each remaining portion of the semiconductor channel material layer 60L (which has a doping of the first conductivity type) constitutes a vertical semiconductor channel 60. Horizontally-extending portions of the layer stack of the optional blocking dielectric layer 52, the memory material layer 54, and the optional dielectric liner 56 can be removed from above the horizontal plane including the top surface of the topmost insulating layer 32T during the planarization process.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner (e.g., tunneling dielectric layer) 56. Each contiguous combination of a memory film 50 and a vertical semiconductor channel 60 constitutes a memory stack structure 55.

A memory opening fill structure 58 is formed in each memory opening 49. Each memory opening fill structure 58 comprises a memory film 50, a vertical semiconductor channel 60 that is laterally surrounded by the memory film 50, a drain region 63 contacting a first end portion of the vertical semiconductor channel 60, a dielectric core 62 comprising a cylindrical dielectric core portion 622 and a core dielectric liner 621, and a core-bias electrode 66 embedded within the core dielectric liner 621. Thus, each memory opening fill structure 58 comprises a respective vertical stack of memory elements (which may comprise portions of the memory material layer 54 located at levels of the sacrificial material layers 42). The core-bias electrode 66 vertically extends through a plurality of spacer material layers (such as sacrificial material layer 42) within the alternating stack (32, 42). The core-bias electrode 66 is electrically isolated from the vertical semiconductor channel 60 by the core dielectric liner 621. The core-bias electrode 66 is encapsulated by the core dielectric liner 621 and the cylindrical dielectric core portion 622 portions of the dielectric core 62, and each surface of the core-bias electrode 66 is in direct contact only with a respective surface of the dielectric core 62.

In one embodiment, the core-bias electrode 66 consists of a doped semiconductor material portion having a cylindrical shape. In one embodiment, a first end surface of the core-bias electrode 66 contacts a first end surface of the cylindrical dielectric core portion 622; and a periphery of the first end surface of the core-bias electrode 66 coincides with a periphery of the first end surface of the cylindrical dielectric core portion 622. In one embodiment, a cylindrical sidewall of the cylindrical dielectric core portion 622 contacts a first surface segment of an inner cylindrical sidewall of the core dielectric liner 621. In one embodiment, a cylindrical sidewall of the core-bias electrode 66 contacts a second surface segment of the inner cylindrical sidewall of the core dielectric liner 621. In one embodiment, the core dielectric liner 621 vertically extends through each sacrificial material layer 42 within the alternating stack (32, 42). In one embodiment, a second end surface of the cylindrical dielectric core portion 622 contacts the drain region 63. In one embodiment, a first annular end surface (i.e., a top annular end surface) of the core dielectric liner 621 contacts the drain region 63. As used herein, an annular surface refers to a surface having an inner periphery and an outer periphery that is offset outward from the inner periphery. It is presumed that each annular surface within the present disclosure may have a uniform lateral offset distance between the inner periphery and the outer periphery unless expressly described otherwise.

Figure 6A:
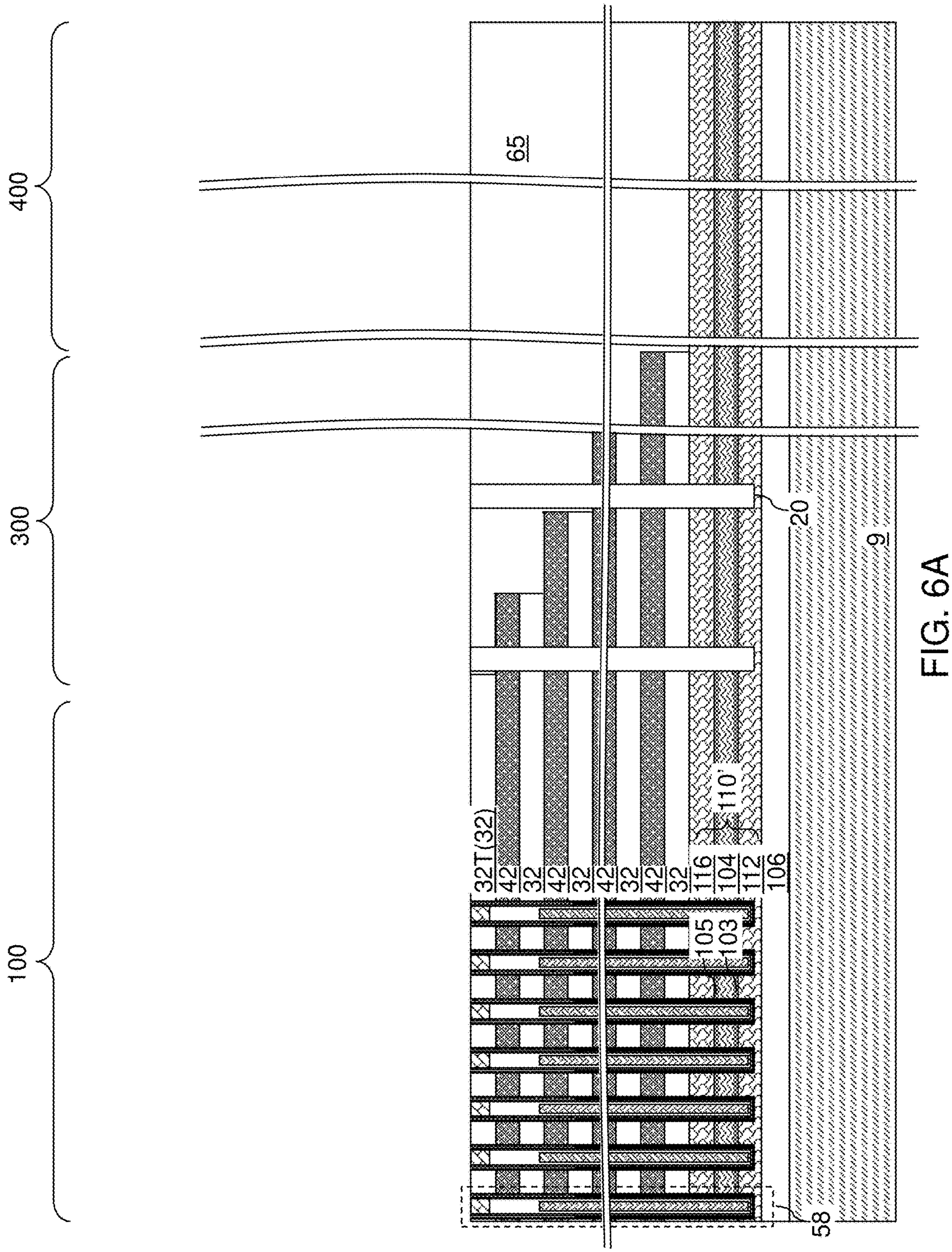
FIG. 6A is a vertical cross-sectional view of the first exemplary structure after formation of memory opening fill structures according to an embodiment of the present disclosure.
Figure 6B:
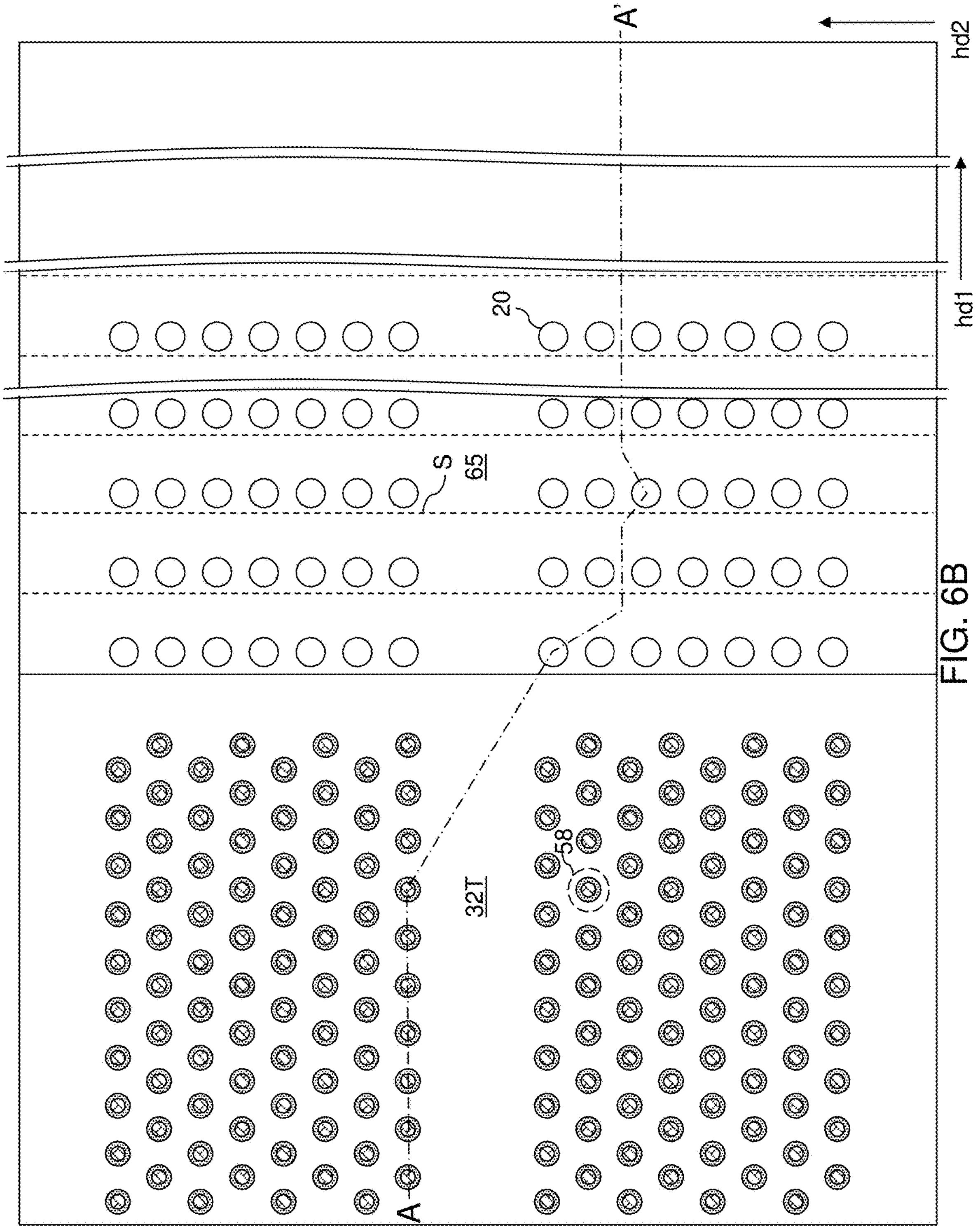
FIG. 6B is a top-down view of the first exemplary structure of FIG. 6A. The vertical plane A-A' is the cut plane of the vertical cross-sectional view of FIG. 6A.

Referring to FIGS. 6A and 6B, the first exemplary structure is illustrated after formation of memory opening fill structures 58 within the memory openings 49. Each of the memory opening fill structures 58 may comprise a memory film 50 and a vertical semiconductor channel 60. In summary, a combination of an alternating stack (32, 42) of insulating layers 32 and sacrificial material layers 42, memory openings 49 vertically extending through the alternating stack (32, 42), and memory opening fill structures 58 located in the memory openings 49 can be formed. Each of the memory opening fill structures 58 comprises a respective vertical stack of memory elements, such as portions of a memory material layer 54 located at levels of the sacrificial material layers 42.

Figure 7A:
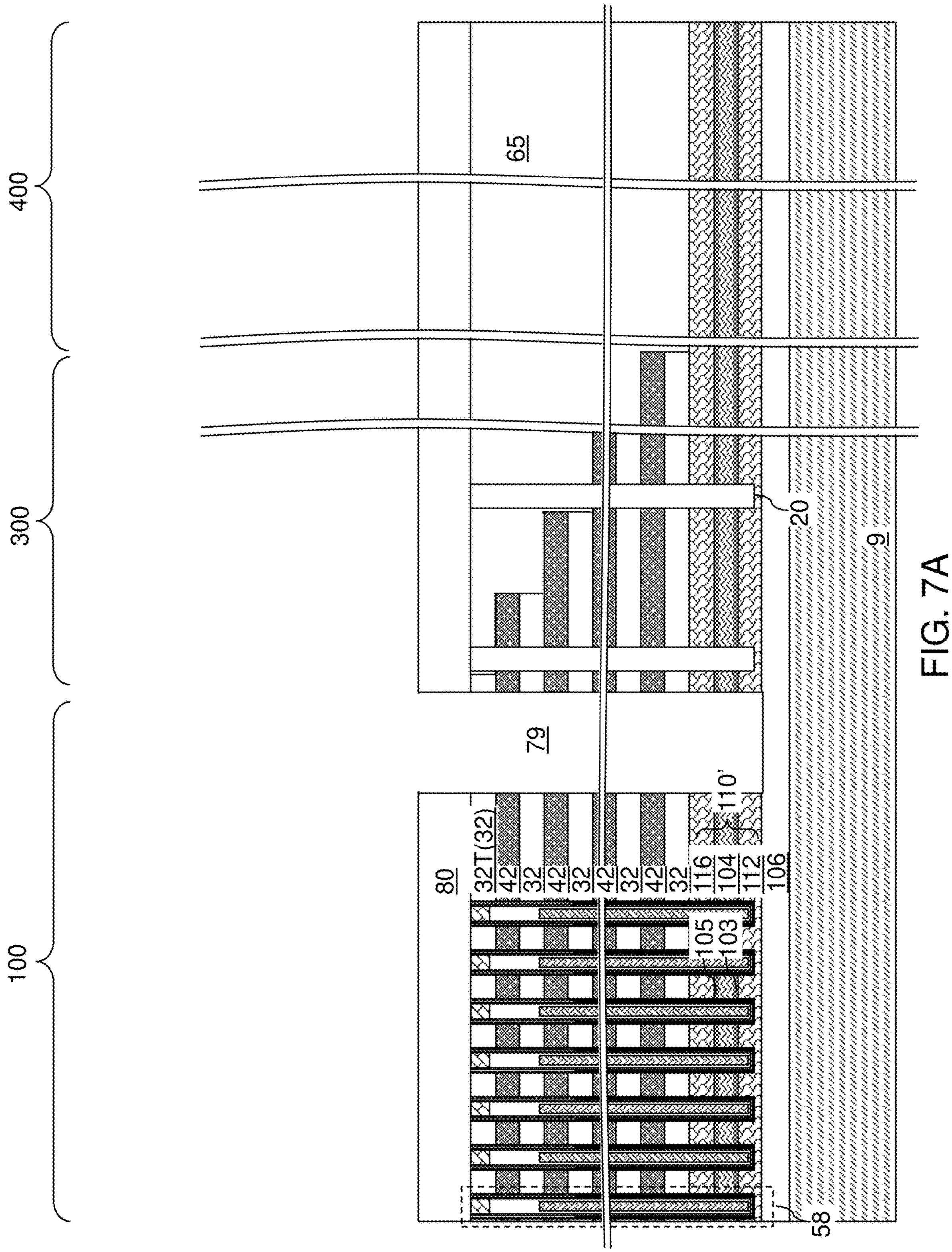
FIG. 7A is a vertical cross-sectional view of the first exemplary structure after formation of isolation trenches according to an embodiment of the present disclosure.
Figure 7B:
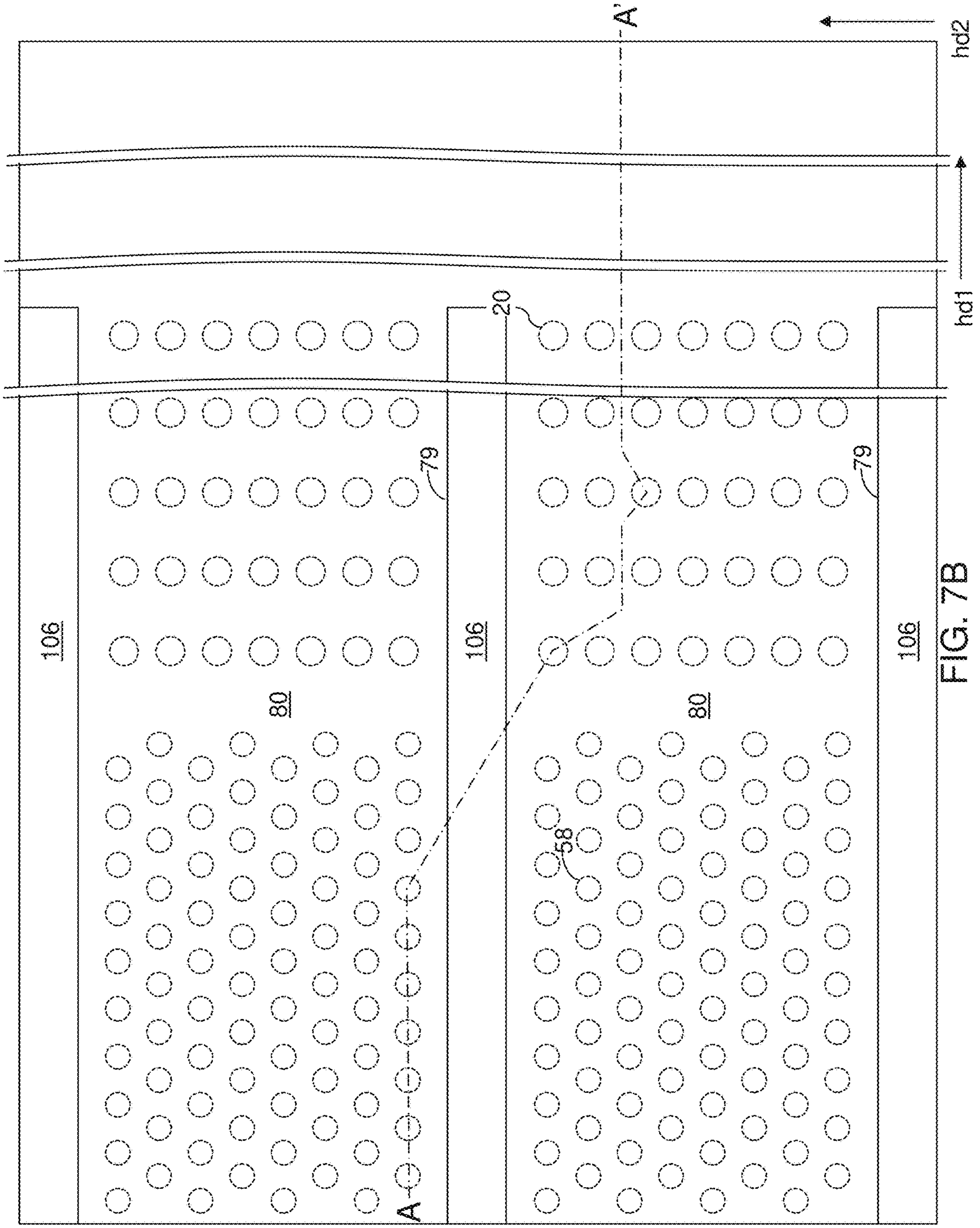
FIG. 7B is a top-down view of the first exemplary structure of FIG. 7A. The vertical plane A-A' is the cut plane of the vertical cross-sectional view of FIG. 7A.

Referring to FIGS. 7A and 7B, a dielectric material such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), the stepped dielectric material portion 65, and the in-process source-level material layers 110'. Lateral isolation trenches 79 laterally extending along the first horizontal direction hd1 can be formed through the alternating stack (32, 42), the stepped dielectric material portion 65, the contact-level dielectric layer 80, and the in-process source-level material layers 110'. Each of the lateral isolation trenches 79 may comprise a respective pair of lengthwise sidewalls that are parallel to the first horizontal direction hd1 and vertically extend from the stopper insulating layer 106 to the top surface of the contact-level dielectric layer 80. A top surface of the stopper insulating layer 106 can be physically exposed underneath each lateral isolation trench 79. The lateral isolation trenches 79 isolate adjacent memory blocks from each other along the second horizontal direction hd2. The photoresist layer can be subsequently removed, for example, by ashing.

Figure 8:
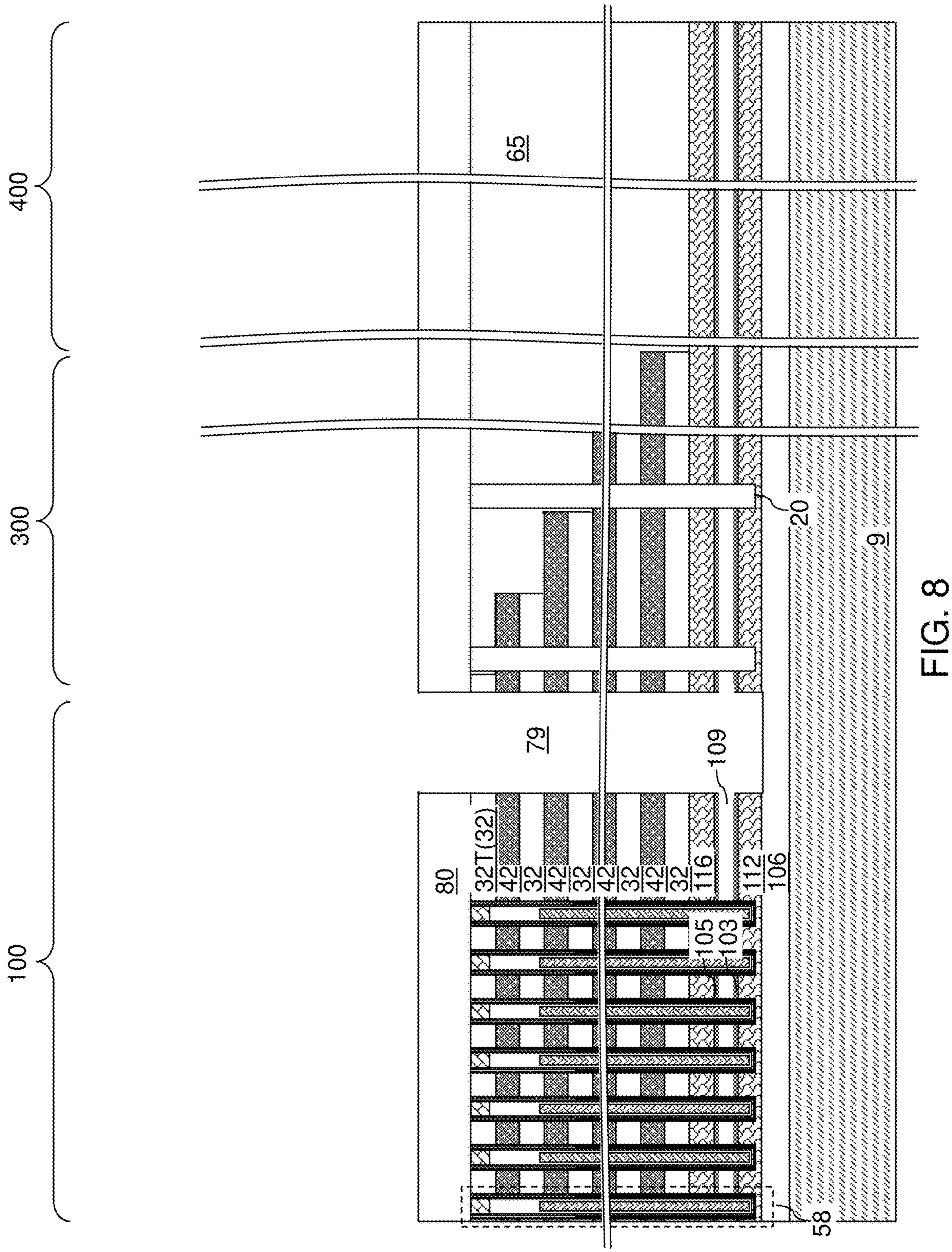
FIG. 8 is a vertical cross-sectional view of the first exemplary structure after formation of a source-level cavity according to an embodiment of the present disclosure.

FIG. 8 is a vertical cross-sectional view of the first exemplary structure after formation of a source-level cavity according to an embodiment of the present disclosure. FIGS. 9A-9E are sequential vertical cross-sectional views of a region of the first exemplary structure during formation of a source contact layer according to an embodiment of the present disclosure.

Figure 9B:
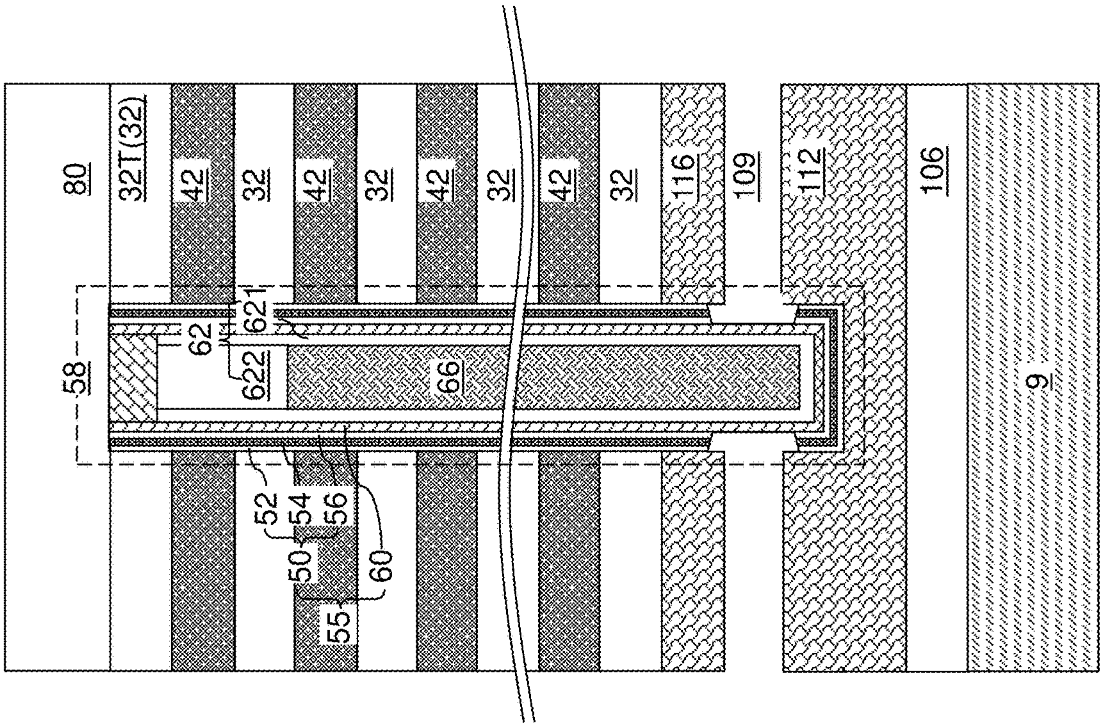
FIGS. 9A-9E are sequential vertical cross-sectional views of a region of the first exemplary structure during formation of a source contact layer according to an embodiment of the present disclosure.
Figure 9A:
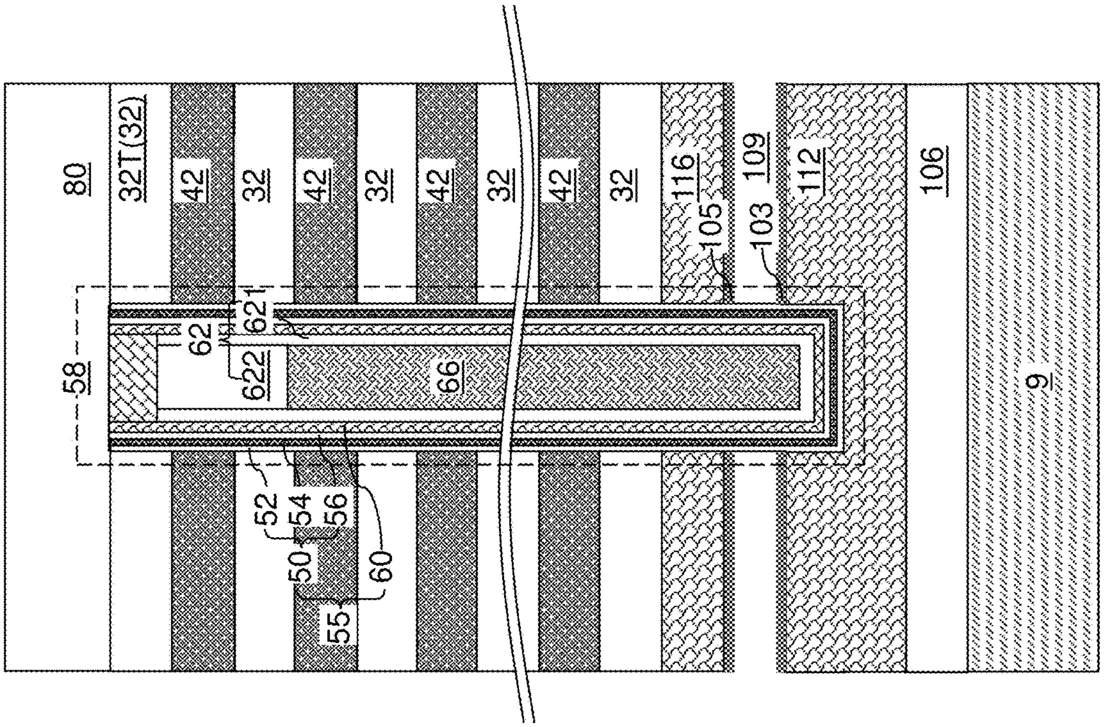

Referring to FIGS. 8 and 9A, an etchant that etches the material of the source-level sacrificial layer 104 selective to the materials of the alternating stack (32, 42), the contact-level dielectric layer 80, the stepped dielectric material portion 65, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stack (32, 42), the contact-level dielectric layer 80, the stepped dielectric material portion 65, the lower source-level semiconductor layer 112, and the upper source-level semiconductor layer 116. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the lateral isolation trenches 79. Specifically, even if sidewalls of the upper source-level semiconductor layer 116 are physically exposed or even if a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall which is physically exposed to the source cavity 109.

Referring to FIG. 9B, a set of first isotropic etch processes can be performed to etch portions of the memory films 50 that are exposed to the source cavity 109. For example, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (103, 105). A top surface of the lower source-level semiconductor layer 112 and a bottom surface of the upper source-level semiconductor layer 116 may be physically exposed to the source cavity 109. Generally, the source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 9D:
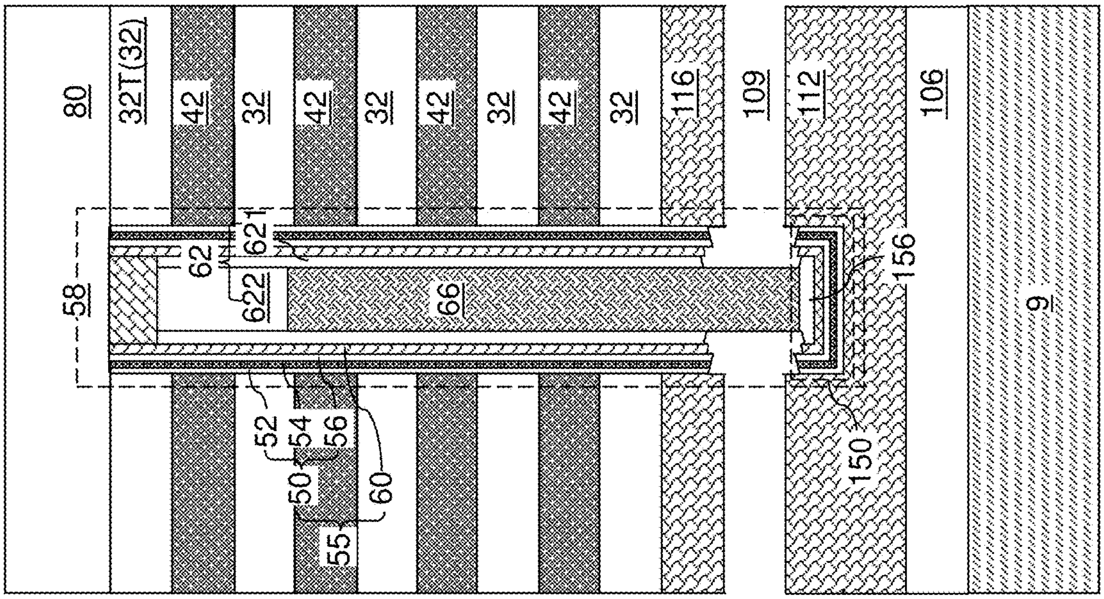
Figure 9C:
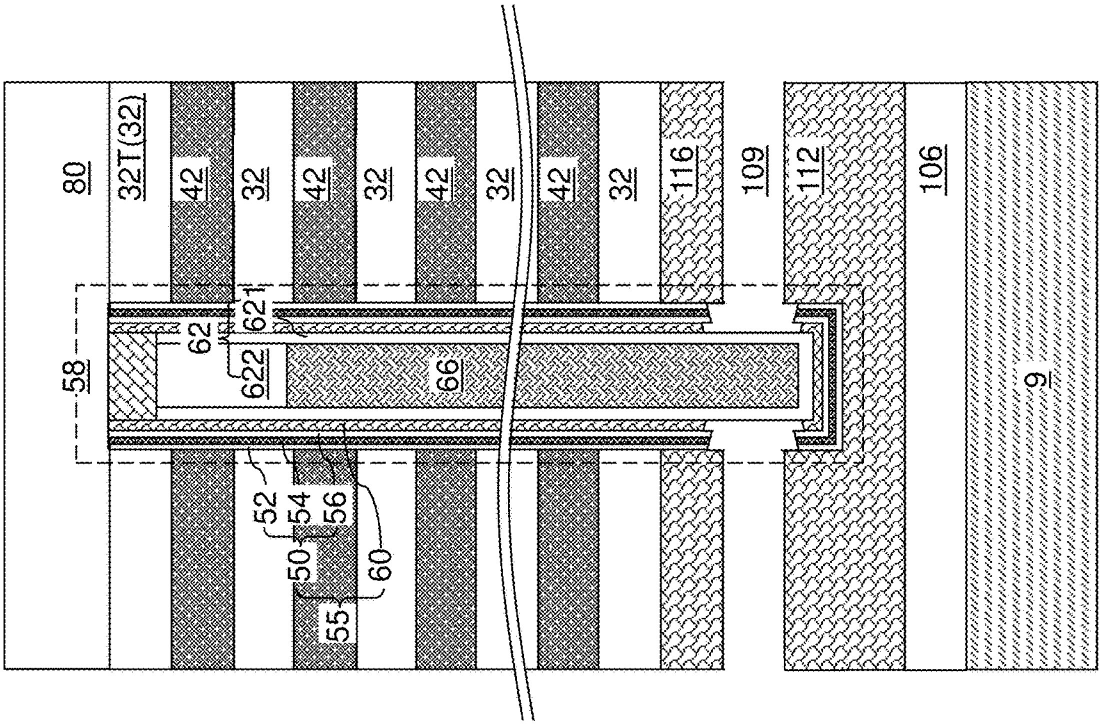

Referring to FIG. 9C, a second isotropic etch process can be performed to remove tubular portions of the vertical semiconductor channels 60 that are exposed in the source cavity 109. In one embodiment, the second isotropic etch process may comprise a wet etch process using hot trimethyl-2 hydroxyethyl ammonium hydroxide ("hot TMY") or tetramethyl ammonium hydroxide (TMAH). The duration of the second isotropic etch process can be selected such that a tubular portion of each vertical semiconductor channel 60 is etched through, and a cylindrical surface of each core dielectric liner 621 is physically exposed around the source cavity 109 while minimizing collateral etching of surface portions of the lower source-level semiconductor layer 112 and the upper source-level semiconductor layer 116.

Referring to FIG. 9D, a third isotropic etch process can be performed to remove tubular portions of the core dielectric liners 621 that are exposed to the source cavity 109. In one embodiment, the third isotropic etch process may comprise a wet etch process employing dilute hydrofluoric acid (if the core dielectric liners 621 comprise silicon oxide), a wet etch process employing phosphoric acid (if the core dielectric liners 621 comprise aluminum oxide), a wet etch process employing a mixture of hydrofluoric acid and nitric acid (if the core dielectric liners 621 comprise hafnium oxide), etc. A cylindrical surface of each core-bias electrode 66 can be physically exposed to the source cavity 109. A set of discrete material plates 150 can be formed underneath each tubular volume around the core-bias electrodes 66 that are incorporated into the source cavity 109 during the processing steps described with reference to FIGS. 9B-9D. In one embodiment, each set of discrete material plates 150 may comprise a first plate having the same material composition and the same thickness as a blocking dielectric layer 52, a second plate having the same material composition and the same thickness as a memory material layer 54, a third plate having the same material composition and the same thickness as a dielectric liner 56, a fourth plate having the same material composition and the same thickness as the vertical semiconductor channel 60, and a fifth plate 156 having the same material composition and the same thickness as a core dielectric liner 621.

Figure 9E:
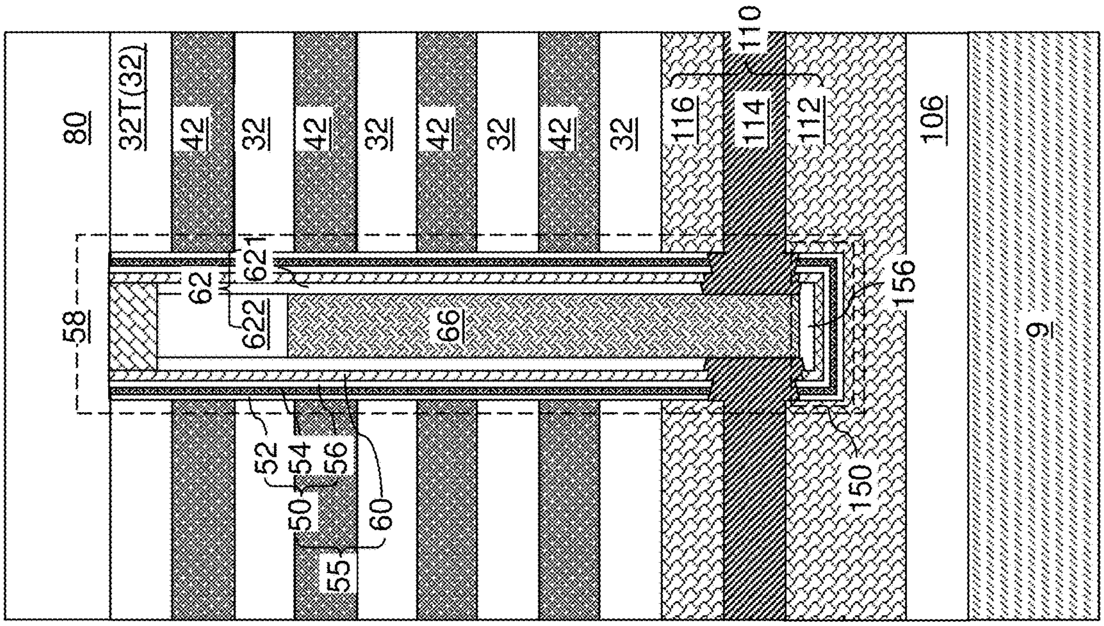
Figure 10:
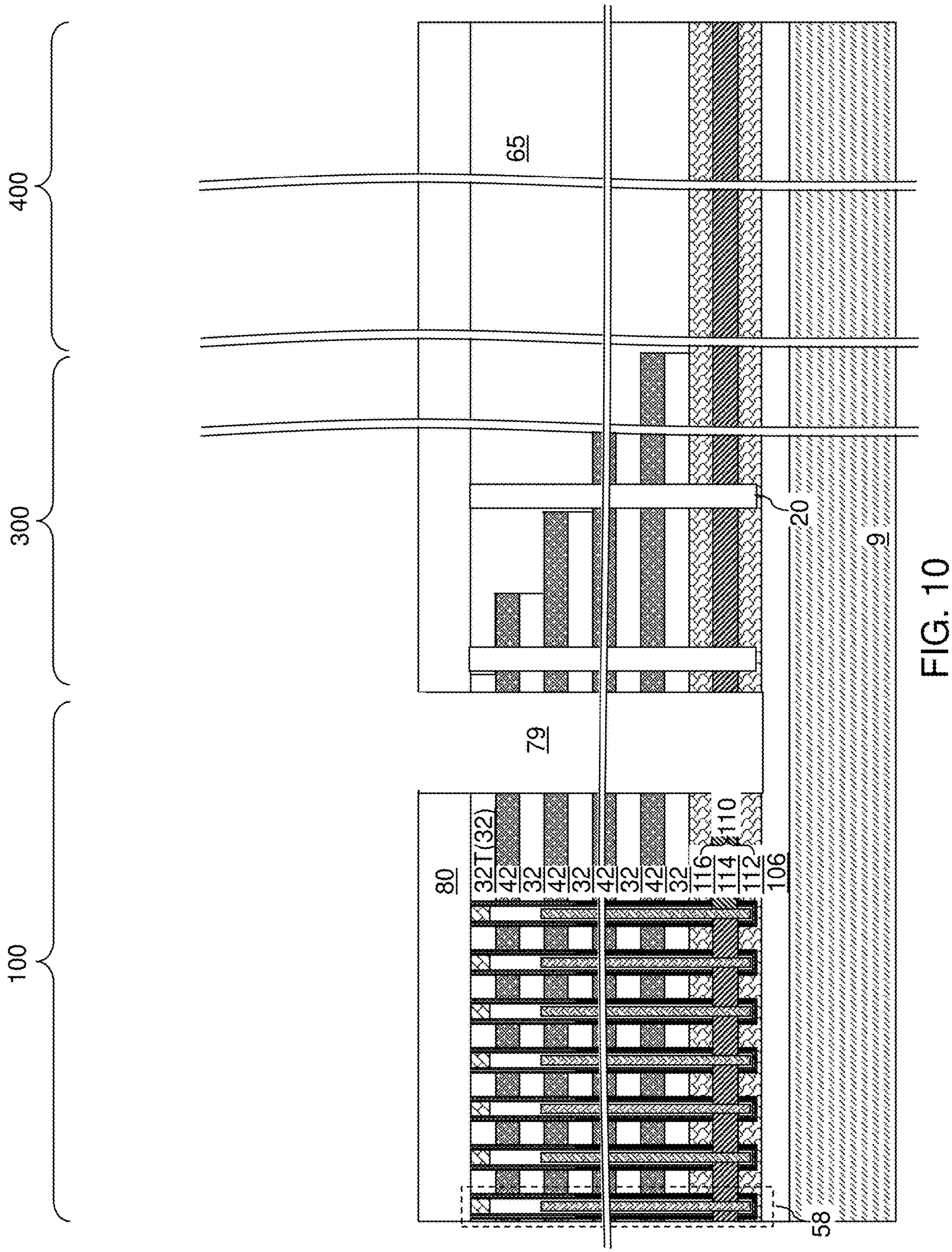
FIG. 10 is a vertical cross-sectional view of the first exemplary structure after formation of the source contact layer according to an embodiment of the present disclosure.

Referring to FIGS. 9E and 10, a semiconductor material having a doping of the second conductivity type may be deposited on the physically exposed semiconductor surfaces around the source cavity 109. The physically exposed semiconductor surfaces include an annular bottom end surface of each vertical semiconductor channels 60, a cylindrical surface segment of the sidewall of each core-bias electrode 66, and a horizontal surface of the at least one source-level semiconductor layer (such as a bottom surface of the upper source-level semiconductor layer 116 and/or a top surface of the lower source-level semiconductor layer 112).

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1\times10^{19}/cm^3$ to $2\times10^{21}/cm^3$, such as from $2\times10^{20}/cm^3$ to $8\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

In one embodiment, each core dielectric liner 621 comprises an annular end surface that contacts the source layer 110, and specifically, contacts an annular end of the source contact layer 114 within the source layer 110. In one embodiment, a cylindrical surface segment of a first end portion of an inner sidewall of the vertical semiconductor channel 60 may contact the drain region 63. In one embodiment, an annular surface segment of the second end portion of the vertical semiconductor channel 60 contacts the source layer 110. Thus, the source layer 110 contacts a second end portion of each vertical semiconductor channel 60 and contacts an end portion of each core-bias electrode 66.

In one embodiment, within each memory opening fill structure 58, a first annular end surface of the core dielectric liner 621 contacts the drain region 63, and a second annular end surface of the core dielectric liner 621 contacts the source layer 110. In one embodiment, a cylindrical surface segment of the core-bias electrode 66 contacts the source layer 110. In one embodiment, an annular end surface of the vertical semiconductor channel 60 contacts the source layer 110, and the entirety of an outer cylindrical sidewall of the vertical semiconductor channel 60 contacts the core dielectric liner 621.

Figure 11:
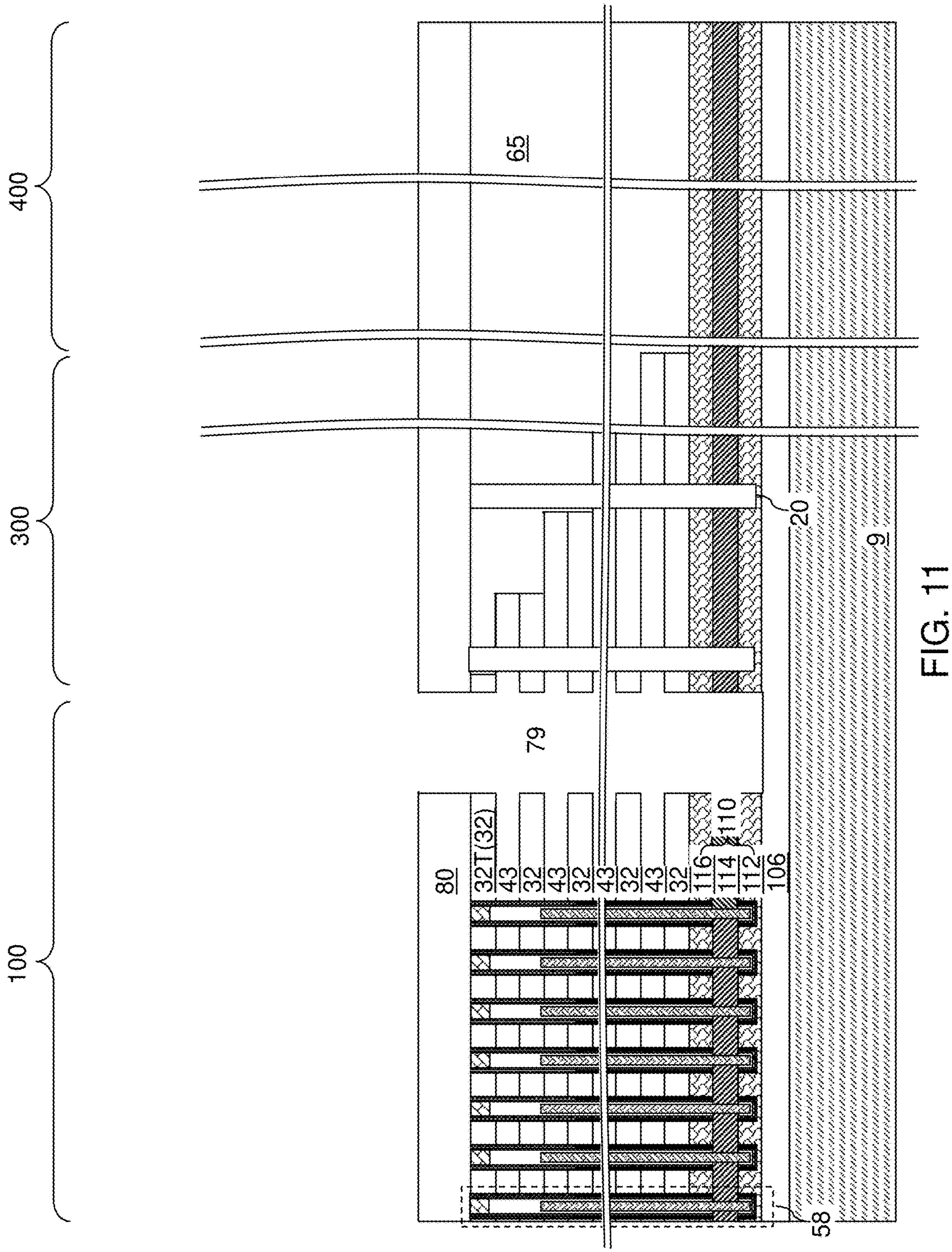
FIG. 11 is a vertical cross-sectional view of the first exemplary structure after formation of laterally-extending cavities according to an embodiment of the present disclosure.

Referring to FIG. 11, an isotropic etch process can be performed to remove the sacrificial material layers 42 selective to the insulating layers 32, the stopper insulating layer 106, the memory opening fill structures 58, the sacrificial etch stop liners 71, and the source layer 110. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon nitride, the isotropic etch process may comprise a wet etch process employing hot phosphoric acid, which is a process in which the first exemplary structure is immersed in phosphoric acid at or near the boiling point of the phosphoric acid. A suitable cleaning process may be performed as needed. In summary, the laterally-extending cavities 43 can be formed by removing the sacrificial material layers 42 selective to the insulating layers 32 and the memory opening fill structures 58.

FIGS. 12A-12D are sequential vertical cross-sectional views of a region of the first exemplary structure during formation of a backside blocking dielectric layer 44 and an electrically conductive layer 46 in each of the laterally-extending cavities 43 according to an embodiment of the present disclosure.

Figure 12A:
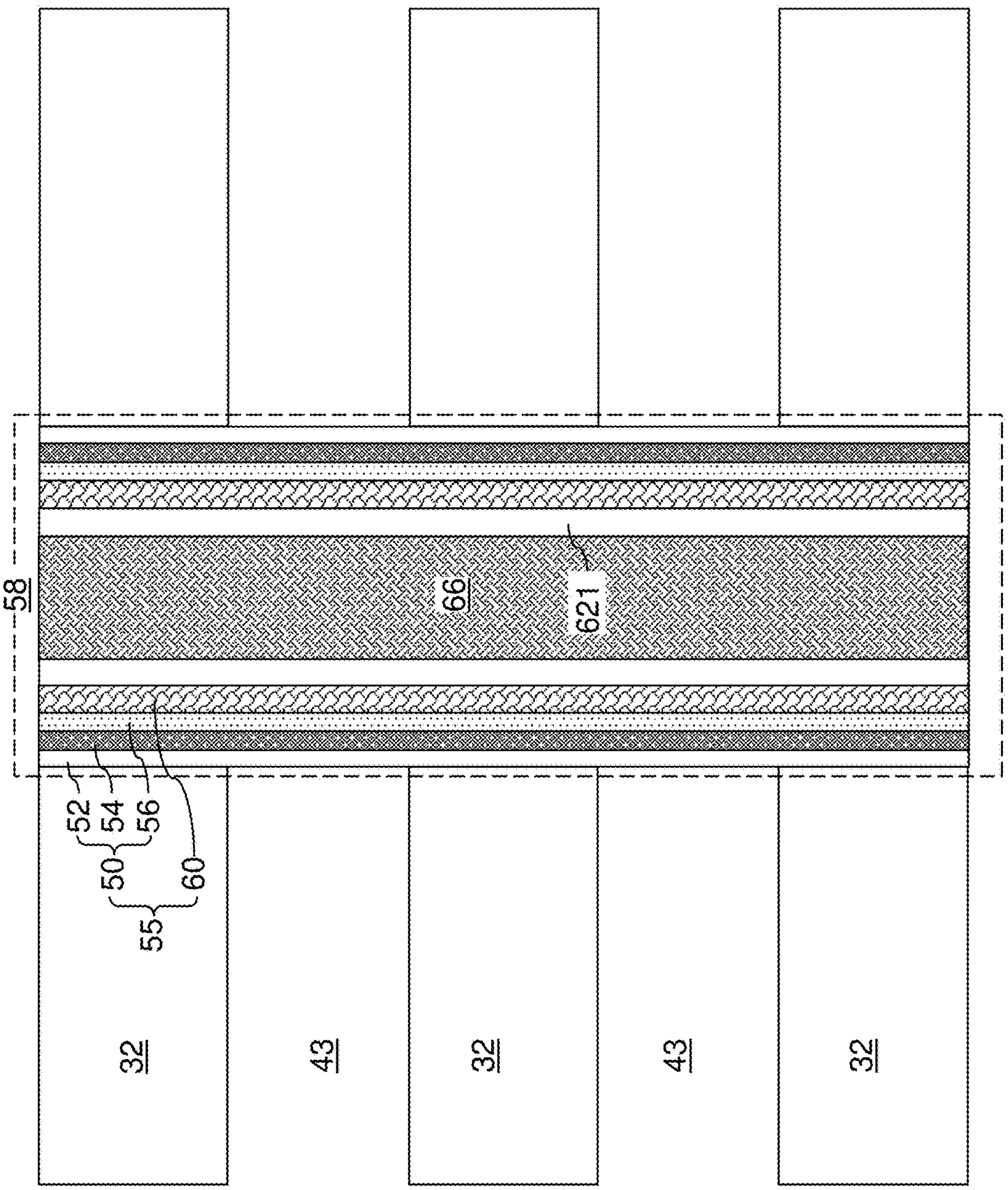
FIGS. 12A-12D are sequential vertical cross-sectional views of a region of the first exemplary structure during formation a backside blocking dielectric layer and an electrically conductive layer in each laterally-extending cavity according to an embodiment of the present disclosure.

Referring to FIG. 12A, a region of the first exemplary structure is illustrated after the processing steps of FIG. 11. Cylindrical outer surface segments of each memory opening fill structure 58 and horizontally-extending surfaces of the insulating layers 32 can be exposed to the laterally-extending cavities 43.

Figure 12B:
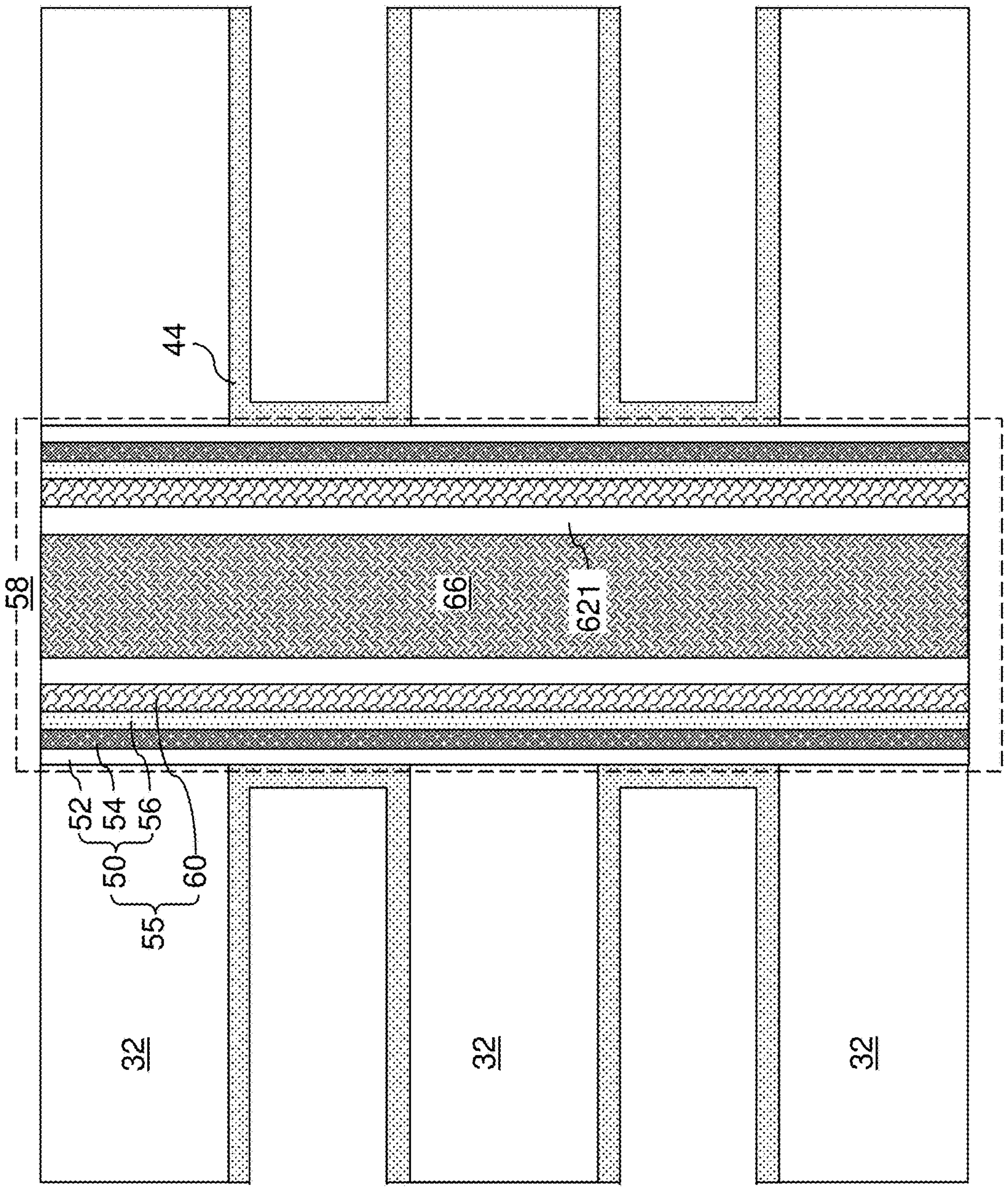

Referring to FIG. 12B, a backside blocking dielectric layer 44 is deposited in the laterally-extending cavities 43. The backside blocking dielectric layer 44 includes and/or consists essentially of a dielectric metal oxide material, such as aluminum oxide. The backside blocking dielectric layer 44 can be deposited by a conformal deposition process, and may have a uniform thickness throughout. In one embodiment, an atomic layer deposition (ALD) process or a chemical vapor deposition (CVD) process may be employed to deposit the backside blocking dielectric layer 44. The backside blocking dielectric layer 44 may have a thickness in a range from 1 nm to 10 nm, such as from 2 nm to 5 nm, although lesser and greater thicknesses may also be employed.

Figure 12C:
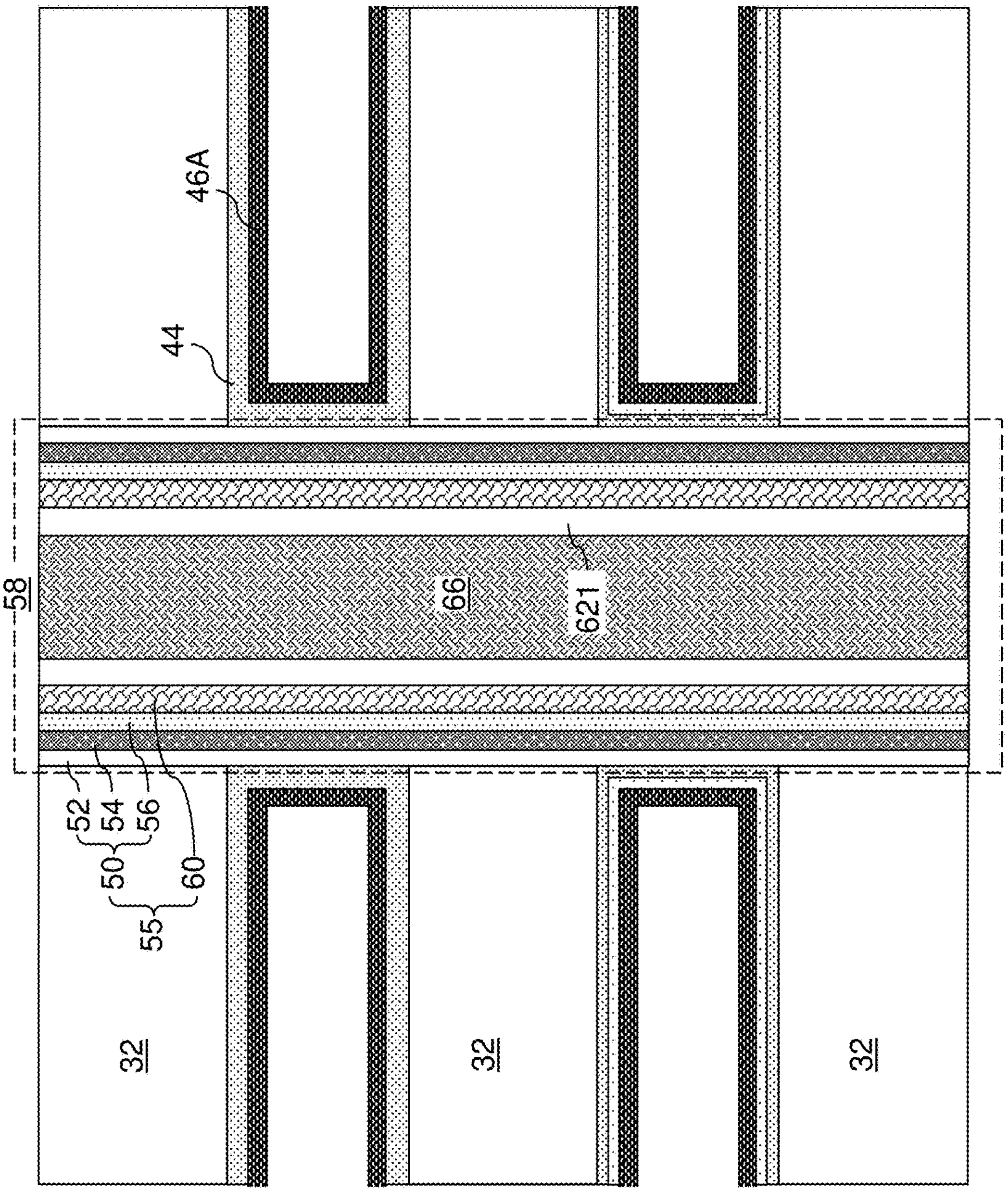

Referring to FIG. 12C, an electrically conductive diffusion barrier layer 46A can be conformally deposited on the physically exposed surfaces of the backside blocking dielectric layer 44. The diffusion barrier layer 46A may comprise tungsten nitride, titanium nitride, molybdenum nitride or tantalum nitride. The thickness of the diffusion barrier layer 46A may be in a range from 1 nm to 8 nm, such as from 2 nm to 5 nm, although lesser and greater thicknesses may also be employed.

Figure 12D:
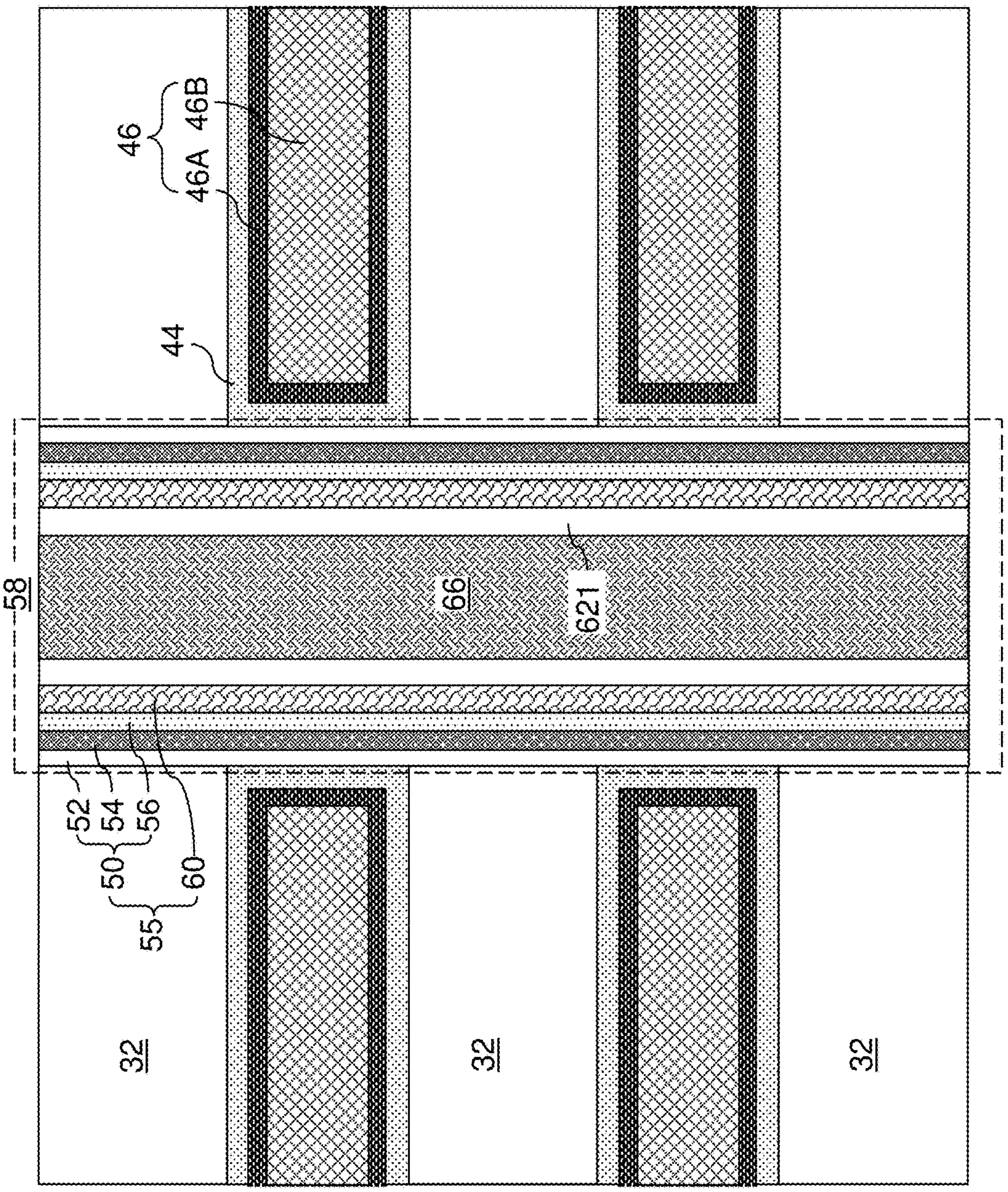

Referring to FIG. 12D, a metal layer 46B may be deposited in remaining volumes of the laterally-extending cavities 43. In one embodiment, the metal may comprise tungsten, molybdenum, ruthenium or cobalt. The metal layer 46B may be deposited by a conformal deposition process such as a chemical vapor deposition process, and can fill remaining volumes of the laterally-extending cavities 43.

An anisotropic etch process can be performed to remove portions of the metal layer 46B and the diffusion barrier layer 46A and optionally the backside blocking dielectric layer 44 from inside the volumes of the lateral isolation trenches 79 and from above the contact-level dielectric layer 80. Each contiguous remaining portion of the combination of the metal layer 46B and the diffusion barrier layer 46A located within a volume of a respective laterally-extending cavity 43 constitutes an electrically conductive layer 46. Alternating stacks (32, 46) of insulating layers 32 and electrically conductive layers 46 are thus formed. The alternating stacks (32, 46) of insulating layers 32 and electrically conductive layers 46 can be laterally spaced apart from each other along the second horizontal direction hd2 by the lateral isolation trenches 79.

Figure 13A:
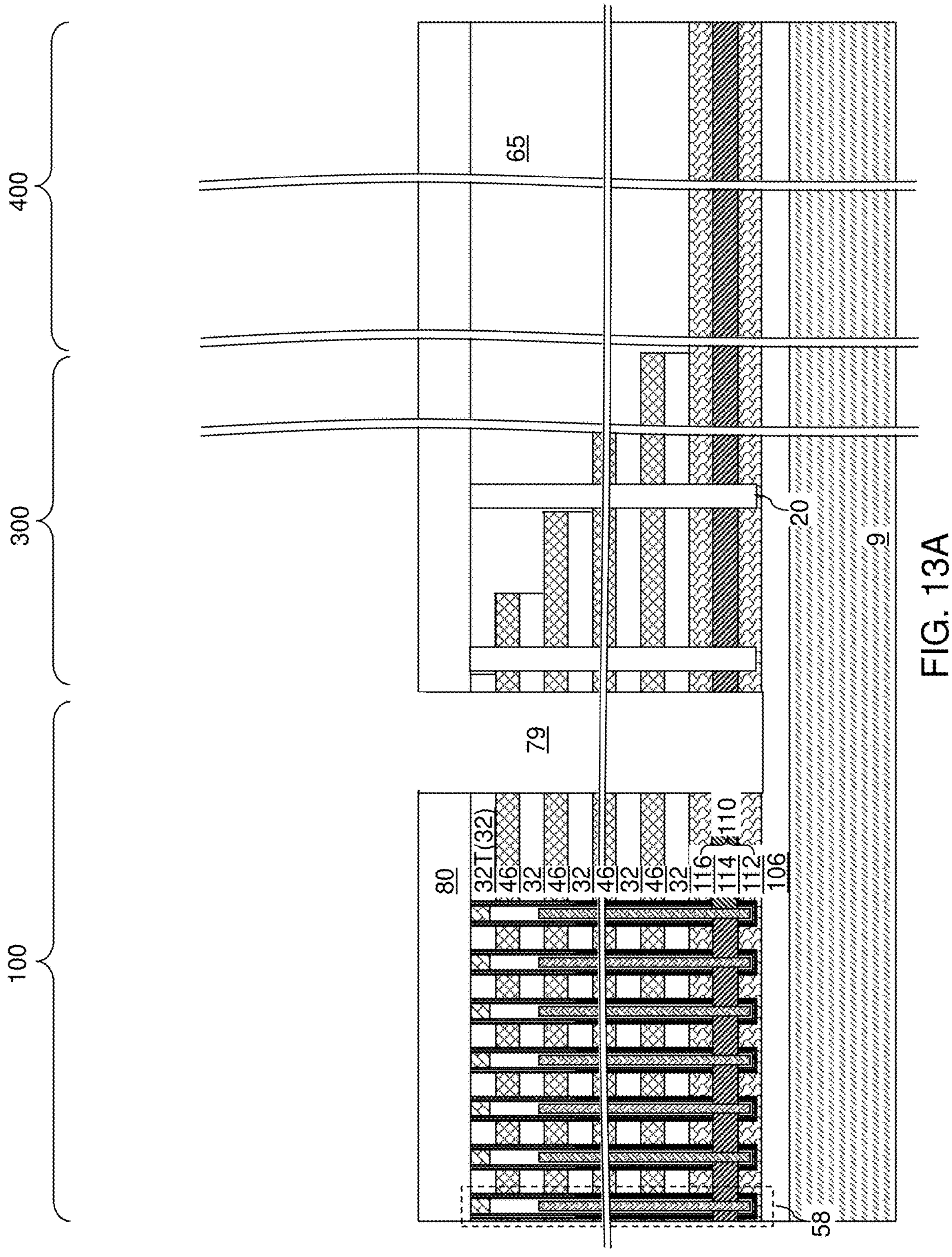
FIG. 13A is a vertical cross-sectional view of the first exemplary structure after formation of electrically conductive layers according to an embodiment of the present disclosure.
Figure 13B:
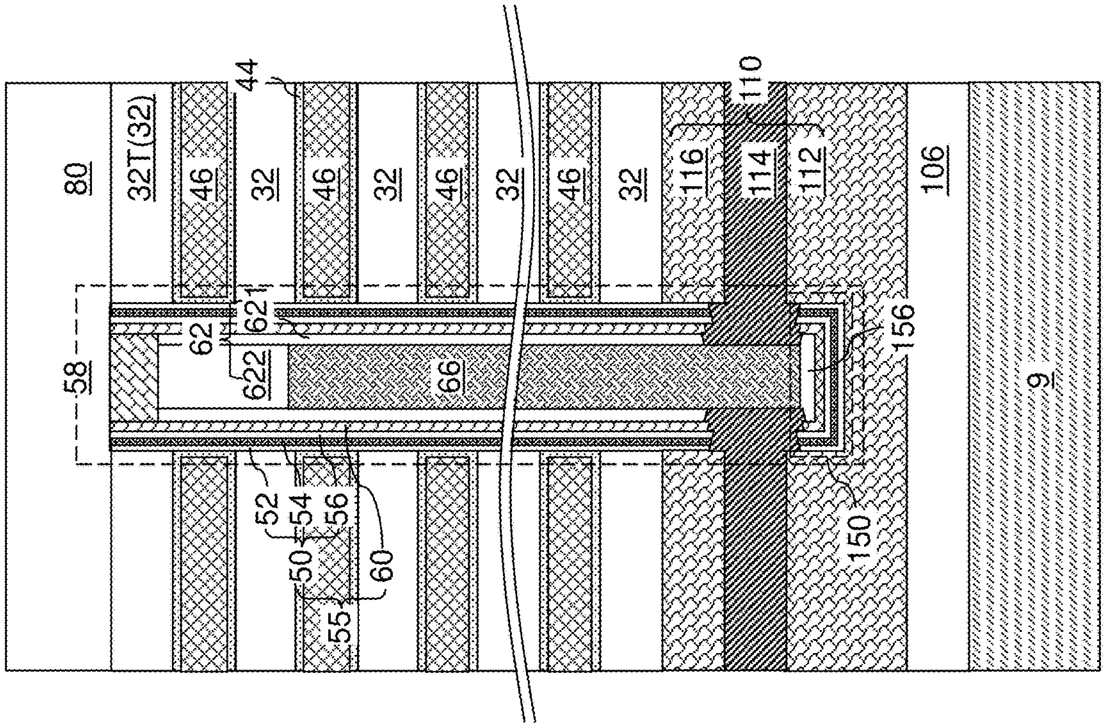
FIG. 13B is a vertical cross-sectional view of a region of the first exemplary structure around a memory opening fill structure.

Referring to FIGS. 13A and 13B, the first exemplary structure is illustrated after the processing steps of FIG. 12D. In one embodiment, the electrically conductive layers 46 within each alternating stack (32, 46) comprise word lines and drain-select-electrode lines that overlie the word lines. The core-bias electrodes 66 within the memory opening fill structures 58 embedded in the alternating stack (32, 46) may vertically extend through each of the word lines in the alternating stack (32, 46).

Figure 14A:
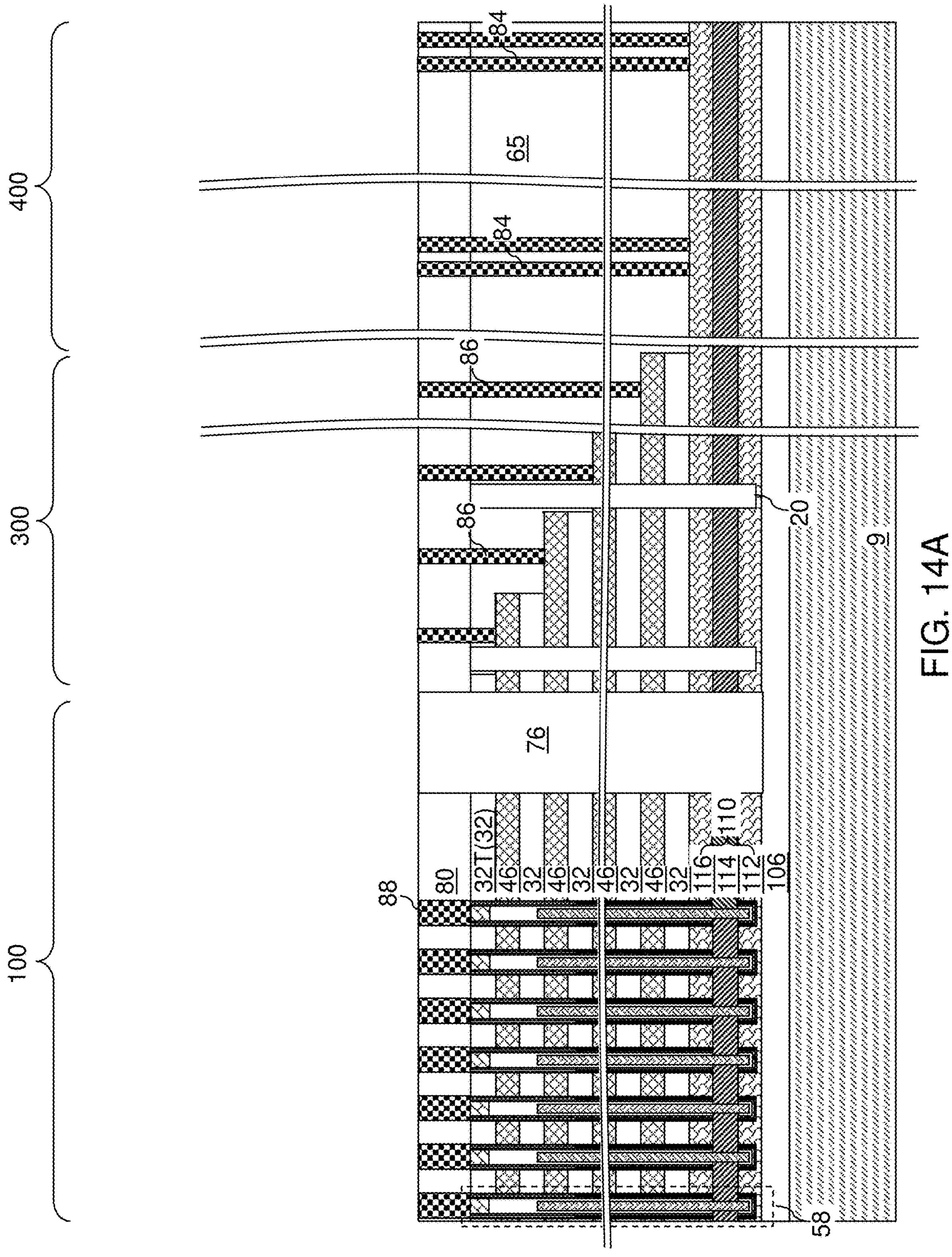
FIG. 14A is a vertical cross-sectional view of the first exemplary structure after formation of lateral isolation trench fill structures and contact via structures according to an embodiment of the present disclosure.
Figure 14B:
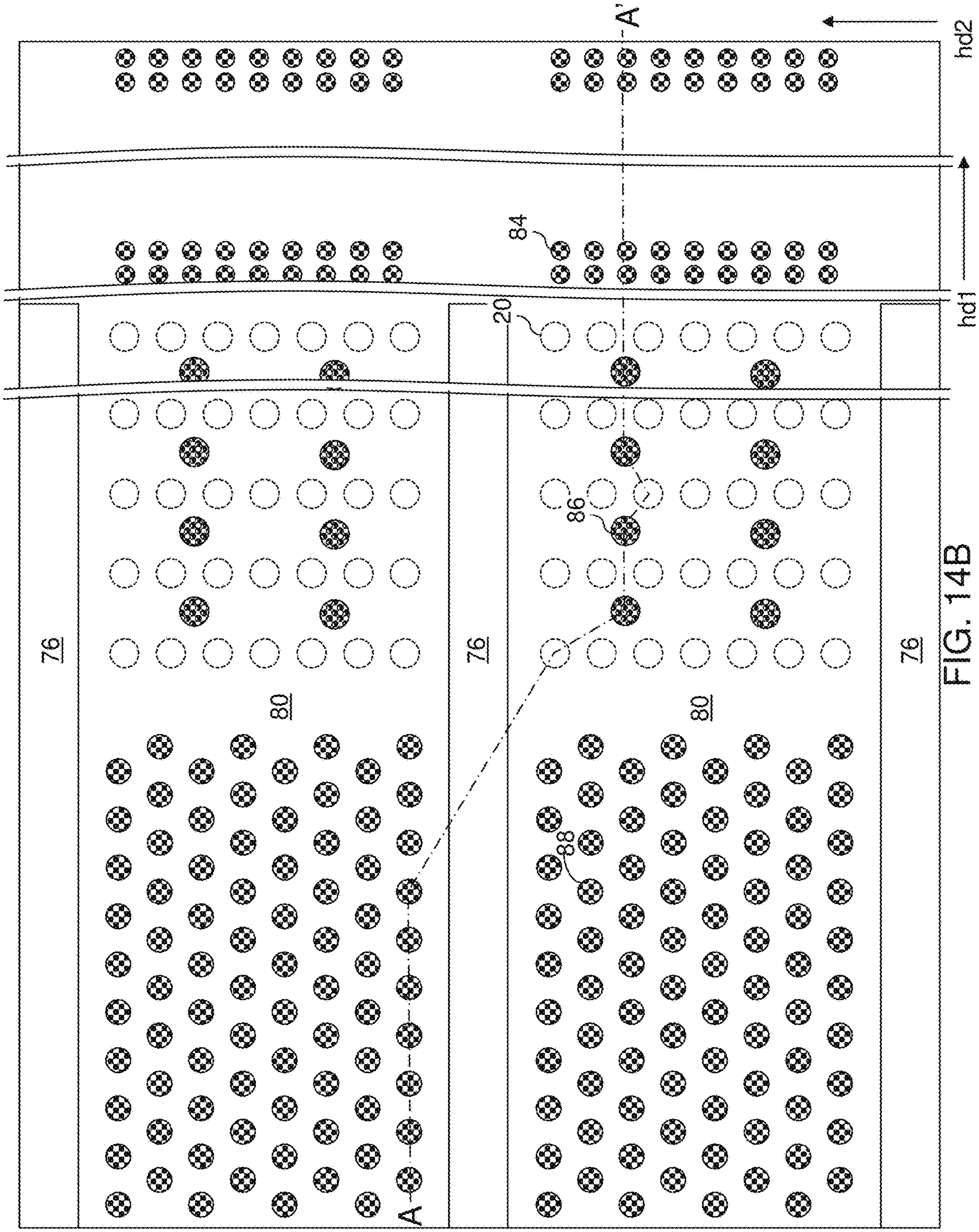
FIG. 14B is a top-down view of the first exemplary structure of FIG. 14A. The vertical plane A-A' is the cut plane of the vertical cross-sectional view of FIG. 14A.

Referring to FIGS. 14A and 14B, an insulating fill material may be conformally deposited in the lateral isolation trenches 79. Excess portions of the insulating fill material may be removed from above the contact-level dielectric layer 80, for example, by a recess etch process. Each remaining portion of the insulating fill material that fills a respective lateral isolation trench 79 constitutes an isolation trench fill structure 76. Alternatively, each isolation trench fill structure 76 may comprise a combination of a tubular insulating spacer (not expressly shown) and a conductive connection via structure (not expressly shown) that is laterally surrounded by the tubular insulating spacer. In summary, an isolation trench fill structure 76 having an insulating sidewall vertically extends from a bottommost surface of an alternating stack (32, 46) to a topmost surface of the alternating stack (32, 46).

A photoresist layer (not shown) can be applied over the contact-level dielectric layer 80, and can be lithographically patterned to form openings over each of the memory opening fill structures 58, over the horizontally-extending surfaces of the stepped surfaces in the contact region 300, and in the peripheral region 400. An anisotropic etch process can be performed to transfer the pattern of the openings in the photoresist layer through the contact-level dielectric layer 80 and the stepped dielectric material portion 65. Drain contact via cavities can be formed through the contact-level dielectric layer 80 over the memory opening fill structures 58. Layer contact via structures can be formed through the contact-level dielectric layer 80 and the stepped dielectric material portion 65 on a top surface of a respective one of the electrically conductive layers 46. Connection pad cavities are formed through the contact-level dielectric layer 80 and the stepped dielectric material portion 65 to a top surface of the source layer 110. The photoresist layer can be subsequently removed, for example, by ashing.

At least one conductive material, such as a combination of a metallic barrier material and a metallic fill material, can be deposited in the drain contact via cavities, the layer contact via cavities, and the connection pad cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fills the drain contact via cavities constitute drain contact via structures 88 contacting a top surface of a respective one of the drain regions 63. Remaining portions of the at least one conductive material that fills the layer contact via cavities constitute layer contact via structures 86 contacting a top surface of a respective one of the electrically conductive layers 46. Remaining portions of the at least one conductive material that fills the connection pad cavities constitute connection via structures 84 contacting a top surface of the source layer 110. In one embodiment, the connection via structures 84 may be formed as arrays of connection via structures 84.

Referring collectively to FIGS. 1-14B, a combination of a three-dimensional memory array and a dielectric material portion (such as a stepped dielectric material portion 65) can be formed on a first side of a source layer 110 that overlies a carrier substrate 9. The three-dimensional memory array comprises a three-dimensional array of memory elements embedded in an alternating stack (32, 46) of insulating layers 32 and electrically conductive layers 46 on the first side of a source layer 110, and the dielectric material portion is formed adjacent to the alternating stack (32, 46). The connection via structures 84 are formed through the dielectric material portion (such as a stepped dielectric material portion 65). In one embodiment, the electrically conductive layers 46 within the alternating stack (32, 46) have variable lateral extents that change with a vertical distance from the source layer 110. In one embodiment, the alternating stack (32, 46) comprises stepped surfaces, the dielectric material portion comprises a stepped dielectric material portion 65 that includes a first region that contacts the stepped surfaces of the alternating stack (32, 46) and a second region that is laterally offset from the first region and has a uniform thickness. The connection via structures 84 can vertically extend through the second region.

Figure 15A:
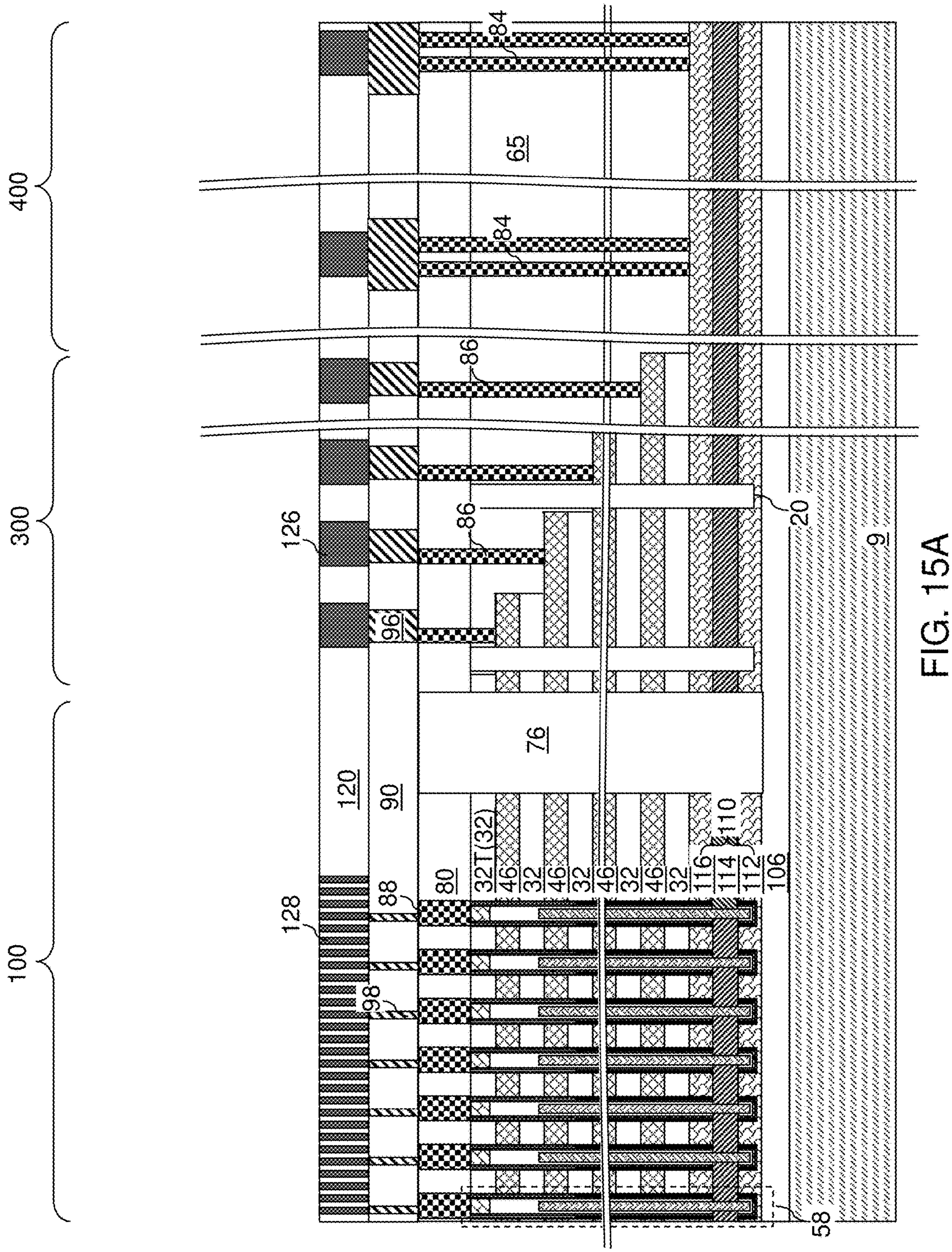
FIG. 15A is a vertical cross-sectional view of the first exemplary structure after formation of bit lines and bit-line-level metal lines according to an embodiment of the present disclosure.
Figure 15B:
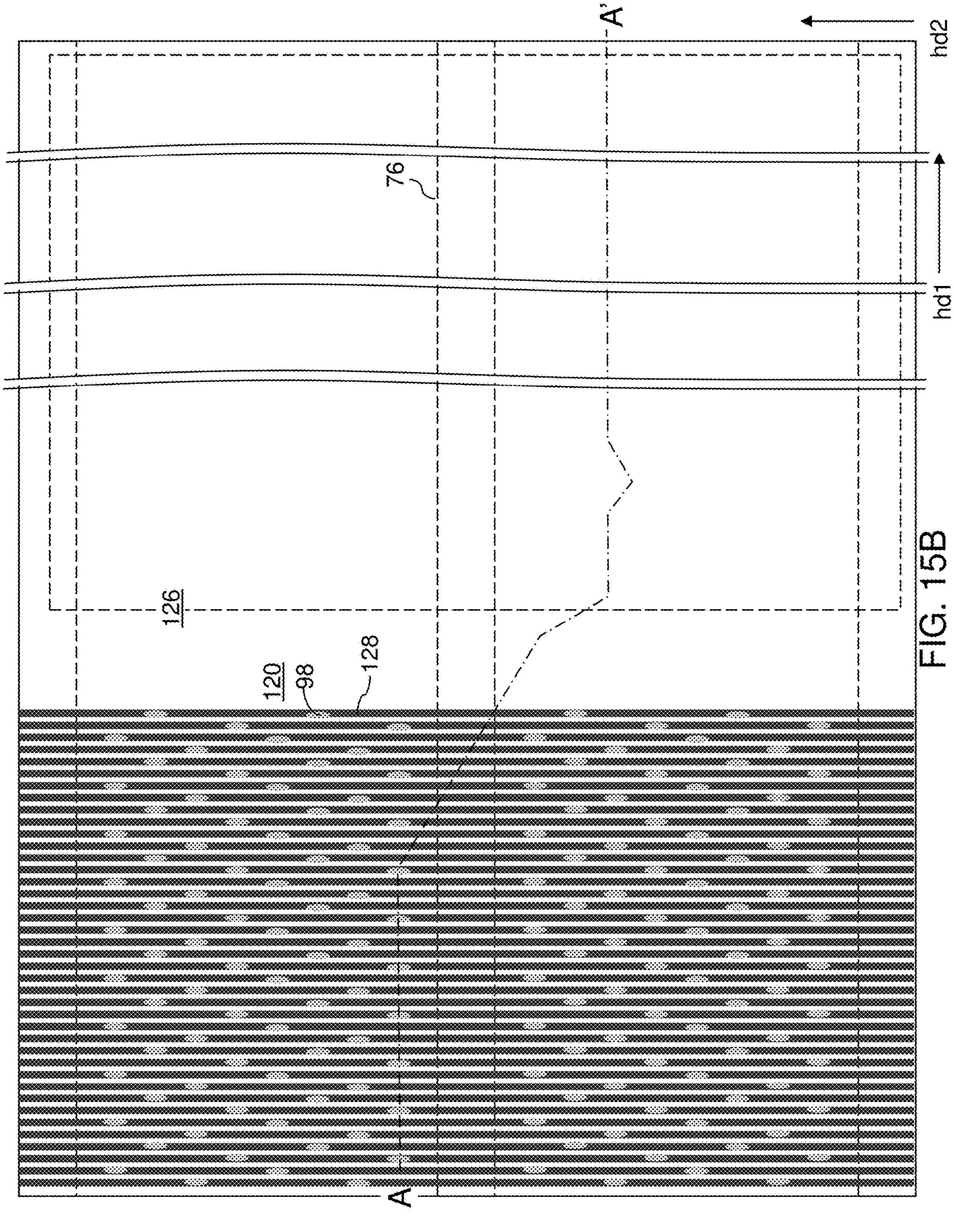
FIG. 15B is a top-down view of the first exemplary structure of FIG. 15A. The vertical plane A-A' is the cut plane of the vertical cross-sectional view of FIG. 15A.

Referring to FIGS. 15A and 15B, a connection-level dielectric layer 90 can be formed above the contact-level dielectric layer 80. Connection pad cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 16:
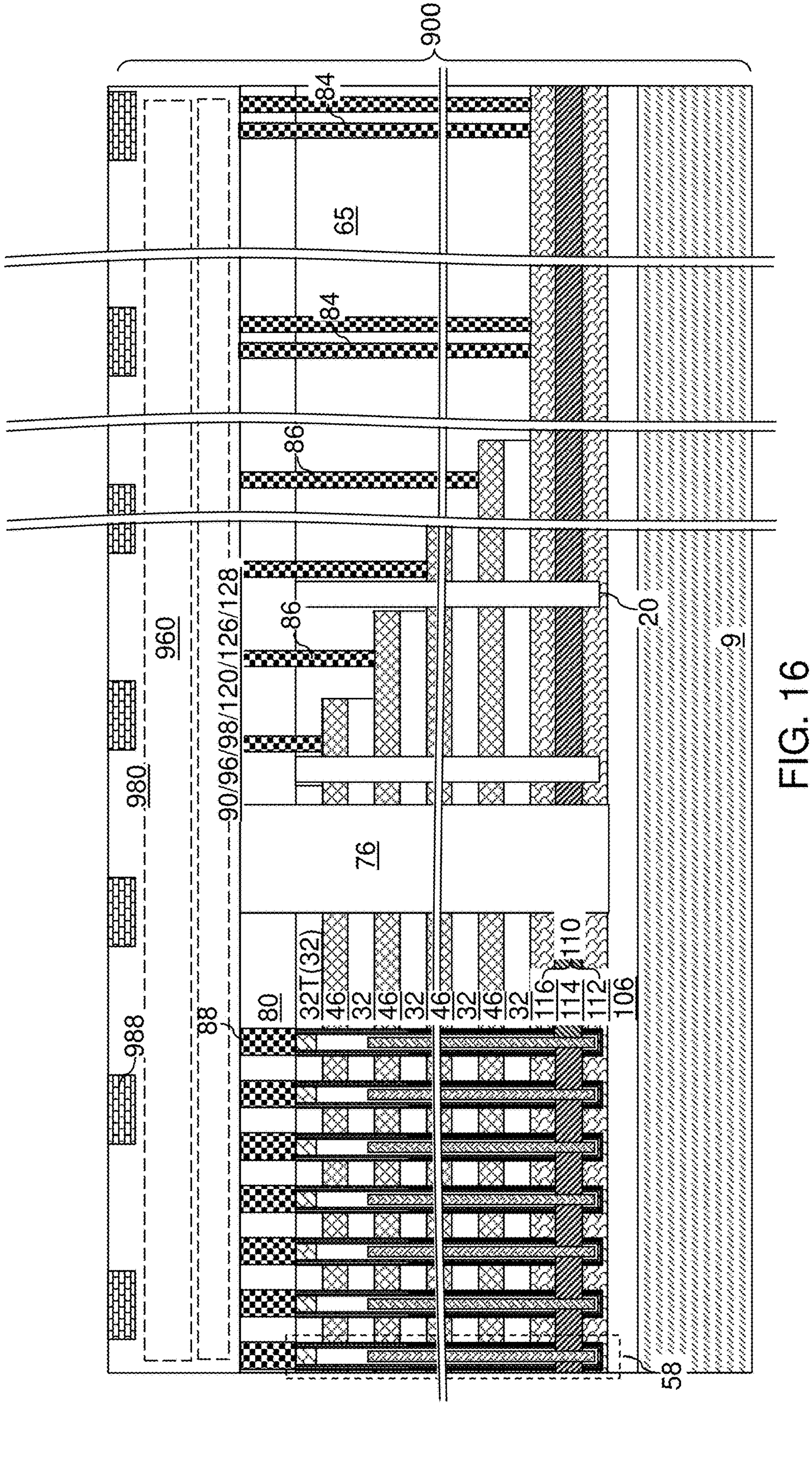
FIG. 16 is a vertical cross-sectional view of the first exemplary structure after formation of a first semiconductor die according to an embodiment of the present disclosure.

Referring to FIG. 16, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding the bit lines 128, which are a subset of the memory-side metal interconnect structures 980.

Metal bonding pads, which are herein referred to as memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A first semiconductor die (e.g., memory die) 900 can thus be provided. The first semiconductor die 900 may be used for VMM processing.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the first semiconductor die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; a two-dimensional array of drain contact via structures 88 electrically connected to a respective one of the vertical semiconductor channels 60; and a two-dimensional array of layer contact via structures 86 electrically connected to a respective one of the electrically conductive layers 46, a subset of which functions as word lines for the three-dimensional memory array.

In summary, a three-dimensional memory array, a dielectric material portion comprising a stepped dielectric material portion 65, connection via structures 84 vertically extending through the stepped dielectric material portion 65, and memory-side bonding pads 988 can be provided in a first semiconductor die 900 comprising. In one embodiment, the first semiconductor die 900 further comprises memory-side dielectric material layers 960 and memory-side metal interconnect structures 980, and the memory-side bonding pads 988 are embedded within memory-side dielectric material layers 960. The three-dimensional memory array may include an alternating stack of insulating layers 32 and electrically conductive layers 46, and a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 17:
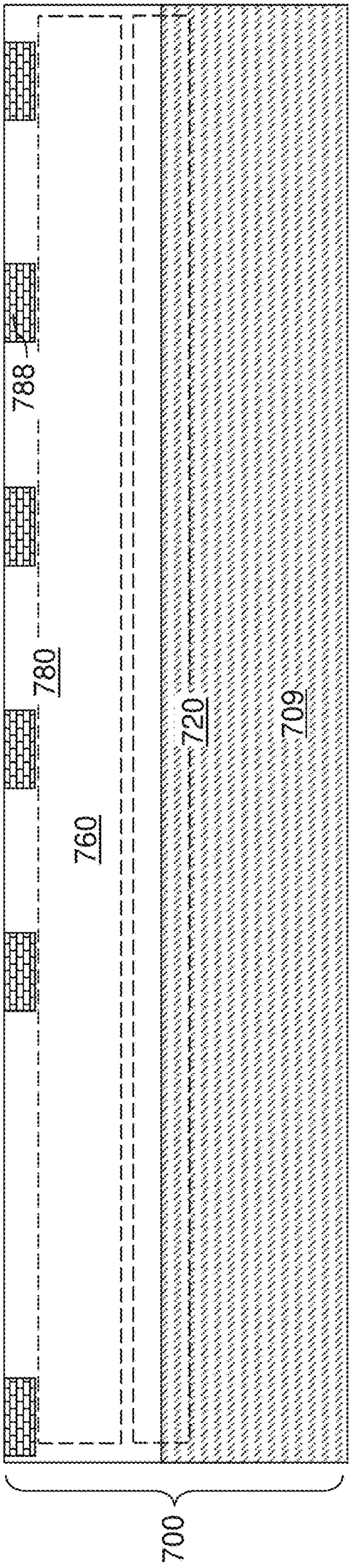
FIG. 17 is a vertical cross-sectional view of a logic die according to an embodiment of the present disclosure.

Referring to FIG. 17, a logic die 700 is provided. The logic die 700 comprises a peripheral circuit 720 that is formed on a logic-side substrate 709. According to an aspect of the present disclosure, the peripheral circuit 720 can be configured to control operation of the three-dimensional memory array in the first semiconductor die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 18:
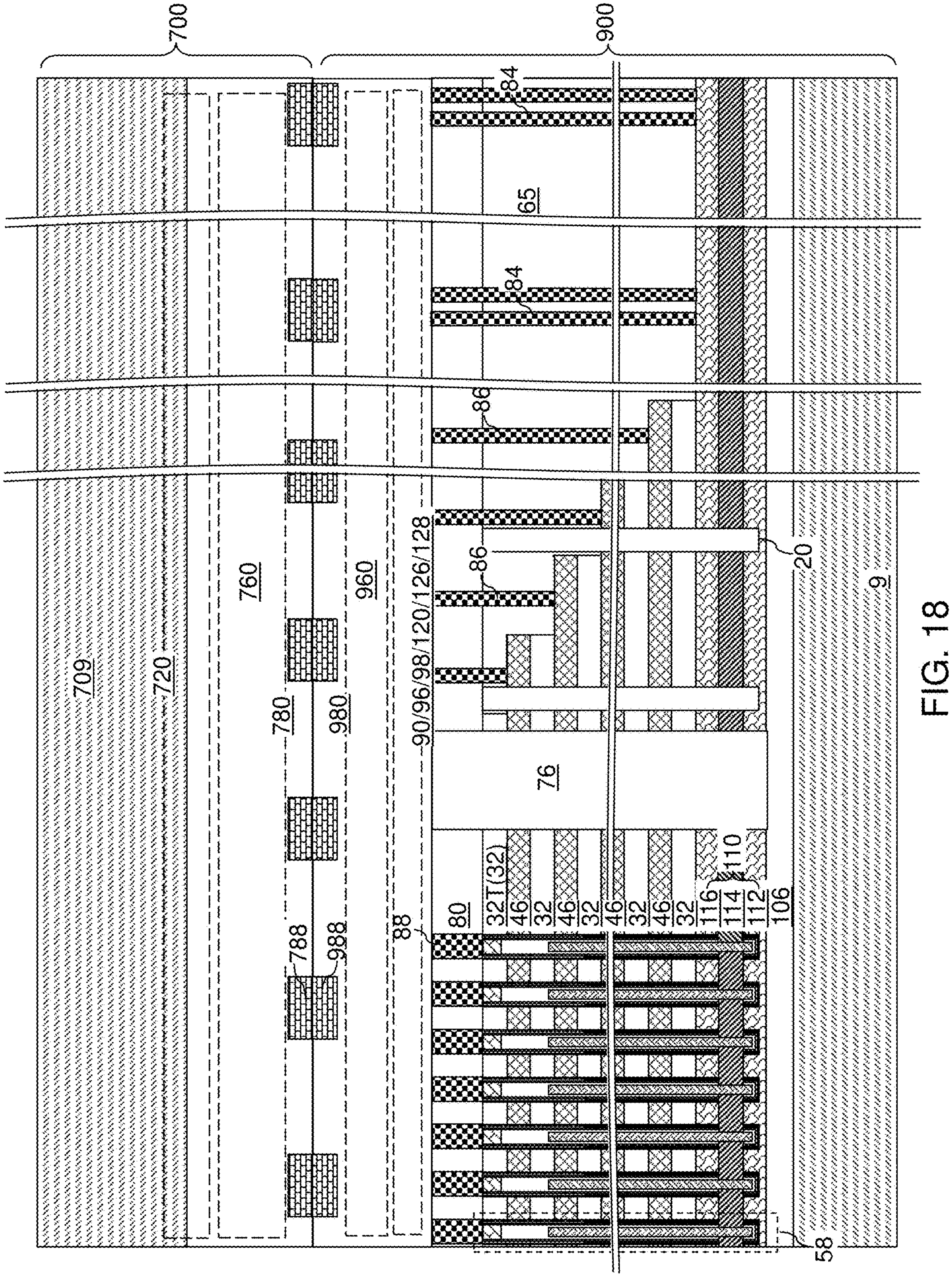
FIG. 18 is a vertical cross-sectional view of the first exemplary structure after formation of a bonded assembly of the first semiconductor die and the logic die according to an embodiment of the present disclosure.

Referring to FIG. 18, a bonded assembly can be formed by bonding a logic die 700 with the first semiconductor die 900. The logic die 700 can be attached to the first semiconductor die 900, for example, by bonding the logic-side bonding pads 788 to the memory-side bonding pads 988. The bonding between the first semiconductor die 900 and the logic die 700 may be performed employing a wafer-to-wafer bonding process in which a two-dimensional array of first semiconductor dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective first semiconductor die 900.

The logic die 700 can be attached to the first semiconductor die 900, for example, by bonding the logic-side bonding pads 788 to the memory-side bonding pads 988. The bonding between the first semiconductor die 900 and the logic die 700 may be performed employing a wafer-to-wafer bonding process in which a two-dimensional array of first semiconductor dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective first semiconductor die 900. In one embodiment, the logic-side bonding pads 788 can be bonded to the memory-side bonding pads 988 by metal-to-metal bonding, such as copper-to-copper bonding.

Figure 19:
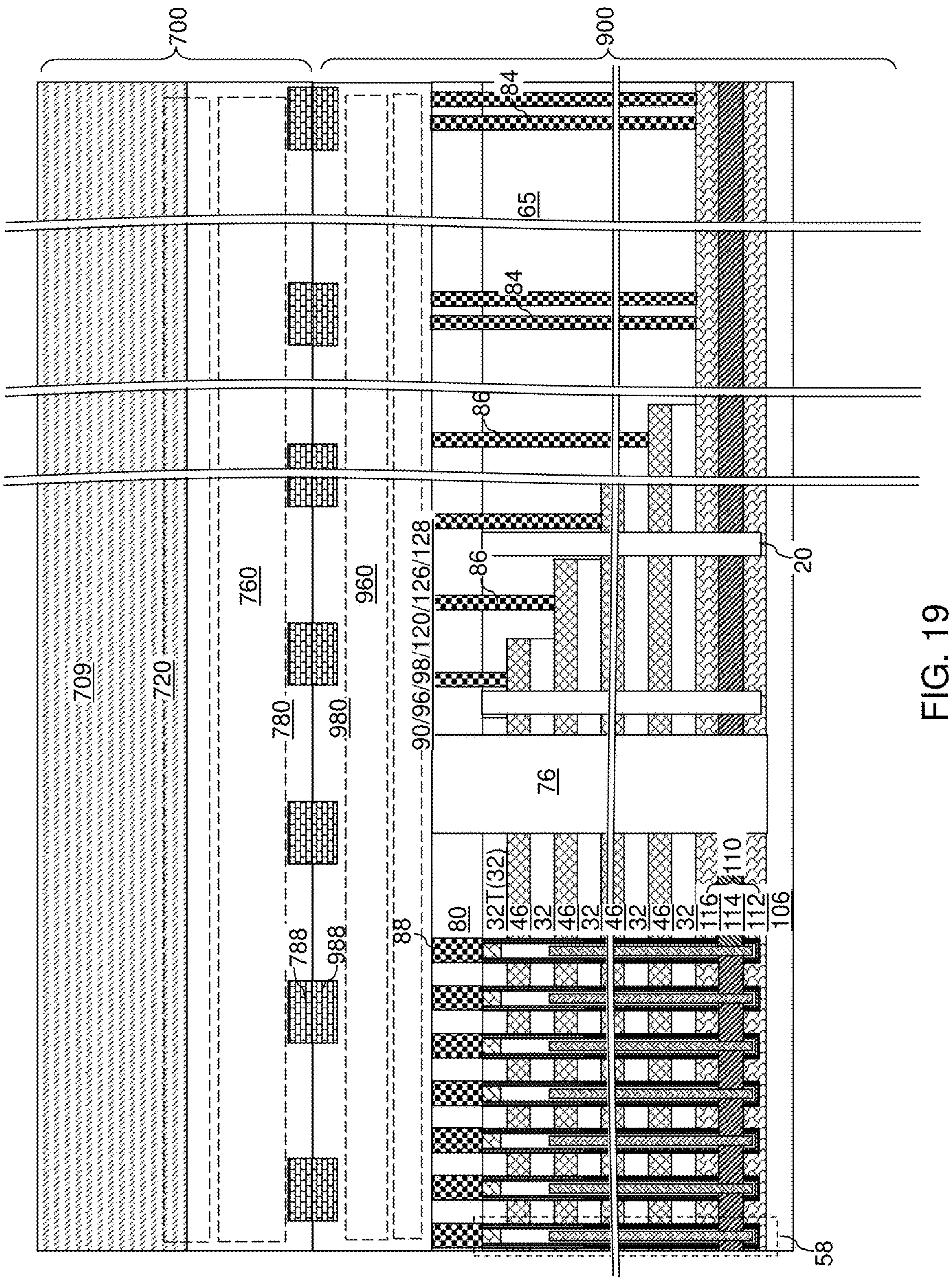
FIG. 19 is a vertical cross-sectional view of the first exemplary structure after removal of a carrier substrate from the first semiconductor die according to an embodiment of the present disclosure.

Referring to FIG. 19, the carrier substrate 9 may be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process such as a wet etch process is employed to remove the carrier substrate 9, the stopper insulating layer 106 may be subsequently employed as an etch stop material layer. Optional electrical contacts may be formed on the bottom side of the bonded assembly of the first semiconductor die 900 and the logic die 700.

Figure 20:
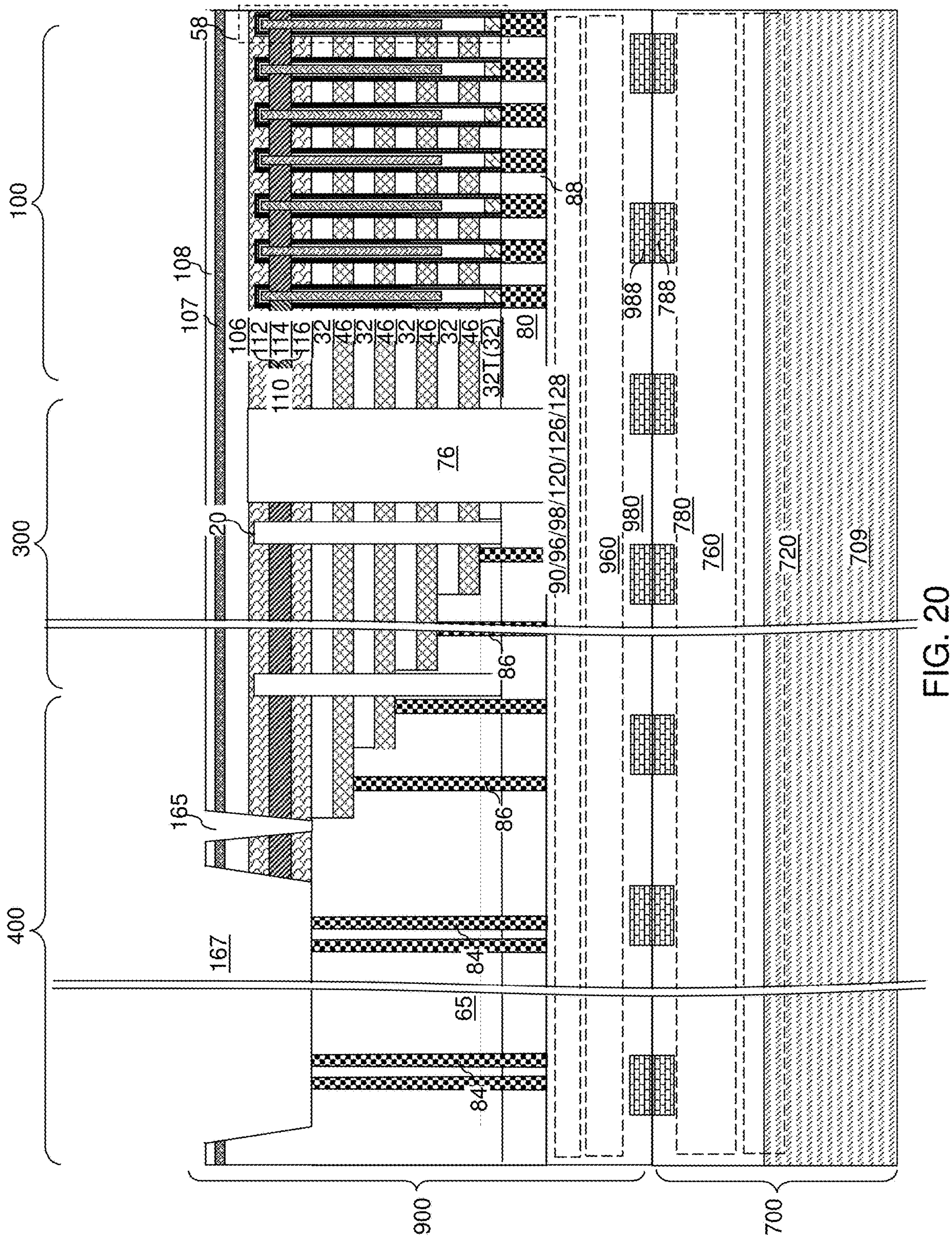
FIG. 20 is a vertical cross-sectional view of the first exemplary structure after formation of additional backside dielectric layers and backside connection pad cavities according to an embodiment of the present disclosure.

Referring to FIG. 20, backside dielectric layers (107, 108) can be deposited on the second side of the source layer 110. For example, the backside dielectric layers (107, 108) can be formed on the physically exposed surface (which may be referred to as a distal surface or a backside surface) of the stopper insulating layer 106. In one embodiment, the backside dielectric layers (107, 108) may comprise an optional first backside dielectric layer 107 and a second backside dielectric layer 108. In an illustrative example, the first backside dielectric layer (if present) 107 may comprise silicon nitride, silicon carbide nitride (i.e., silicon carbonitride), or any other suitable dielectric material, and may have a thickness in a range from 30 nm to 120 nm, although lesser and greater thicknesses may also be employed. The second backside dielectric layer 108 may comprise undoped silicate glass (i.e., silicon oxide) or a doped silicate glass, and may have a thickness in a range from 150 nm to 400 nm, although lesser and greater thicknesses may also be employed.

A photoresist layer (not shown) can be applied over the backside dielectric layers (107, 108), and can be lithographically patterned to form various openings in the peripheral region 400 and optionally at least one elongated opening at or adjacent to a boundary between the peripheral region 400 and the contact region 300. The openings in the peripheral region 400 can be formed over a respective subset of the connection via structures 84. In an illustrative example, each opening in the photoresist layer in the peripheral region 400 may have an areal overlap with two two-dimensional arrays of connection via structures 84.

An anisotropic etch process can be performed to transfer the pattern of the openings in the photoresist layer through the backside dielectric layers (107, 108), the stopper insulating layer 106, and the source layer 110. Backside connection pad cavities 167 vertically extend through the backside dielectric layers (107, 108), the stopper insulating layer 106, and the source layer 110. A row of backside connection pad cavities 167 arranged along the second horizontal direction hd2 may be formed within the peripheral region 400. In one embodiment, at least one separation trench 165 may be optionally formed between the peripheral region 400 and the contact region 300.

Figure 21:
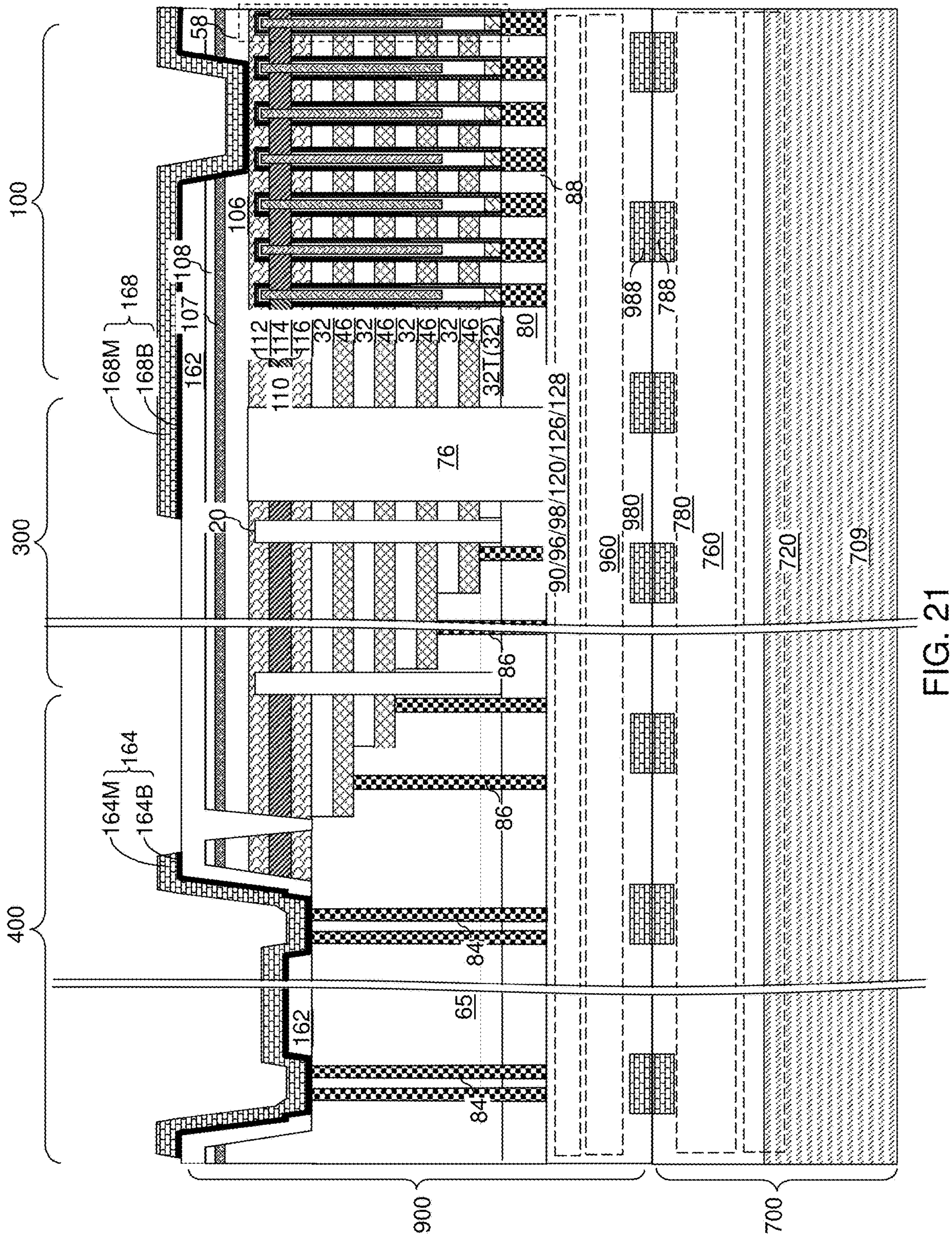
FIG. 21 is a vertical cross-sectional view of the first exemplary structure after formation of the backside connection pad according to an embodiment of the present disclosure.

Referring to FIG. 21, a backside isolation layer 162 can be deposited on the distal surface (i.e., a backside surface) of the backside dielectric layers (107, 108), on the physically exposed sidewalls of the backside dielectric layers (107, 108), the stopper insulating layer 106, and the source layer 110, and on the physically exposed surface segments of the stepped dielectric material portion 65. The backside isolation layer 162 comprises a dielectric material, such as undoped silicate glass or a doped silicate glass, and can be formed by chemical vapor deposition. The thickness of the horizontally-extending portions of the backside isolation layer 162 may be in a range from 200 nm to 1,000 nm, such as from 300 nm to 600 nm, although lesser and greater thicknesses may also be employed. The separation trench 165 may be completely filled with a portion of the backside isolation layer 162. Openings can be formed through portions of the backside isolation layer 162 over areas of the connection via structures 84.

The backside connection pad layer can be deposited, which may include a stack of a backside metallic barrier liner layer and a backside metallic material layer. The backside connection pad layer can be patterned into backside connection pad structures 164 and source connection pad structures 168. Each backside connection pad structure 164 may comprise a combination of a backside metallic barrier liner 164B and a backside metallic layer 164M. Each source connection pad structure 168 may comprise a combination of a source metallic barrier liner 168B and a source metallic layer 168M.

Figure 22:
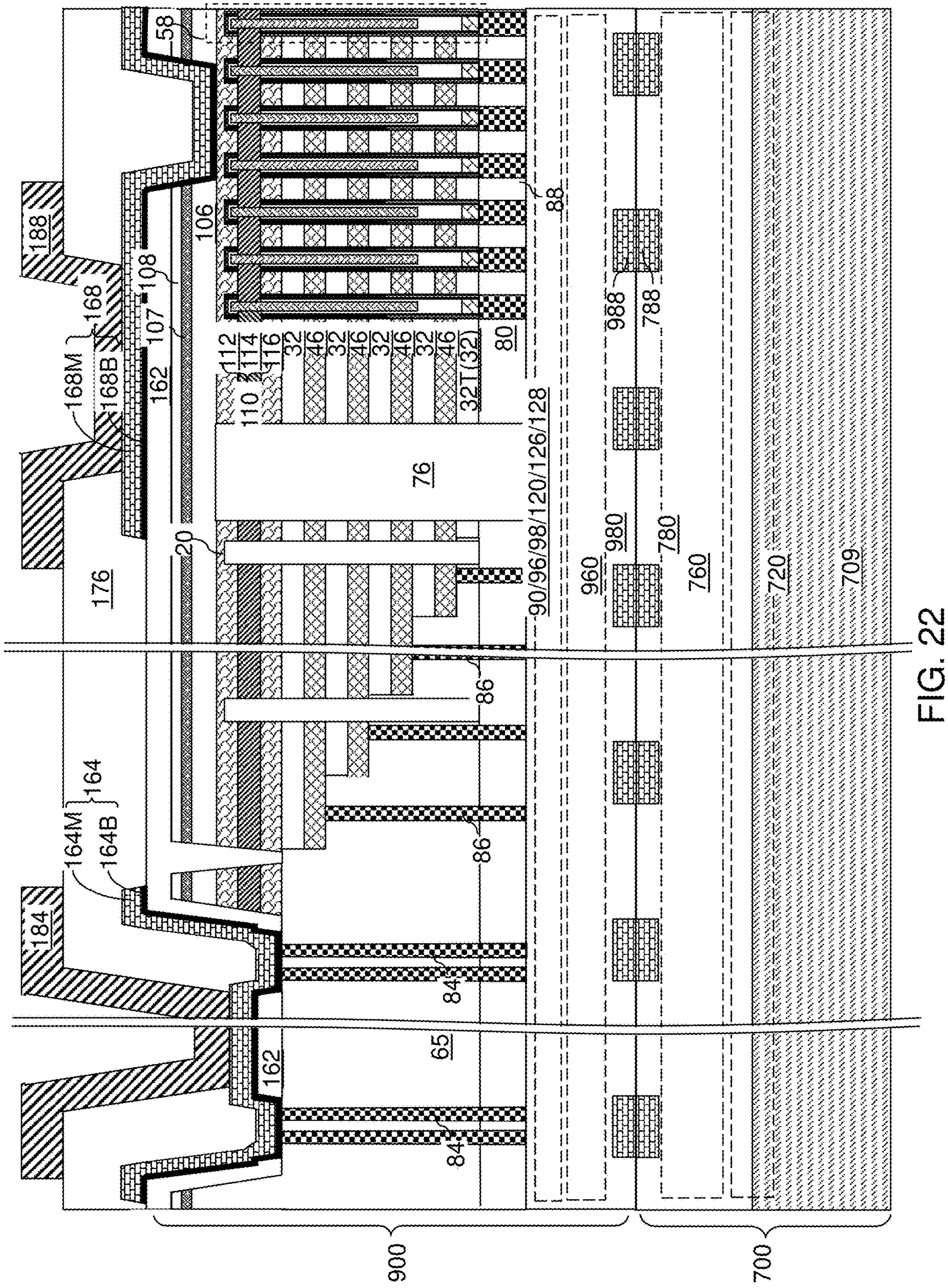
FIG. 22 is a vertical cross-sectional view of the first exemplary structure after formation of a passivation dielectric layer and backside contact pads according to an embodiment of the present disclosure.

Referring to FIG. 22, at least one passivation dielectric layer 176 can be formed over the distal surfaces of the backside connection pad structures 164, the source connection pad structures 168, and the backside isolation layer 162. The at least one passivation dielectric layer 176 can be patterned to form various backside contact cavities such that surfaces of the backside connection pad structures 164 and the source connection pad structures 168 are exposed. At least one conductive material can be deposited in the backside contact cavities, and can be patterned to provide backside contact pads 184 and the source contact pads 188. The backside contact pads 184 vertically extend through the at least one passivation dielectric layer 176 and contact a distal surface of a respective one of the backside connection pad structures 164. The source contact pads 188 vertically extend through the at least one passivation dielectric layer 176 and contacts a distal surface of a respective one of the source connection pad structures 168. The backside contact pads 184 and the source contact pads 188 may be configured as wirebonding pads, C4 bonding pads, or metal bonding pads for metal-to-metal bonding.

Figure 23:
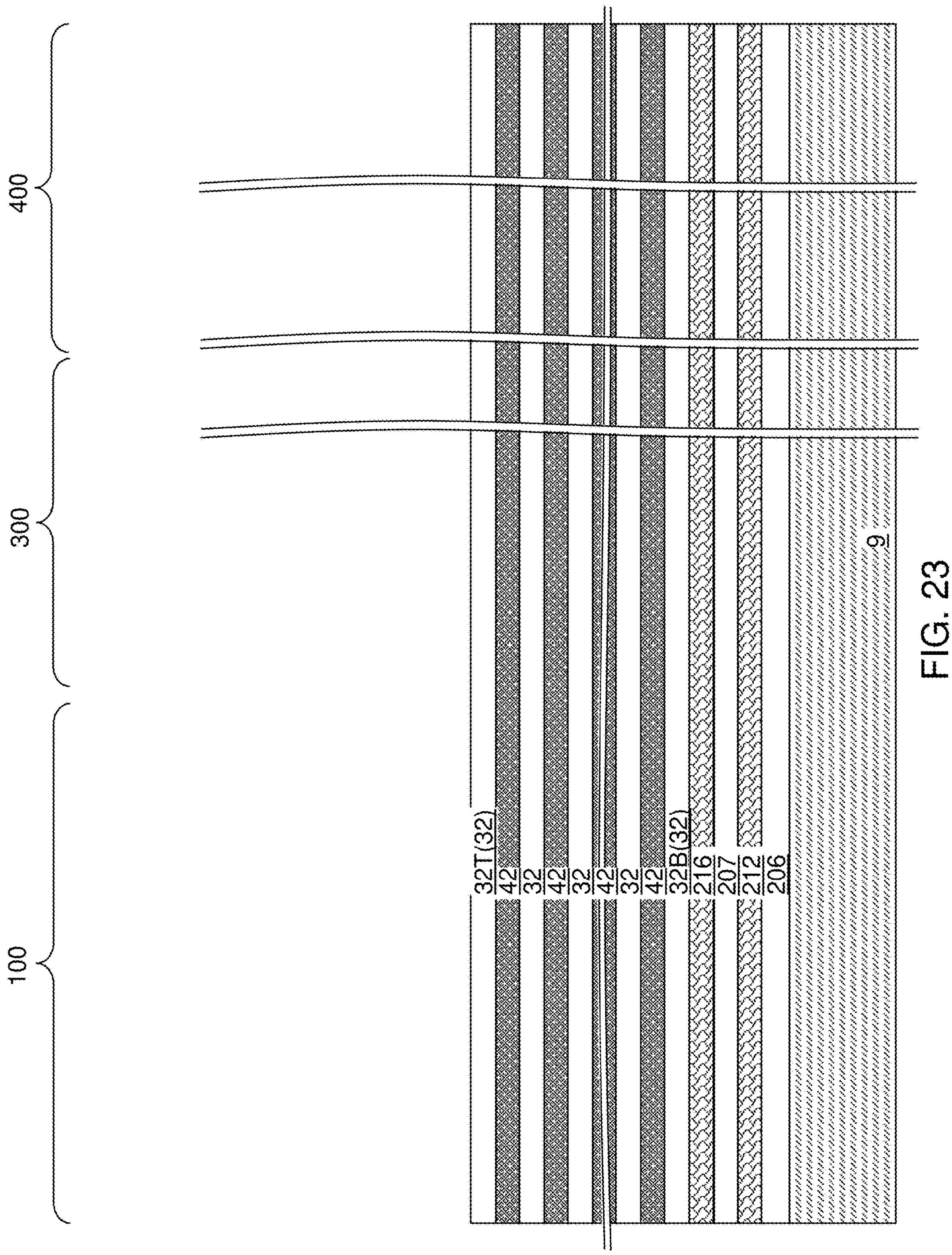
FIG. 23 is a schematic vertical cross-sectional view of a second exemplary structure for forming a first semiconductor die after formation of a stopper insulating layer, a sacrificial semiconductor layer, a sacrificial insulating layer, a source-level semiconductor material layer, and an alternating stack of insulating layers and sacrificial material layers over a carrier substrate according to an embodiment of the present disclosure.

Referring to FIG. 23, a second exemplary structure for forming a first semiconductor die (e.g., memory die) 900 is illustrated after formation of a stopper insulating layer 206, a sacrificial semiconductor layer 212, a sacrificial insulating layer 207, a source-level semiconductor material layer 216, and an alternating stack (32, 42) of insulating layers 32 and spacer material layers (such as sacrificial material layers 42) over a carrier substrate 9 according to an embodiment of the present disclosure.

The carrier substrate 9 may be the same as in the first exemplary structure. The alternating stack of insulating layers 32 and spacer material layers 42 may also be the same as in the first exemplary structure.

The stopper insulating layer 206 may comprise an insulating layer that may be employed as a stopper layer during removal of the carrier substrate 9. For example, the stopper insulating layer 206 may comprise a silicon oxide layer having a thickness in a range from 100 nm to 1,000 nm, although lesser and greater thicknesses may also be employed.

The sacrificial semiconductor layer 212 comprises a semiconductor material that can be subsequently removed selective to the materials of the memory films to be subsequently formed and selective to the material of the sacrificial insulating layer 207. For example, the sacrificial semiconductor layer 212 may comprise polysilicon or amorphous silicon, and may optionally be doped with dopants. If the vertical semiconductor channels to be subsequently formed have a doping of a first conductivity type, the sacrificial semiconductor layer 212 may have a doping of the first conductivity type, may have a doping of a second conductivity type that is the opposite of the first conductivity type, or may be substantially intrinsic. The thickness of the sacrificial semiconductor layer 212 may be in a range from 100 nm to 500 nm, although lesser and greater thicknesses may also be employed.

The sacrificial insulating layer 207 comprises an insulating material that may be subsequently removed selective to the material of the source-level semiconductor material layer 216. For example, the sacrificial insulating layer 207 may comprise silicon oxide, and may have a thickness in a range from 30 nm to 100 nm, although lesser and greater thicknesses may also be employed.

The source-level semiconductor material layer 216 may include a doped semiconductor material, such as doped polysilicon or doped amorphous silicon. The conductivity type of the source-level semiconductor material layer 216 may be the opposite of the conductivity of vertical semiconductor channels to be subsequently formed. For example, if the vertical semiconductor channels to be subsequently formed have a doping of a first conductivity type, the source-level semiconductor material layer 216 has a doping of a second conductivity type that is the opposite of the first conductivity type. The thickness of the source-level semiconductor material layer 216 may be in a range from 10 nm to 300 nm, such as from 20 nm to 150 nm, although lesser and greater thicknesses may also be used.

Figure 24A:
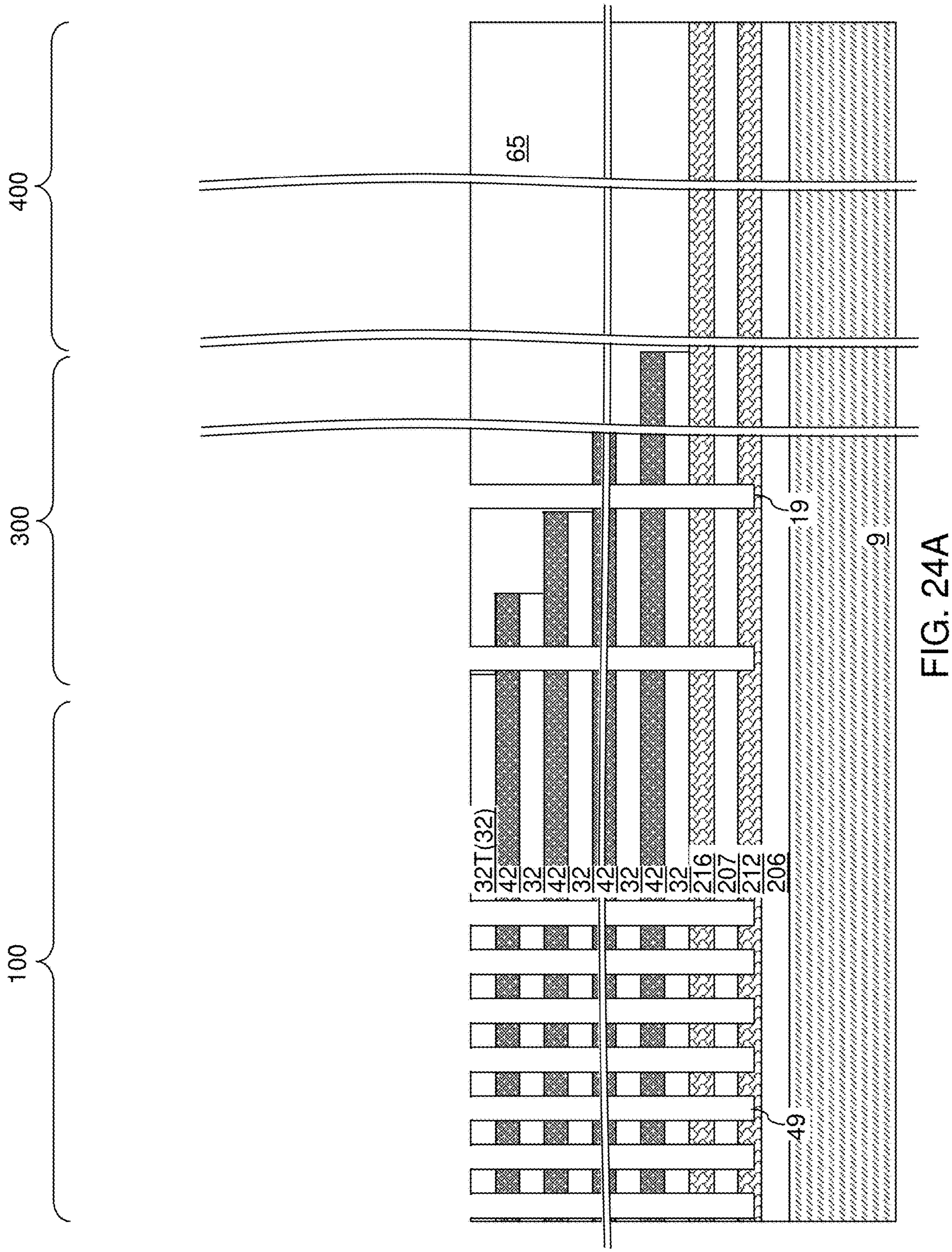
FIG. 24A is a schematic vertical cross-sectional view of the second exemplary structure after formation of stepped surfaces, a stepped dielectric material portion, memory openings, and support openings according to an embodiment of the present disclosure.
Figure 24B:
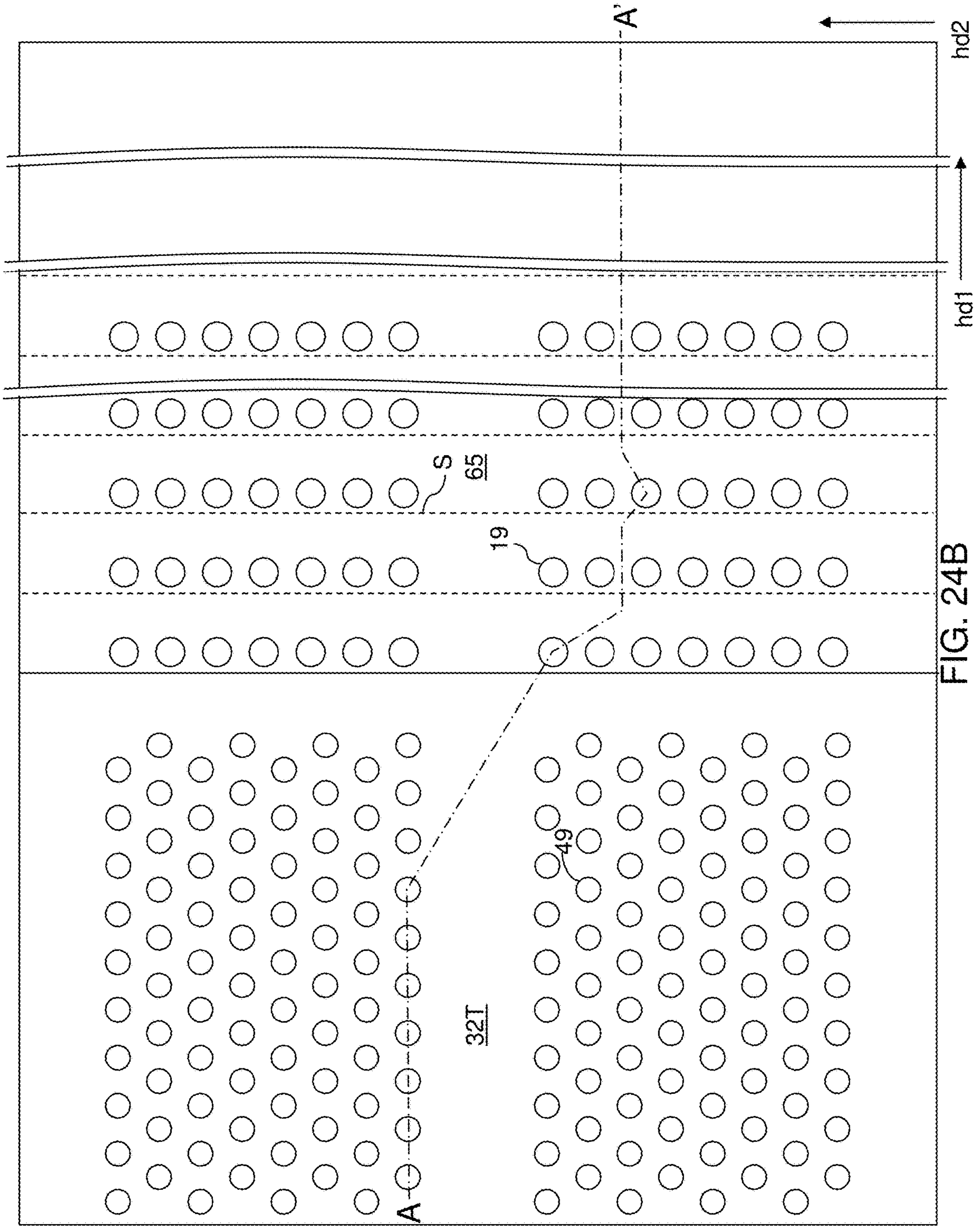
FIG. 24B is a top-down view of the second exemplary structure of FIG. 24A. The vertical plane A-A' is the cut plane of the vertical cross-sectional view of FIG. 24A.

Referring to FIGS. 24A and 24B, the processing steps described with reference to FIGS. 2, 3A, and 3B can be performed to form stepped surfaces, a stepped dielectric material portion 65, memory openings 49, and support openings 19. The etch chemistry of the anisotropic etch process may be modified as needed in view of the substation of a stack of the sacrificial semiconductor layer 212, the sacrificial insulating layer 207, and the source-level semiconductor material layer 216 in the second exemplary structure for the in-process source-level material layers 110' in the first exemplary structure.

Figure 25A:
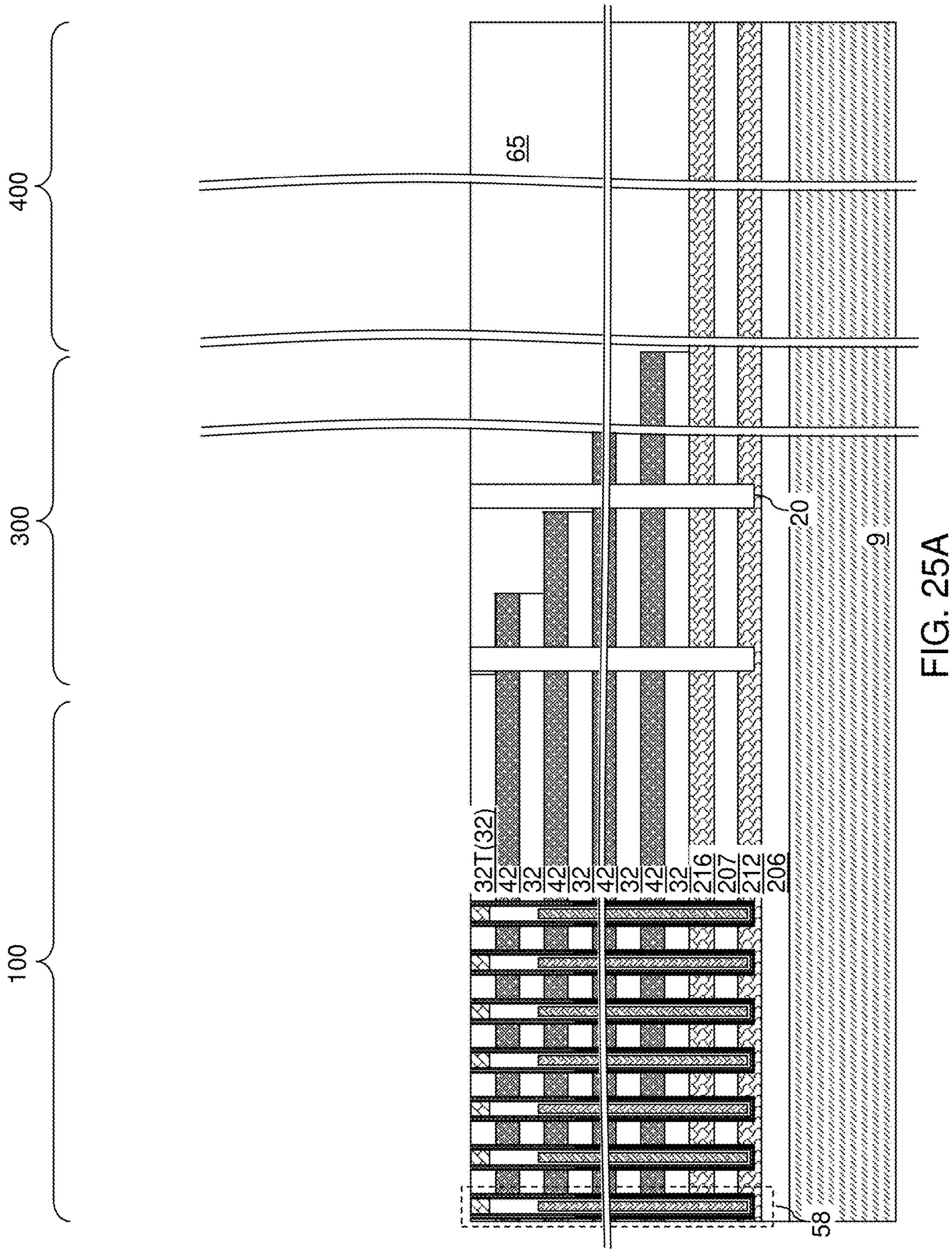
FIG. 25A is a vertical cross-sectional view of the second exemplary structure after formation of support pillar structures and memory opening fill structures according to an embodiment of the present disclosure.
Figure 25B:
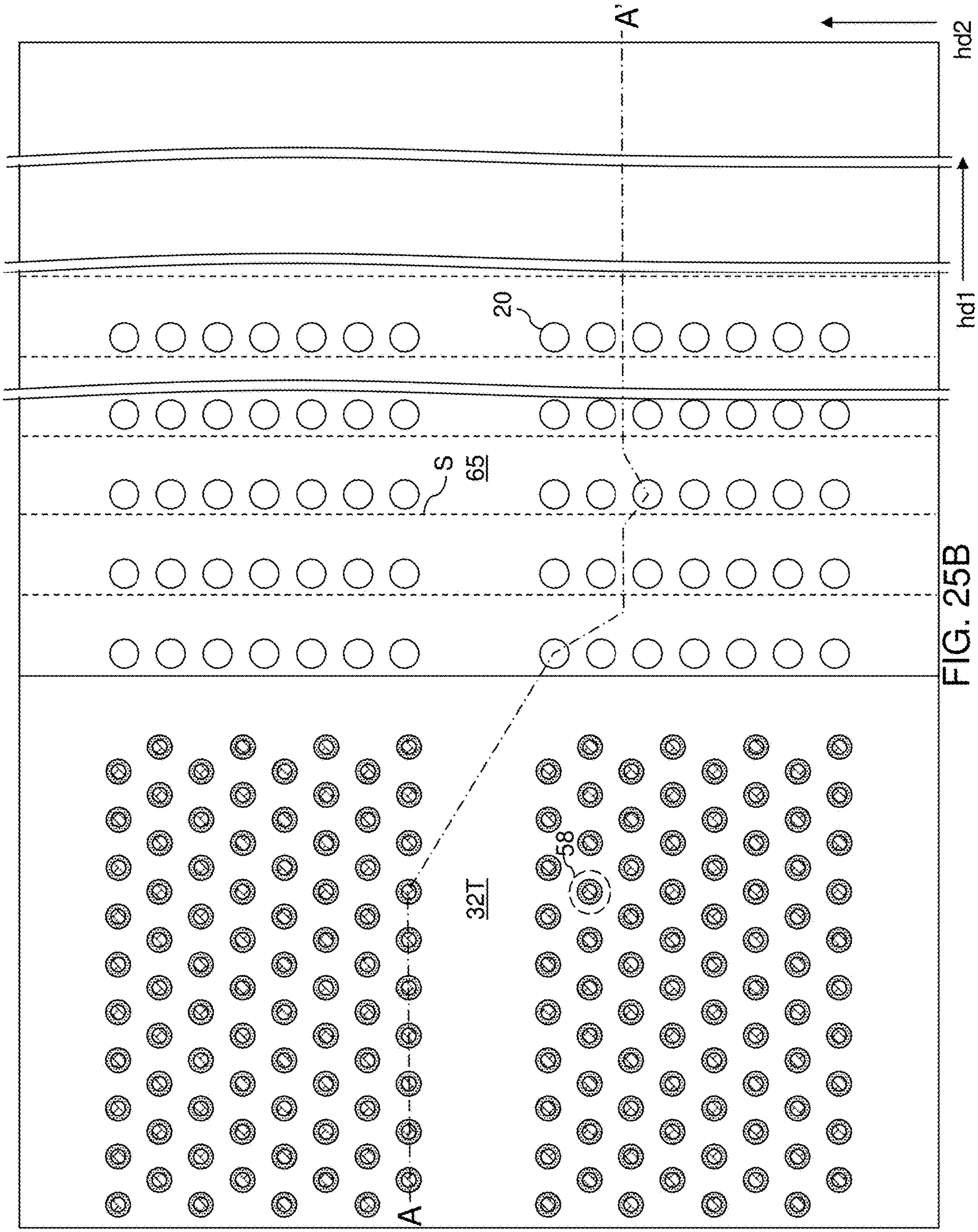
FIG. 25B is a top-down view of the second exemplary structure of FIG. 25A. The vertical plane A-A' is the cut plane of the vertical cross-sectional view of FIG. 25A.
Figure 25C:
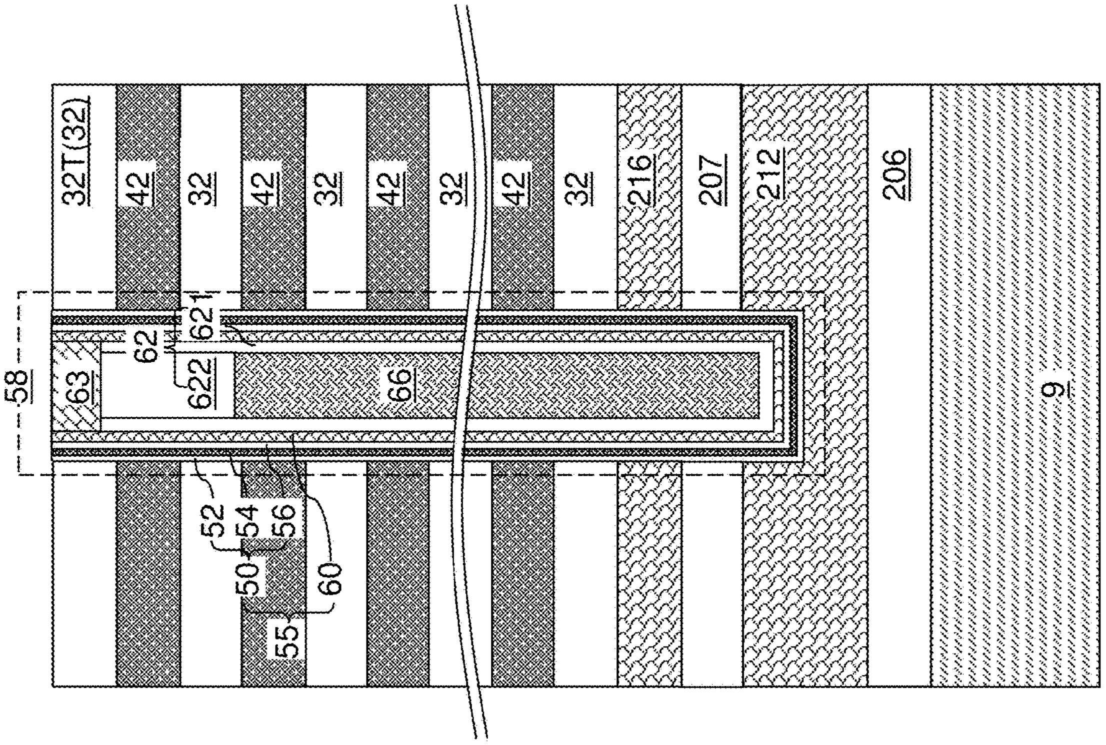
FIG. 25C is a vertical cross-sectional view of a region of the second exemplary structure of FIGS. 25A and 25B around a memory opening fill structure.

Referring to FIGS. 25A-25C, the processing steps described with reference to FIGS. 4, 5A-5G, and 6 can be performed to form a support pillar structure 20 in each support opening 19, and to form a memory opening fill structure 58 in each memory opening 49. The memory opening fill structures 58 in the second exemplary structure may have the same structural features as the memory opening fill structures 58 in the first exemplary structure except that the stack of the sacrificial semiconductor layer 212, the sacrificial insulating layer 207, and the source-level semiconductor material layer 216 is substituted in the second exemplary structure for the in-process source-level material layers 110' in the first exemplary structure. Each memory opening fill structure 58 may have a respective bottom surface that contacts a respective recessed surface of the sacrificial semiconductor layer 212.

Figure 26A:
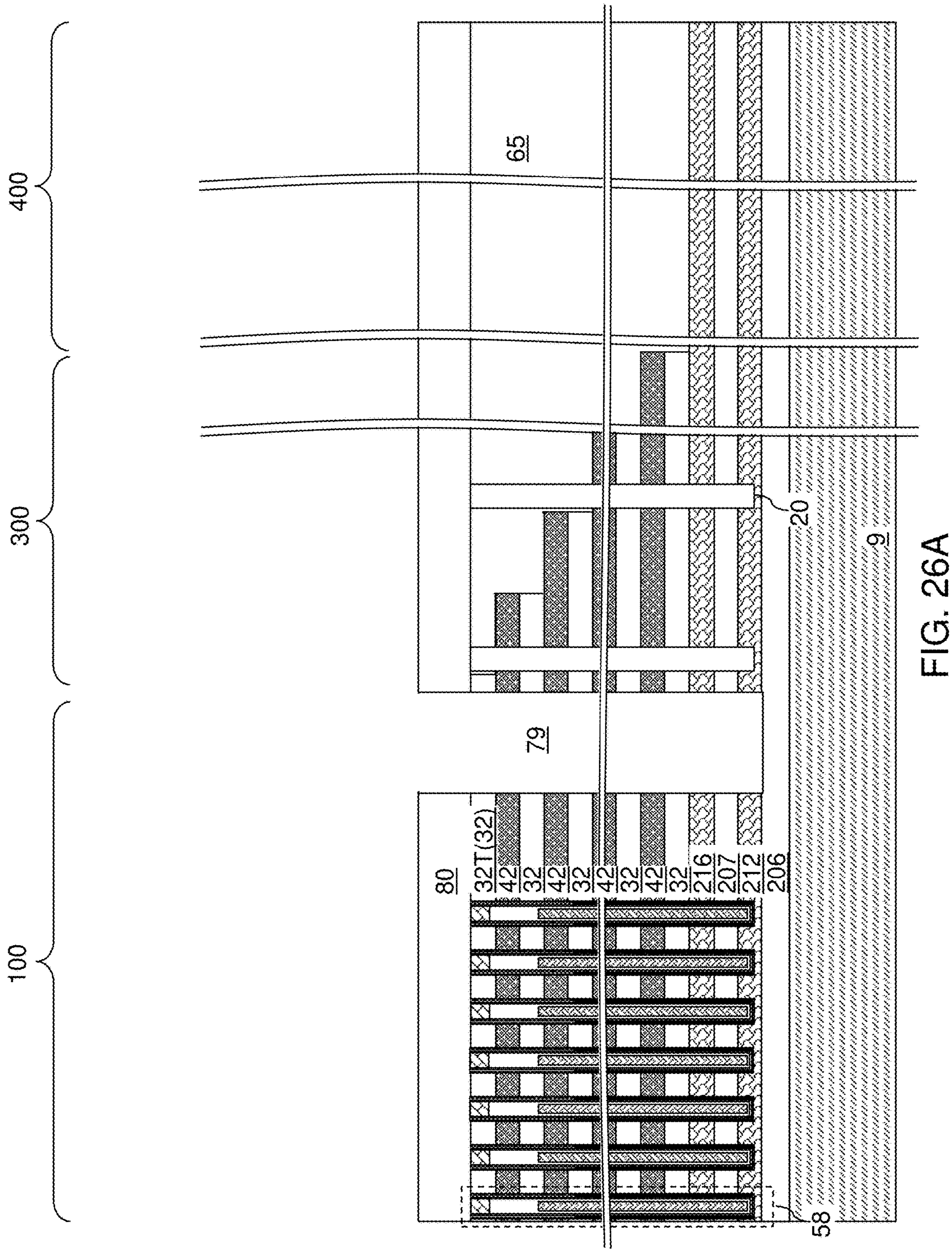
FIG. 26A is a vertical cross-sectional view of the second exemplary structure after formation of isolation trenches according to an embodiment of the present disclosure.
Figure 26B:
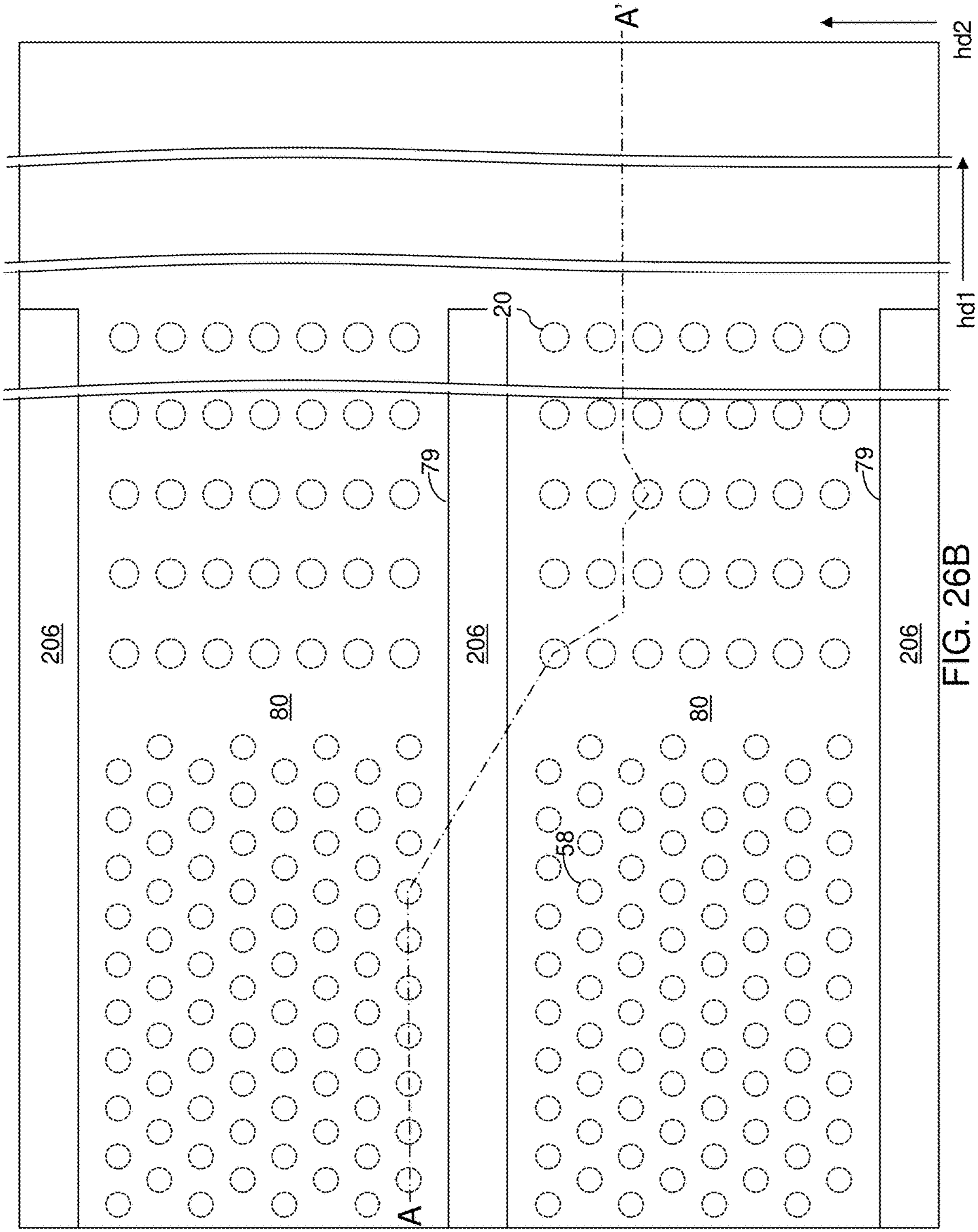
FIG. 26B is a top-down view of the second exemplary structure of FIG. 26A. The vertical plane A-A' is the cut plane of the vertical cross-sectional view of FIG. 26A.

Referring to FIGS. 26A and 26B, the processing steps described with reference to FIGS. 7A and 7B can be performed to form a contact-level dielectric layer 80 and lateral isolation trenches 79. An oxidation process may be performed to convert physically exposed surface portions of the sacrificial semiconductor layer 212 and the source-level semiconductor material layer 216 into semiconductor oxide portions (e.g., silicon oxide portions, not illustrated), which are subsequently employed to protect the sacrificial semiconductor layer 212 and the source-level semiconductor material layer 216 during replacement of the sacrificial material layers 42 with electrically conductive layers.

Figure 27:
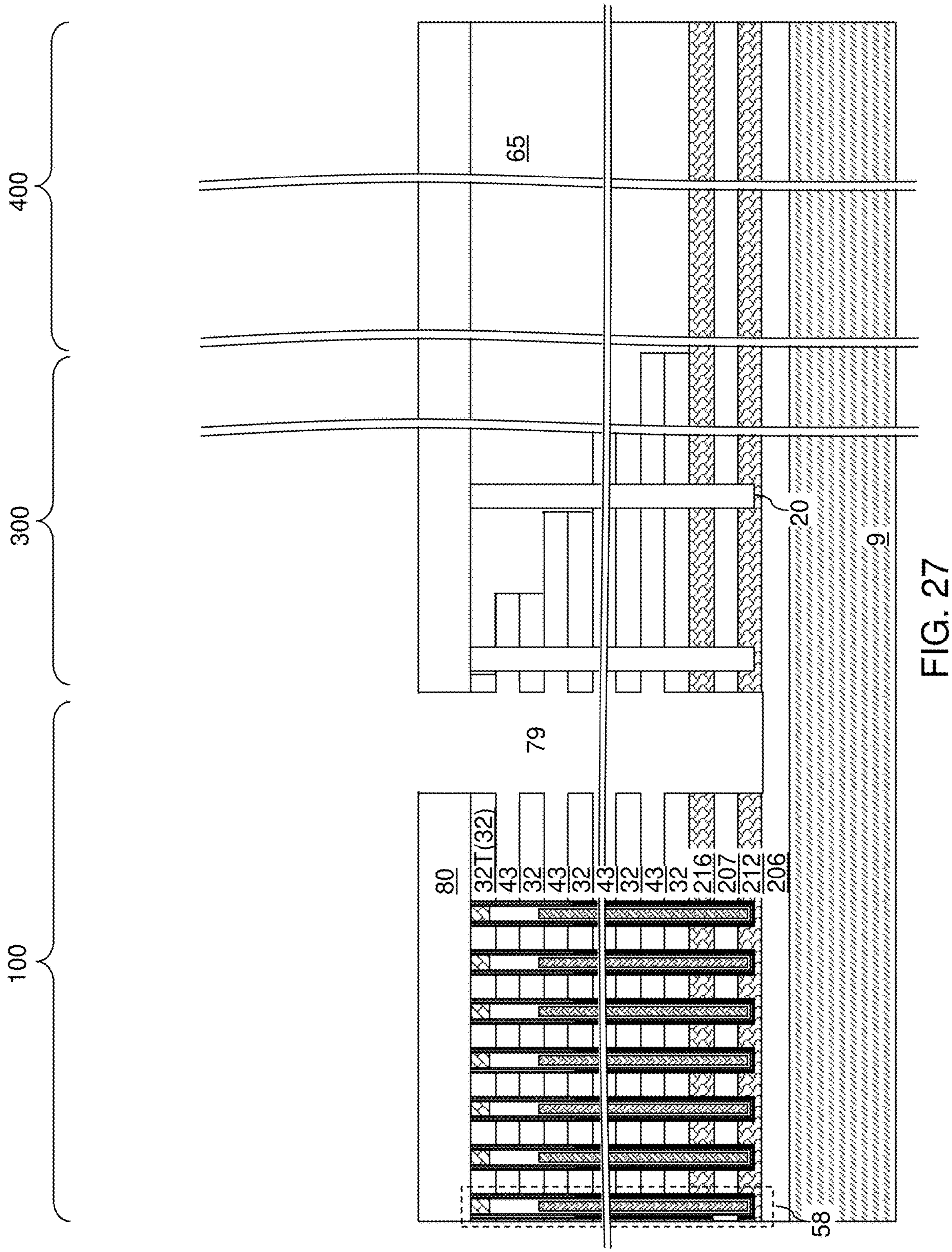
FIG. 27 is a vertical cross-sectional view of the second exemplary structure after formation of laterally-extending cavities according to an embodiment of the present disclosure.

Referring to FIG. 27, the processing steps described with reference to FIG. 11 can be performed to form laterally-extending cavities 43.

Figure 28:
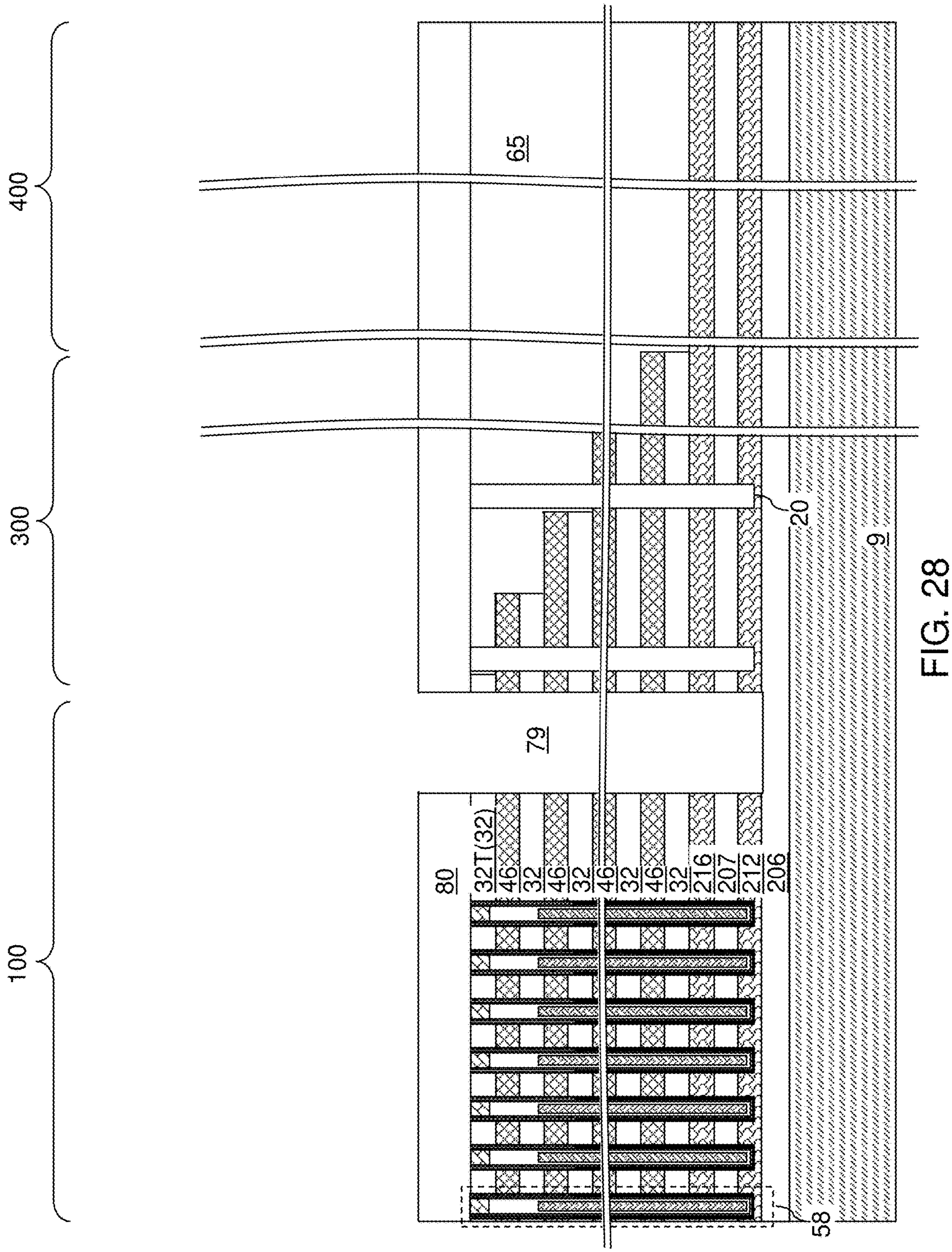
FIG. 28 is a vertical cross-sectional view of the second exemplary structure after formation of electrically conductive layers according to an embodiment of the present disclosure.

Referring to FIG. 28, the processing steps described with reference to FIGS. 12A-12D, 13A, and 13B can be performed to form electrically conductive layers 46 in the laterally-extending cavities 43. In one embodiment, the electrically conductive layers 46 within each alternating stack (32, 46) comprise word lines and drain-select-electrode lines that overlie the word lines. The core-bias electrodes 66 within the memory opening fill structures 58 embedded in the alternating stack (32, 46) vertically extend through each of the word lines in the alternating stack (32, 46).

Figure 29:
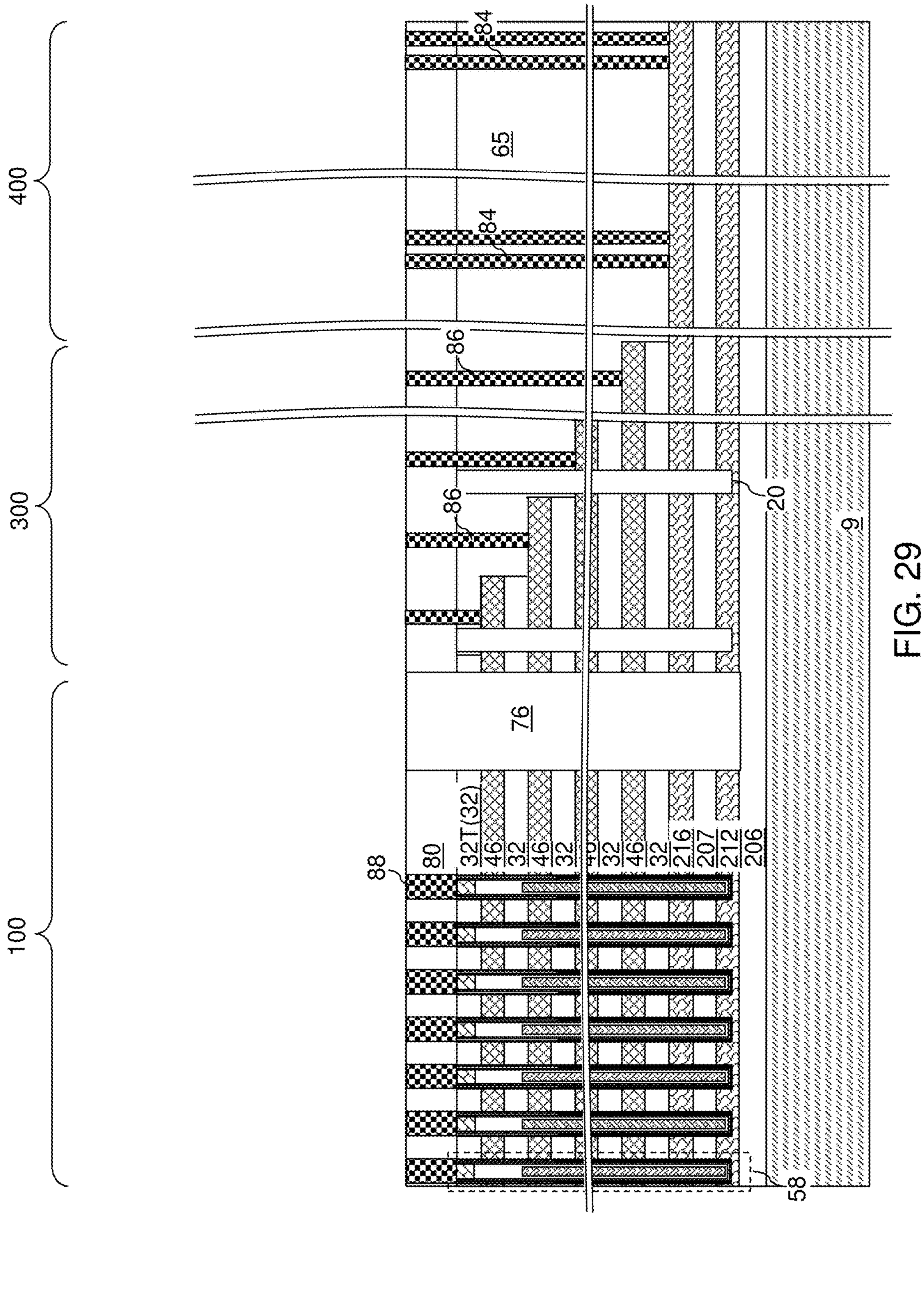
FIG. 29 is a vertical cross-sectional view of the second exemplary structure after formation of lateral isolation trench fill structures and contact via structures according to an embodiment of the present disclosure.

Referring to FIG. 29, the processing steps described with reference to FIGS. 14A and 14B can be performed to form isolation trench fill structures 76, drain contact via structures 88, layer contact via structures 86, and connection via structures 84.

Figure 30:
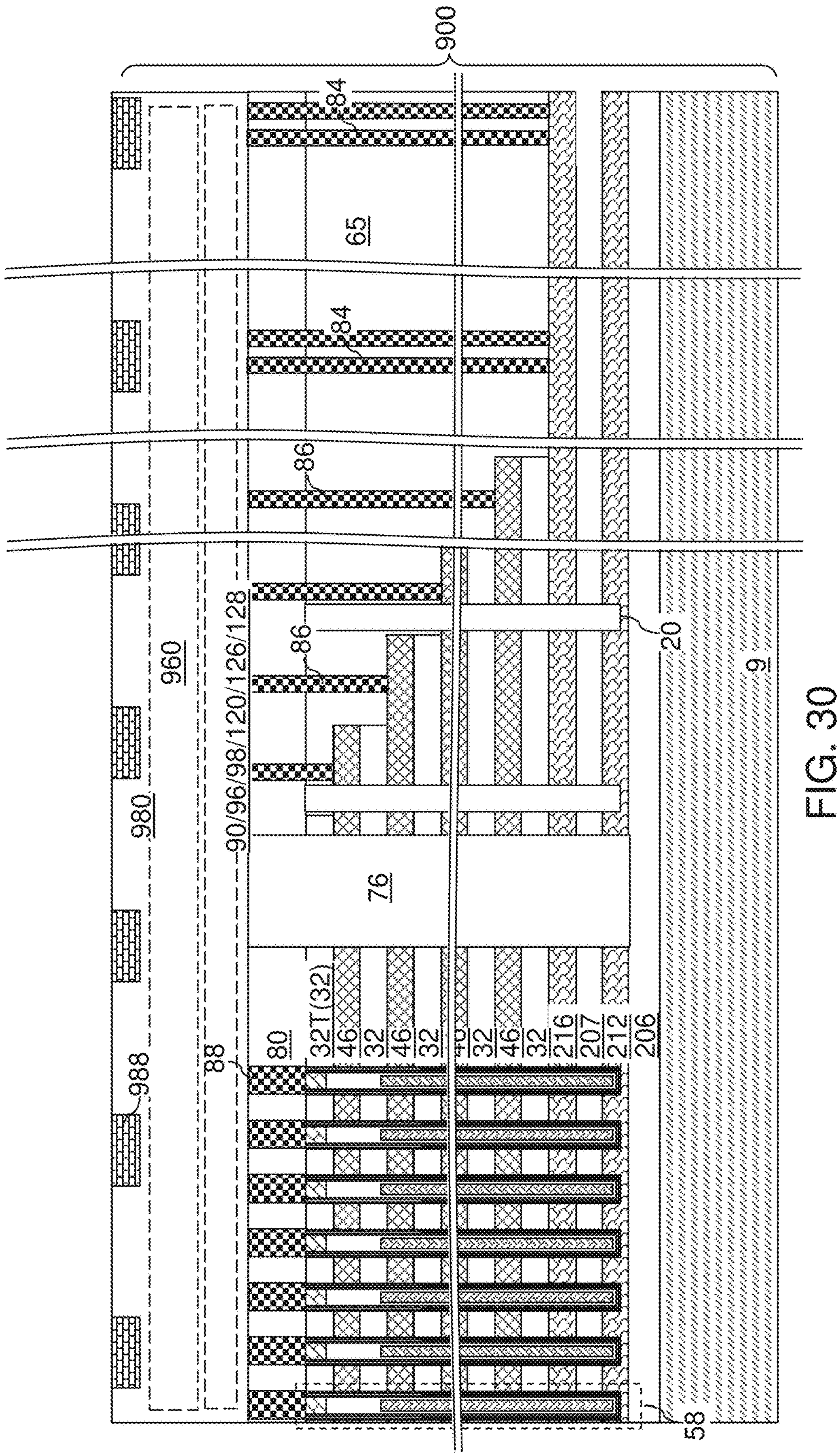
FIG. 30 is a vertical cross-sectional view of the second exemplary structure after formation of a first semiconductor die according to an embodiment of the present disclosure.

Referring to FIG. 30, the processing steps described with reference to FIGS. 15A, 15B, and 16 can be performed to form various metal interconnect structures and various dielectric material layers. A first semiconductor die 900 can be provided.

Figure 31:
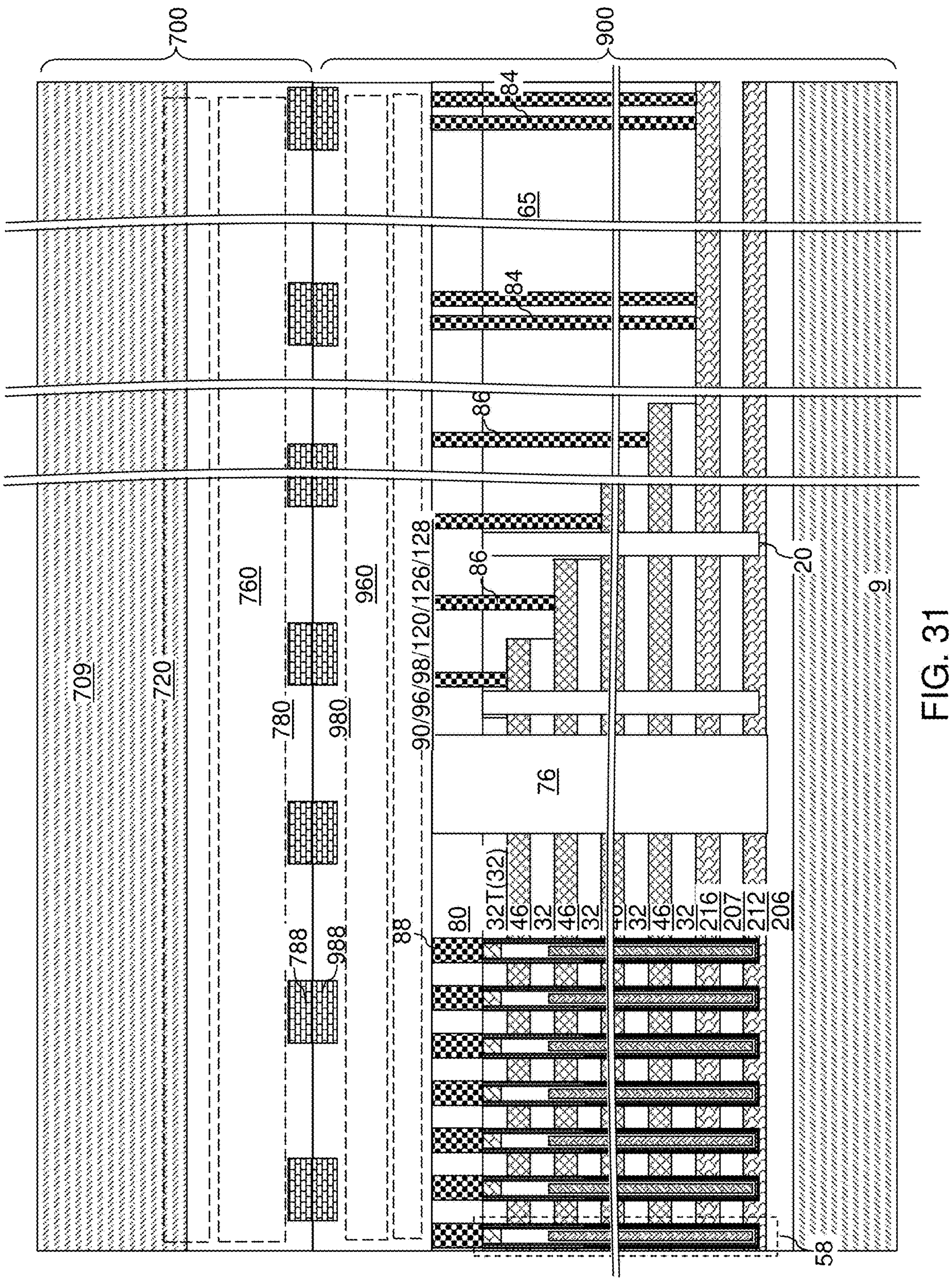
FIG. 31 is a vertical cross-sectional view of the second exemplary structure after formation of a bonded assembly of the first semiconductor die and the logic die according to an embodiment of the present disclosure.

Referring to FIG. 31, the processing steps described with reference to FIGS. 17 and 18 can be performed to form a bonded assembly of the first semiconductor die (e.g., memory die) 900 and a logic die 700.

Figure 32:
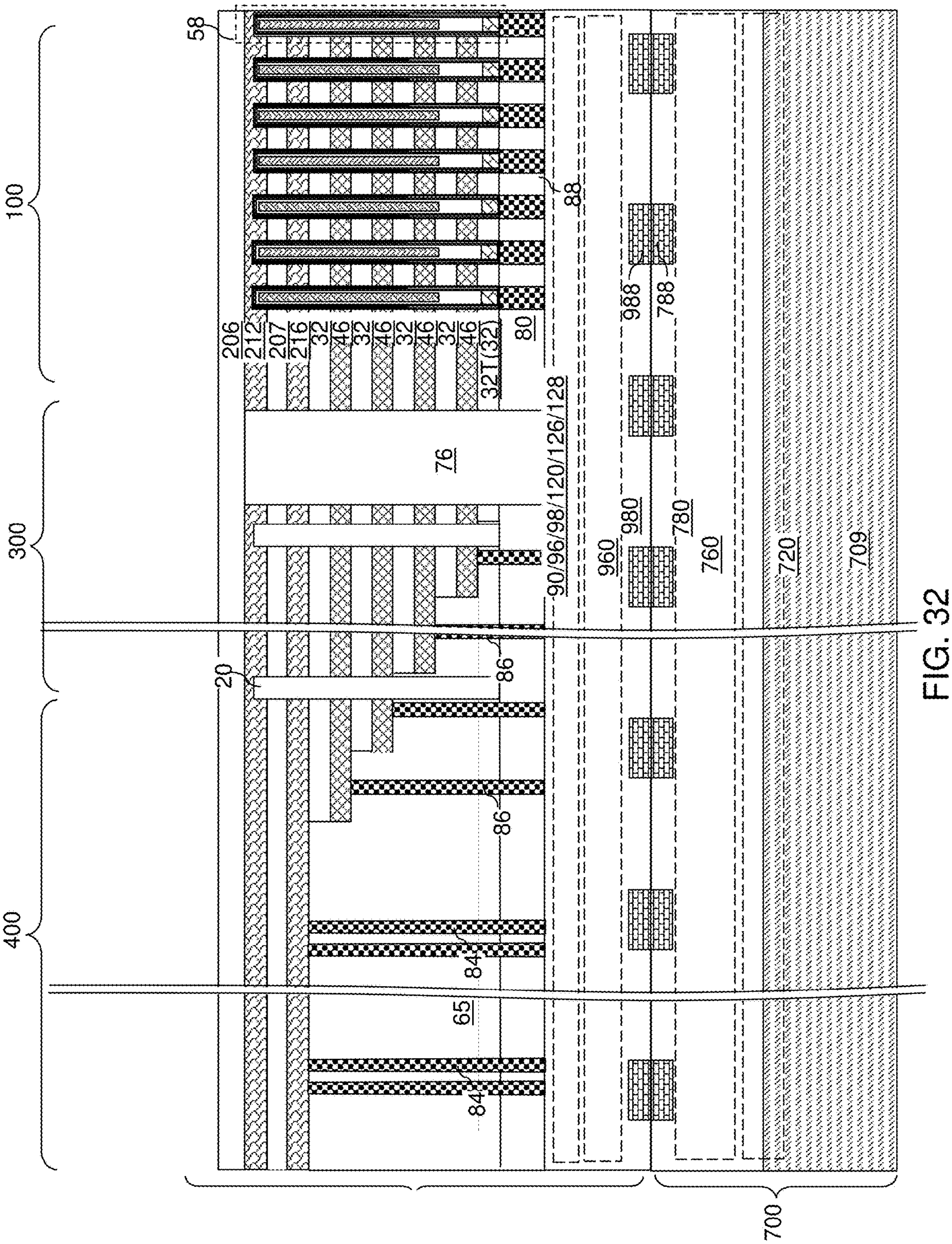
FIG. 32 is a vertical cross-sectional view of the second exemplary structure after removal of a carrier substrate and the sacrificial semiconductor layer according to an embodiment of the present disclosure.

Referring to FIG. 32, the processing steps described with reference to FIG. 19 can be performed to remove the carrier substrate 9. The stopper insulating layer 206 may be employed as a polishing stopper material layer or as an etch stop material layer during removal of the carrier substrate 9.

FIGS. 33A-33F are sequential vertical cross-sectional views of a region around a memory opening fill structure 58 during formation of a source layer 210 according to an embodiment of the present disclosure.

Figure 33B:
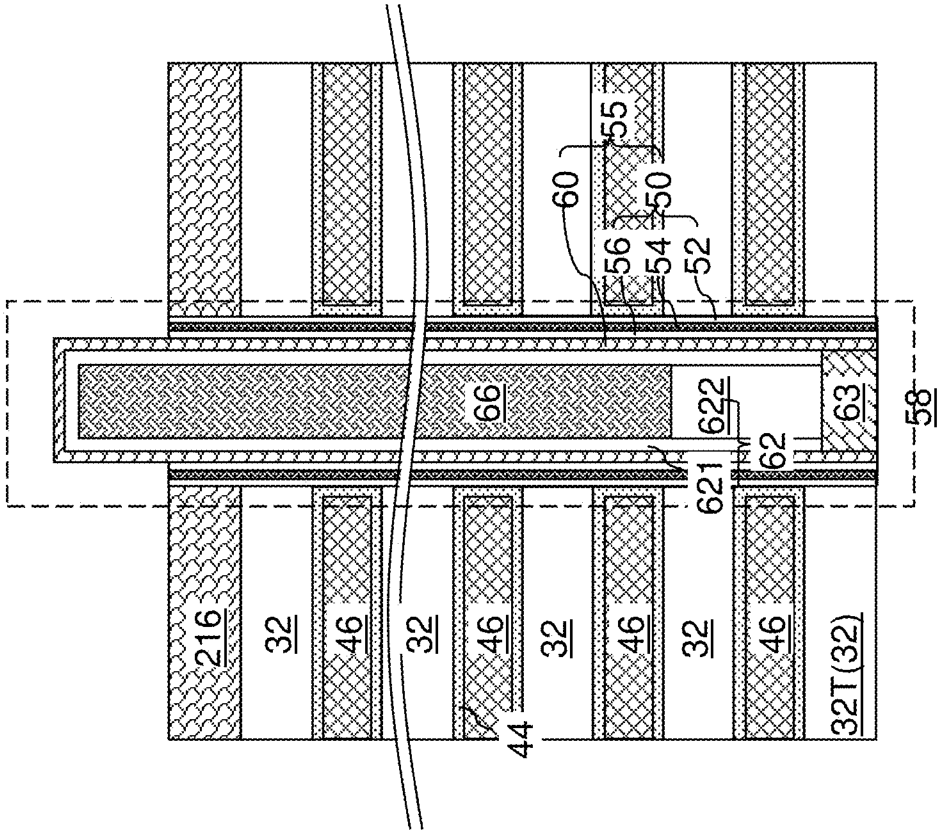
FIGS. 33A-33F are sequential vertical cross-sectional views of a region around a memory opening fill structure during formation of a source layer according to an embodiment of the present disclosure.
Figure 33A:
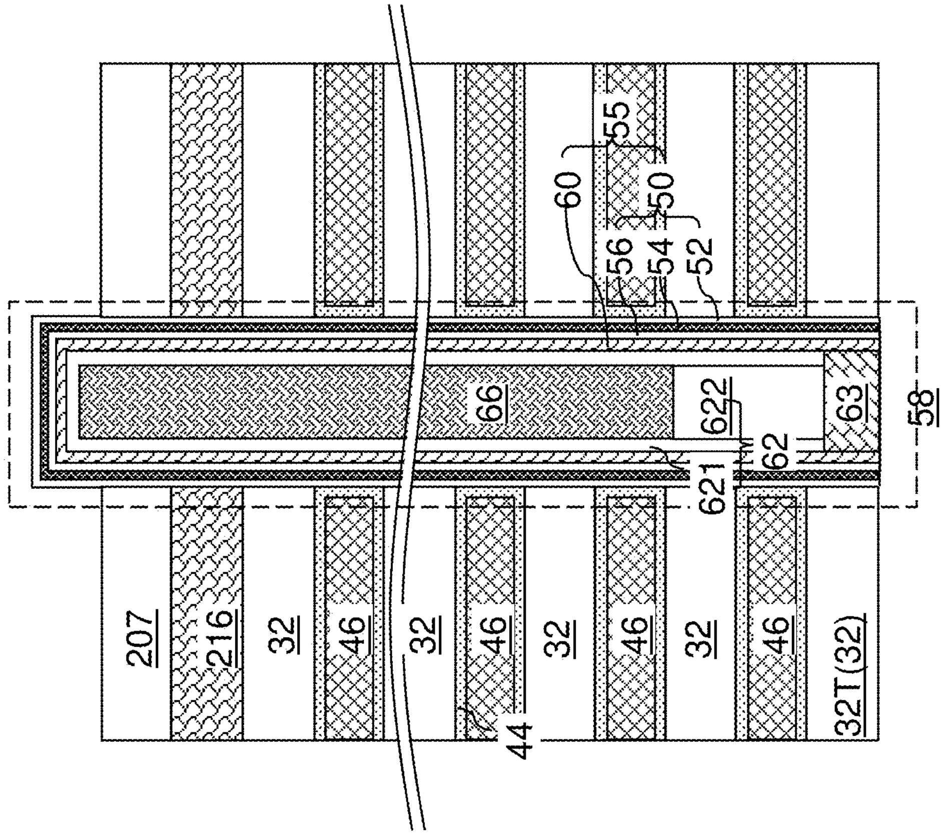

Referring to FIG. 33A, a first selective etch process can be performed to remove the stopper insulating layer 206 selective to the material of the sacrificial semiconductor layer 212. For example, if the stopper insulating layer 206 comprises silicon oxide, a wet etch process employing dilute hydrofluoric acid can be performed to etch the stopper insulating layer 206 selective to the material of the sacrificial semiconductor layer 212.

Subsequently, a second selective etch process can be performed to remove the sacrificial semiconductor layer 212 selective to the material of the sacrificial insulating layer 207. For example, if the sacrificial semiconductor layer 212 comprises polysilicon, a wet etch process employing hot trimethyl-2 hydroxyethyl ammonium hydroxide ("hot TMY") or tetramethyl ammonium hydroxide (TMAH) may be performed to etch the sacrificial semiconductor layer 212 selective to the materials of the sacrificial insulating layer 207 and each memory film 50.

Referring to FIG. 33B, a third selective etch process can be performed to remove the sacrificial insulating layer 207 and an end portion of each memory film 50 that is more distal from the bonding interface between the first semiconductor die 900 and the logic die 700 than the horizontal plane including a distal surface of the source-level semiconductor material layer 216 (i.e., the physically exposed surface of the source-level semiconductor material layer 216). In an illustrative example, the sacrificial insulating layer 207 may comprise silicon oxide, and the third selective etch process may comprise a wet etch step employing dilute hydrofluoric acid. The distal surface of the source-level semiconductor material layer 216 can be physically exposed. If any portion of the memory films 50 that is more distal from the bonding interface than the distal surface of the source-level semiconductor material layer 216 remains, at least one additional isotropic etch process (such as at least one wet etch process) can be performed to remove such remaining portions of the memory films 50. An end surface (which may be a planar surface) and a cylindrical surface segment of an outer sidewall of each vertical semiconductor channel 60 may be physically exposed.

Figure 33D:
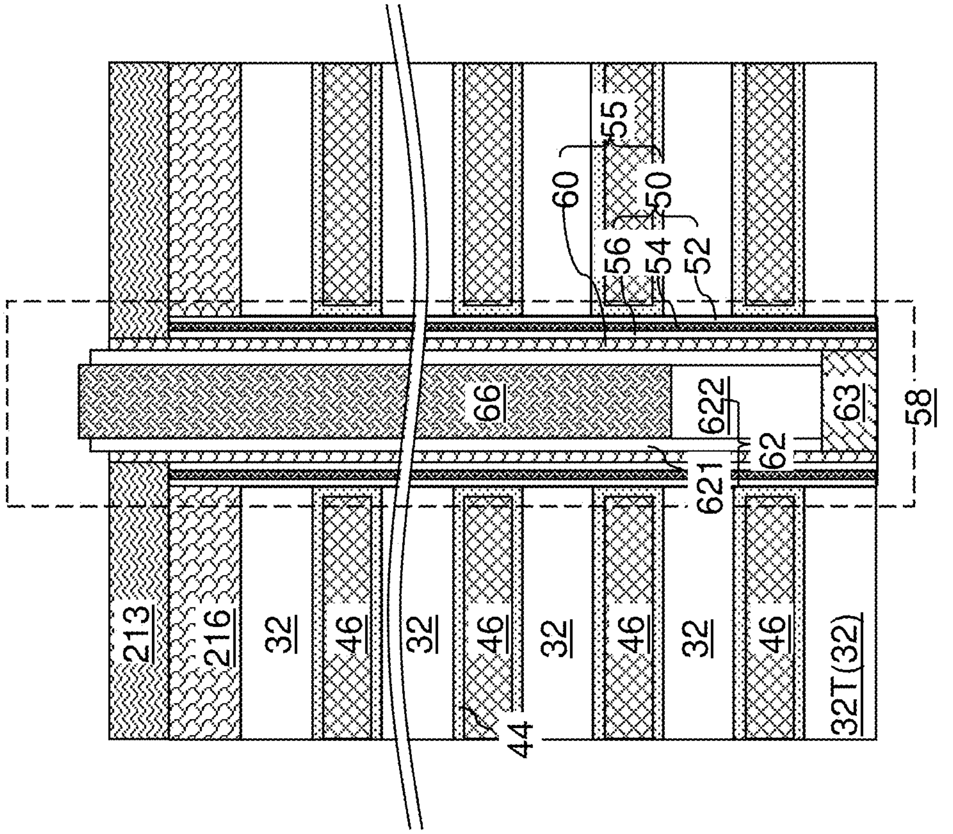
Figure 33C:
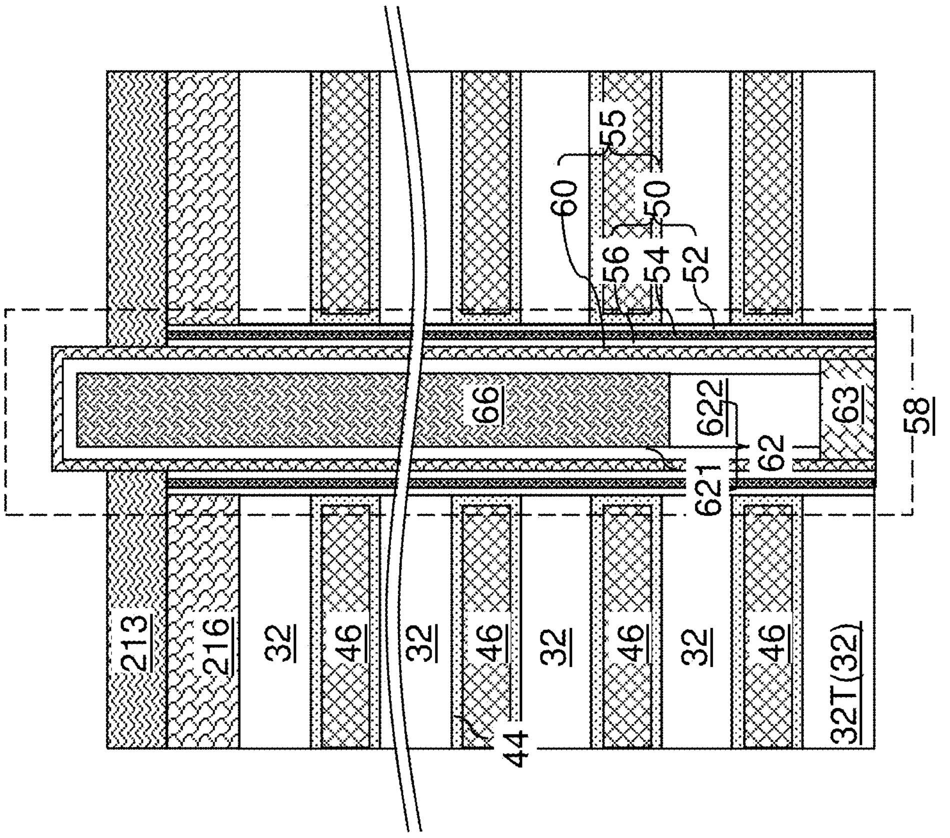

Referring to FIG. 33C, a self-planarizing masking material (such as spin-on carbon) may be applied on the physically exposed distal surface of the source-level semiconductor material layer 216 around each vertically protruding portion of the memory opening fill structures 58. The self-planarizing masking material forms a masking material layer 213. The height of the vertical protrusions of the memory opening fill structures 58 can be selected such that end surfaces of the vertical semiconductor channels 60 are not covered by the masking material layer 213.

Referring to FIG. 33D, a first etch process can be performed to remove physically exposed end portions of the vertical semiconductor channels 60. The first etch process may comprise a first anisotropic etch process (such as a reactive ion etch process) or a first isotropic etch process (such as a wet etch process). The masking material layer 213 protects the source-level semiconductor material layer 216 during the first etch process. End portions of the core dielectric liners 621 can be physically exposed after the first etch process.

A second etch process can be performed to remove physically exposed end portions of the core dielectric liners 621. The second etch process may comprise a second anisotropic etch process (such as a reactive ion etch process) or a second isotropic etch process (such as a wet etch process). The masking material layer 213 protects the source-level semiconductor material layer 216 during the second etch process. End portions of the core-bias electrodes 66 can be physically exposed after the second etch process.

Figure 33F:
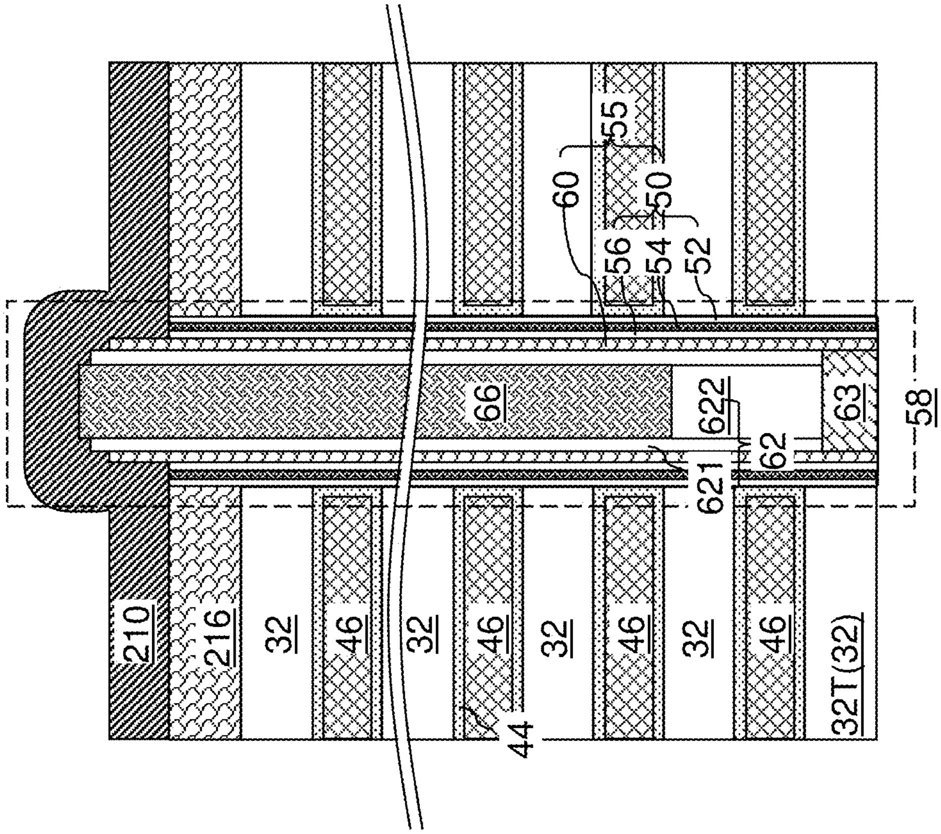
Figure 33E:
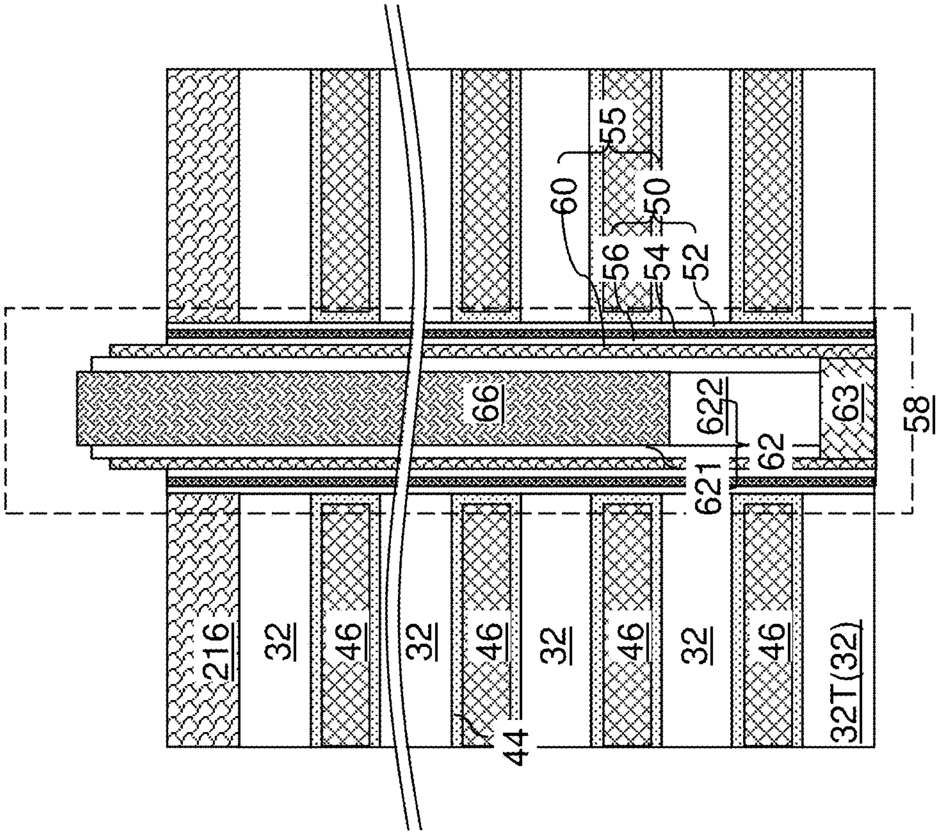

Referring to FIG. 33E, the masking material layer 213 can be removed selective to the memory opening fill structure 58 and the source-level semiconductor material layer 216, for example, by ashing.

Figure 34:
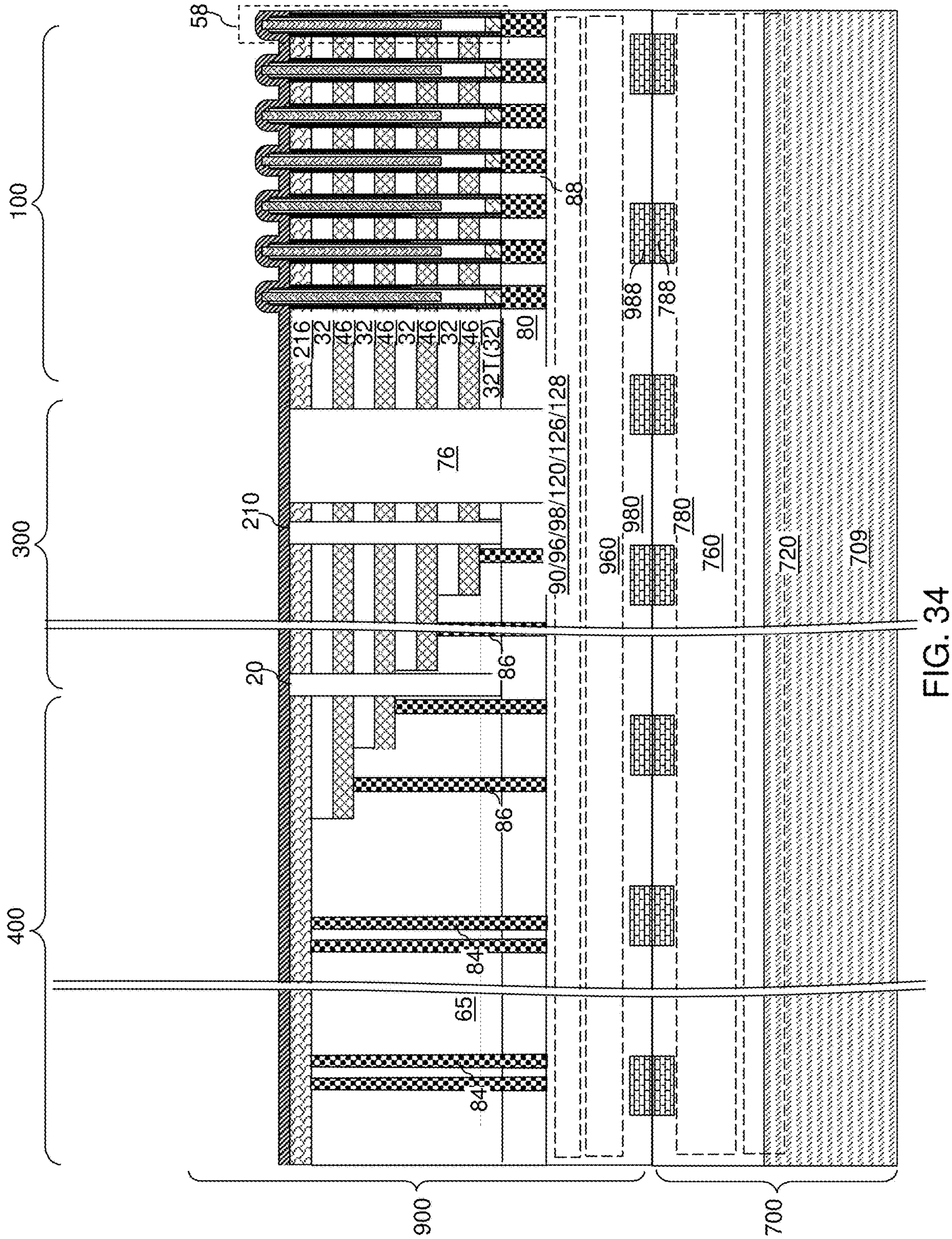
FIG. 34 is a vertical cross-sectional view of the second exemplary structure after formation of the source layer according to an embodiment of the present disclosure.

Referring to FIGS. 33F and 34, a source layer 210 is deposited over the source-level semiconductor material layer 216 in contact exposed end portions of the core-bias electrodes 66 and the vertical semiconductor channels 60. The source layer 210 may comprise a heavily doped semiconductor material having a doping of the second conductivity type, such as heavily doped polysilicon, and/or a metallic material, such as conductive metal nitride and/or metal. In one embodiment, the source layer 210 may be deposited by plasma enhanced chemical vapor deposition. The thickness of the horizontally-extending portion of the source layer 210 may be in a range from 50 nm to 200 nm, although lesser and greater thicknesses may also be employed.

In the second exemplary structure, each core dielectric liner 621 may contact the source layer 210. Within each memory opening fill structure 58, the vertical semiconductor channel 60 comprises a first end portion contacting the drain region 63. In one embodiment, an annular surface segment of the second end portion of the vertical semiconductor channel 60 contacts the source layer 210. In one embodiment, the source layer 210 contacts a second end portion of the vertical semiconductor channel 60 and contacts an end portion of the core-bias electrode 66.

Within each memory opening fill structure 58, a first annular end surface of the core dielectric liner 621 contacts the drain region 63, and a second annular end surface of the core dielectric liner 621 contacts the source layer 210. In one embodiment, a cylindrical surface segment of the core-bias electrode 66 may contact the source layer 210. In one embodiment, a planar end surface of the core-bias electrode 66 may contact the source layer 210. In one embodiment, an annular end surface of the vertical semiconductor channel 60 contacts the source layer 210, and a cylindrical surface segment of an outer cylindrical sidewall of the vertical semiconductor channel 60 contacts the core dielectric liner 621. In one embodiment, an end surface of the core-bias electrode 66 is adjoined to and is laterally bounded by a periphery of a sidewall of the core-bias electrode 66, and contacts the source layer 210.

Figure 35:
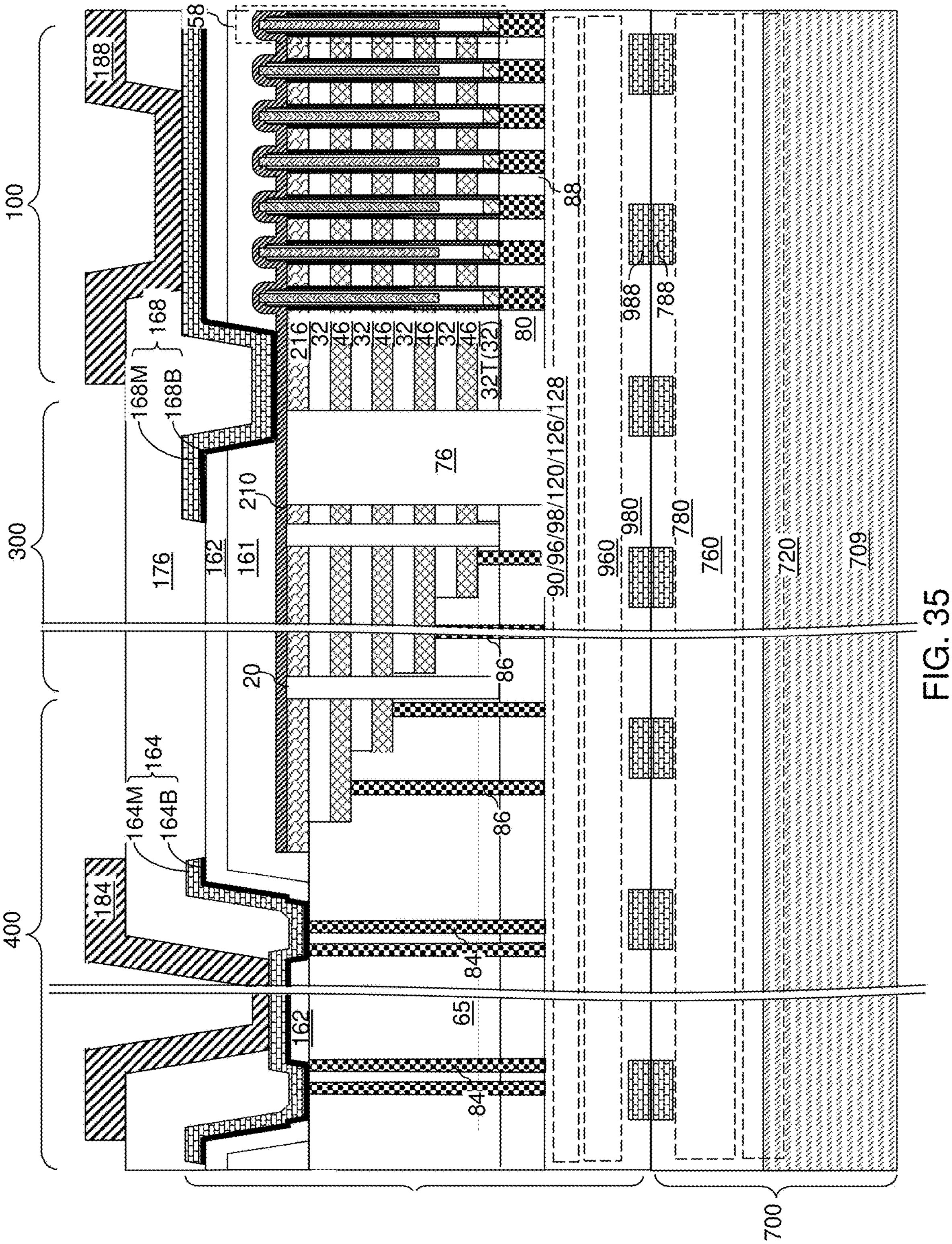
FIG. 35 is a vertical cross-sectional view of the second exemplary structure after formation of additional backside dielectric layers, backside connection pads, a passivation dielectric layer, and backside contact pads according to an embodiment of the present disclosure.

Referring to FIG. 35, the source layer 210 and the source-level semiconductor material layer 216 can be patterned. At least one backside dielectric layer 161 can be formed over the source layer 210. The processing steps described with reference to FIGS. 20-22 can be performed to form backside connection pad cavities, a backside isolation layer 162, backside connection pad structures 164, source connection pad structures 168, at least one passivation dielectric layer 176, backside contact pads 184, and the source contact pads 188.

Referring to all drawings and according to various embodiments of the present disclosure, a semiconductor device comprises: an alternating stack (32, 46) of insulating layers 32 and electrically conductive layers 46; a memory opening 49 vertically extending through the alternating stack (32, 46); a memory opening fill structure 58 located in the memory opening 49 and comprising a memory film 50, a vertical semiconductor channel 60 that is laterally surrounded by the memory film 50, a drain region 63 contacting a first end portion of the vertical semiconductor channel 60, a dielectric core 62 surrounded by the vertical semiconductor channel 60, and a core-bias electrode 66 surrounded by the dielectric core 62; and a source layer (110 or 210) contacting a second end portion of the vertical semiconductor channel 60 and contacting an end portion of the core-bias electrode 66.

In one embodiment, the core-bias electrode 66 vertically extends through a plurality of electrically conductive layers 46 within the alternating stack (32, 46). In one embodiment, the electrically conductive layers 46 comprise word lines and drain-select-electrode lines; and the core-bias electrode 66 vertically extends through each of the word lines but does not extend through the drain-select-electrode lines.

In one embodiment, the dielectric core 62 comprises a cylindrical dielectric core portion 622 and a core dielectric liner 621; a first end surface of the core-bias electrode 66 contacts a first end surface of the cylindrical dielectric core portion 622; and a periphery of the first end surface of the core-bias electrode 66 coincides with a periphery of the first end surface of the cylindrical dielectric core portion 622. In one embodiment, a second end surface of the cylindrical dielectric core portion 622 contacts the drain region 63. In one embodiment, a cylindrical sidewall of the cylindrical dielectric core portion 622 contacts a first surface segment of an inner cylindrical sidewall of the core dielectric liner 621. In one embodiment, a cylindrical sidewall of the core-bias electrode 66 contacts a second surface segment of the inner cylindrical sidewall of the core dielectric liner 621.

In one embodiment, the core dielectric liner 621 vertically extends through each electrically conductive layer within the alternating stack (32, 46) and contacts the source layer (110 or 210). In one embodiment, an annular surface segment of the second end portion of the vertical semiconductor channel 60 contacts the source layer (110 or 210).

In one embodiment, a first annular end surface of the core dielectric liner 621 contacts the drain region 63; and a second annular end surface of the core dielectric liner 621 contacts the source layer (110 or 210). In one embodiment, a cylindrical surface segment of the core-bias electrode 66 contacts the source layer (110 or 210).

In one embodiment, an annular end surface of the vertical semiconductor channel 60 contacts the source layer 110; and an entirety of an outer cylindrical sidewall of the vertical semiconductor channel 60 contacts the dielectric core 62.

In one embodiment, an end surface of the core-bias electrode 66 contacts the source layer 210. In one embodiment, an annular end surface of the vertical semiconductor channel 60 contacts the source layer 210; and a cylindrical surface segment of an outer cylindrical sidewall of the vertical semiconductor channel 60 contacts the source layer (110 or 210).

In one embodiment, the core-bias electrode 66 consists essentially of a doped semiconductor material (or any NAND process compatible conductive materials) portion having a cylindrical shape.

In one embodiment, a method comprises performing vector matrix multiplication using the above described semiconductor device (e.g., the first semiconductor die 900).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor device, comprising:
- an alternating stack of insulating layers and electrically conductive layers;
- a memory opening vertically extending through the alternating stack;
- a memory opening fill structure located in the memory opening and comprising a memory film, a vertical semiconductor channel that is laterally surrounded by the memory film, a drain region contacting a first end portion of the vertical semiconductor channel, a dielectric core surrounded by the vertical semiconductor channel, and a core-bias electrode surrounded by the dielectric core; and
- a source layer contacting a second end portion of the vertical semiconductor channel and contacting an end portion of the core-bias electrode.

2. The semiconductor device of claim 1, wherein the core-bias electrode vertically extends through a plurality of electrically conductive layers within the alternating stack.

3. The semiconductor device of claim 1, wherein:
- the electrically conductive layers comprise word lines and drain-select-electrode lines; and
- the core-bias electrode vertically extends through each of the word lines, but does not extend through the drain-select-electrode lines.

4. The semiconductor device of claim 1, wherein:
- the dielectric core comprises a cylindrical dielectric core portion and a core dielectric liner;
- a first end surface of the core-bias electrode contacts a first end surface of the cylindrical dielectric core portion; and a periphery of the first end surface of the core-bias electrode coincides with a periphery of the first end surface of the cylindrical dielectric core portion.

5. The semiconductor device of claim 4, wherein a second end surface of the cylindrical dielectric core portion contacts the drain region.

6. The semiconductor device of claim 4, wherein a cylindrical sidewall of the cylindrical dielectric core portion contacts a first surface segment of an inner cylindrical sidewall of the core dielectric liner.

7. The semiconductor device of claim 6, wherein a cylindrical sidewall of the core-bias electrode contacts a second surface segment of the inner cylindrical sidewall of the core dielectric liner.

8. The semiconductor device of claim 4, wherein the core dielectric liner vertically extends through each electrically conductive layer within the alternating stack and contacts the source layer.

9. The semiconductor device of claim 4, wherein:

a first annular end surface of the core dielectric liner contacts the drain region; and a second annular end surface of the core dielectric liner contacts the source layer.

10. The semiconductor device of claim 1, wherein an annular surface segment of the second end portion of the vertical semiconductor channel contacts the source layer.

11. The semiconductor device of claim 1, wherein a cylindrical surface segment of the core-bias electrode contacts the source layer.

12. The semiconductor device of claim 1, wherein an end surface of the core-bias electrode contacts the source layer.

13. The semiconductor device of claim 1, wherein:

an annular end surface of the vertical semiconductor channel contacts the source layer; and an entirety of an outer cylindrical sidewall of the vertical semiconductor channel contacts the dielectric core.

14. The semiconductor device of claim 1, wherein an annular end surface of the vertical semiconductor channel and a cylindrical surface segment of an outer cylindrical sidewall of the vertical semiconductor channel contact the source layer.

15. The semiconductor device of claim 1, wherein the core-bias electrode consists essentially of a doped semiconductor material or conductive material portion having a cylindrical shape.

16. A method, comprising performing vector matrix multiplication using the semiconductor device of claim 1.

17. A method of forming a semiconductor device, comprising:

forming an alternating stack of insulating layers and spacer material layers, wherein the spacer material layers are formed as or are subsequently replaced with electrically conductive layers;

forming a memory opening through the alternating stack;

forming a memory opening fill structure in the memory opening, wherein the memory opening fill structure comprises a memory film, a vertical semiconductor channel that is laterally surrounded by the memory film, a drain region contacting a first end portion of the vertical semiconductor channel, a dielectric core surrounded by the vertical semiconductor channel, and a core-bias electrode surrounded by the dielectric core; and forming a source layer on a second end portion of the vertical semiconductor channel and on an end portion of the core-bias electrode.

18. The method of claim 17, wherein forming the memory opening fill structure comprises:

forming a semiconductor channel material layer in the memory opening and over the alternating stack;

forming a core dielectric liner layer over the semiconductor channel material layer; and depositing and vertically recessing a conductive material within a volume laterally surrounded by the core dielectric liner layer to form the core-bias electrode.

19. The method of claim 17, wherein the core-bias electrode vertically extends through a plurality of spacer material layers within the alternating stack.

20. The method of claim 17, wherein the core-bias electrode is electrically isolated from the vertical semiconductor channel prior to formation of the source layer.

* * * * *